(12) United States Patent
Harnden et al.

(10) Patent No.: US 7,057,273 B2
(45) Date of Patent: Jun. 6, 2006

(54) SURFACE MOUNT PACKAGE

(75) Inventors: James Harnden, Hollister, CA (US); Richard K. Williams, Cupertino, CA (US); Anthony Chia, Singapore (SG); Chu Weibing, Shanghai (CN)

(73) Assignee: GEM Services, Inc., San Jose, CA (US)

(*) Notice: Subject to any disclaimer, the term of this patent is extended or adjusted under 35 U.S.C. 154(b) by 0 days.

(21) Appl. No.: 09/895,478

(22) Filed: Jun. 29, 2001

(65) Prior Publication Data
US 2003/0062601 A1    Apr. 3, 2003

Related U.S. Application Data

(60) Provisional application No. 60/291,212, filed on May 15, 2001.

(51) Int. Cl.
*H01L 23/48* (2006.01)
(52) U.S. Cl. .................................................. 257/696
(58) Field of Classification Search ................ 361/813; 257/696, 692, 674, 672, 689, 666, 676, 690, 257/694, 695; 438/111, 117, 123
See application file for complete search history.

(56) References Cited

U.S. PATENT DOCUMENTS

| | | | |
|---|---|---|---|
| 4,118,859 A | 10/1978 | Busler | |
| 4,234,666 A | 11/1980 | Gursky | |
| 4,298,883 A | 11/1981 | Komatsu | |
| 4,633,582 A | 1/1987 | Ching et al. | |
| 4,722,470 A * | 2/1988 | Johary | 228/180.21 |
| 4,794,446 A * | 12/1988 | Hamano | 257/696 |
| 4,809,054 A | 2/1989 | Waldner | |
| 4,818,960 A | 4/1989 | Satoh et al. | |
| 4,852,250 A | 8/1989 | Andrews | |
| 4,865,193 A | 9/1989 | Shimamoto et al. | |
| 4,984,062 A | 1/1991 | Uemura et al. | |
| 5,115,299 A | 5/1992 | Wright | |
| 5,224,021 A * | 6/1993 | Takada et al. | 174/52.2 |
| 5,227,995 A * | 7/1993 | Klink et al. | 257/666 |

(Continued)

FOREIGN PATENT DOCUMENTS

JP    59-1984-161851    9/1984

(Continued)

OTHER PUBLICATIONS

JEDEC Solid State Product Outline, Low Profile Small Outline J-Lead Package (LSOJ), PRSO-J/LSOJ, Issue B, Jun. 1999, MO-199, pp. 1-5.*

(Continued)

*Primary Examiner*—Carl Whitehead, Jr.
*Assistant Examiner*—Jennifer M. Dolan
(74) *Attorney, Agent, or Firm*—Townsend and Townsend and Crew LLP

(57) ABSTRACT

Space-efficient packaging of microelectronic devices permits greater functionality per unit PC board surface area. In certain embodiments, packages having leads of a reverse gull wing shape reduce peripheral footprint area occupied by the leads, thereby permitting maximum space in the package footprint to be allocated to the package body and to the enclosed die. Embodiments of packages in accordance with the present invention may also reduce the package vertical profile by featuring recesses for receiving lead feet ends, thereby reducing clearance between the package bottom and the PC board. Providing a linear lead foot underlying the package and slightly inclined relative to the PC board further reduces vertical package profile by eliminating additional clearance associated with radiuses of curvature of J-shaped leads.

6 Claims, 45 Drawing Sheets

U.S. PATENT DOCUMENTS

| | | | |
|---|---|---|---|
| 5,327,009 A | 7/1994 | Igeta | |
| 5,446,623 A | 8/1995 | Kanetake | |
| 5,461,539 A | 10/1995 | Kuriyama | |
| 5,508,557 A * | 4/1996 | Sunada | 257/692 |
| 5,521,429 A | 5/1996 | Aono et al. | |
| 5,554,886 A | 9/1996 | Song | |
| 5,616,953 A * | 4/1997 | King et al. | 257/666 |
| 5,625,226 A | 4/1997 | Kinzer | |
| 5,689,135 A | 11/1997 | Ball | |
| 5,760,468 A * | 6/1998 | King et al. | 257/666 |
| D402,638 S | 12/1998 | Farnworth et al. | |
| 5,900,582 A | 5/1999 | Tomita et al. | |
| 5,914,529 A | 6/1999 | King et al. | |
| 6,002,167 A * | 12/1999 | Hatano et al. | 257/696 |
| 6,016,918 A | 1/2000 | Ziberna | |
| 6,040,626 A | 3/2000 | Cheah et al. | |
| 6,072,243 A | 6/2000 | Nakanishi | |
| 6,111,312 A * | 8/2000 | Hirumuta et al. | 257/696 |
| 6,114,759 A * | 9/2000 | Okuaki | 257/692 |
| 6,175,149 B1 * | 1/2001 | Akram | 257/676 |
| 6,194,777 B1 * | 2/2001 | Abbott et al. | 257/666 |
| 6,211,462 B1 | 4/2001 | Carter et al. | |
| 6,242,797 B1 | 6/2001 | Ichikawa et al. | |
| 6,242,800 B1 | 6/2001 | Munos et al. | |
| 6,249,041 B1 | 6/2001 | Kasem et al. | |
| 6,297,546 B1 * | 10/2001 | Moden | 257/669 |
| 6,433,418 B1 * | 8/2002 | Fujisawa et al. | 257/696 |
| 6,435,222 B1 * | 8/2002 | Sato et al. | 140/105 |

FOREIGN PATENT DOCUMENTS

| | | | |
|---|---|---|---|
| JP | 59161851 A | * | 9/1984 |
| JP | 61207041 A | * | 9/1986 |
| JP | 62117355 A | * | 5/1987 |

OTHER PUBLICATIONS

JEDEC Solid State Product Outlines, "Small Outline J-Lead"(SOJ) .300 Body Family (MS-013 Body), Issue A, Jun., 1988, MO-088, AA-AF.

JEDEC Solid State Product Outline, Low Profile Small Outline J-Lead Package (LSOJ), PRSO-J/LSOJ, Issue B, Jun., 1999, MO-199, pp. 1-5.

JEDEC Solid State Product Outlines, "Plastic Small Outline (SOJ) Package Family with .330 Inch Body Width", Issue B, May, 1992, MO-121, pp. 1-2.

* cited by examiner

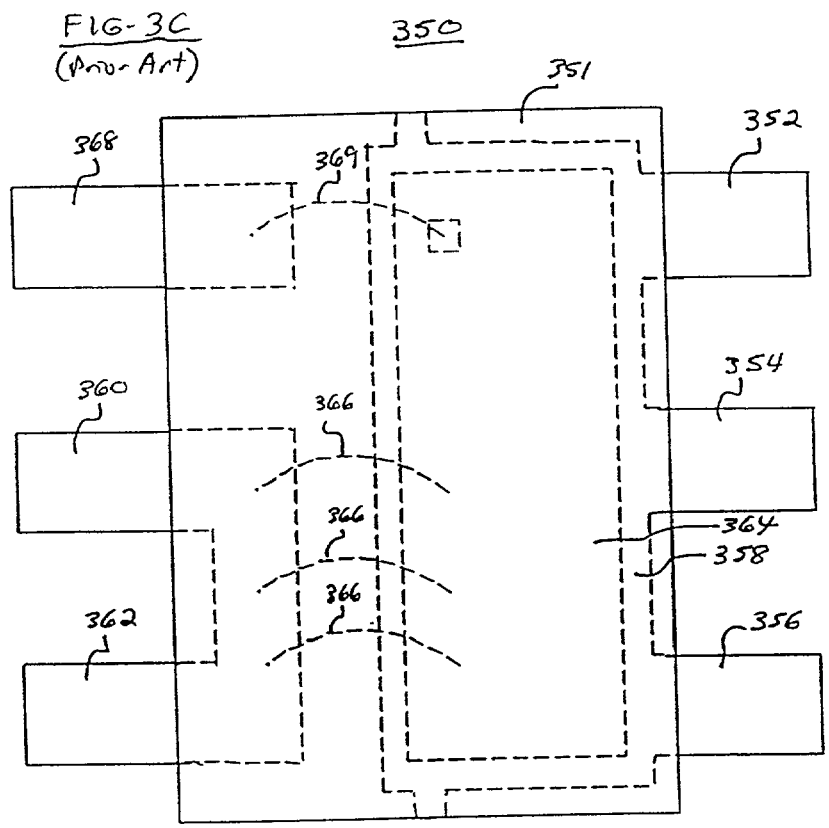
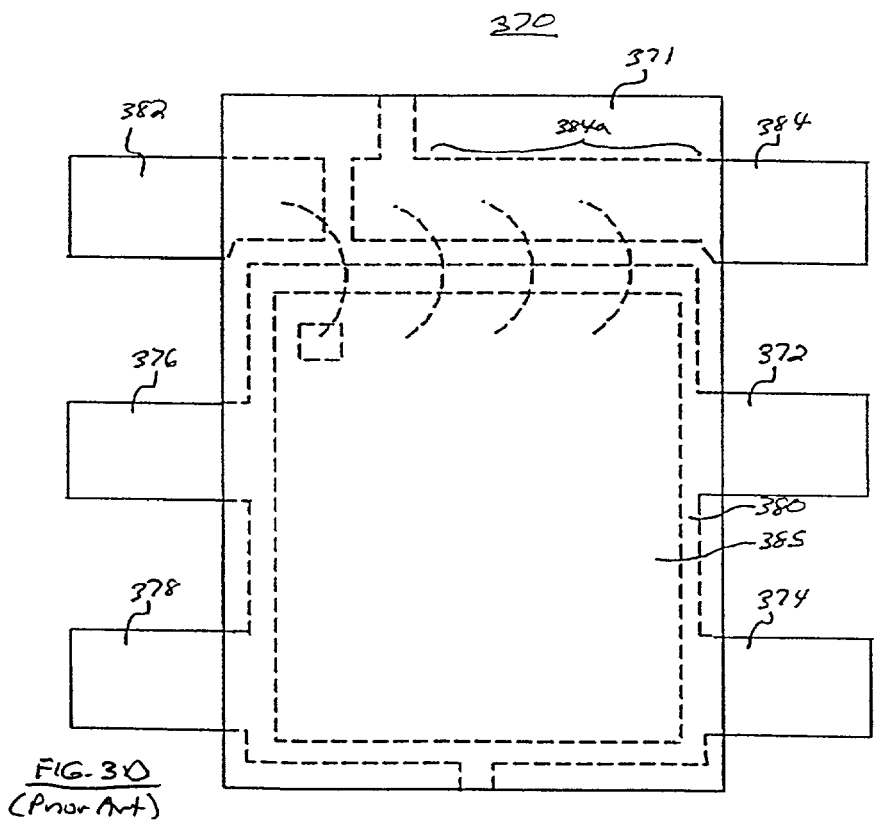

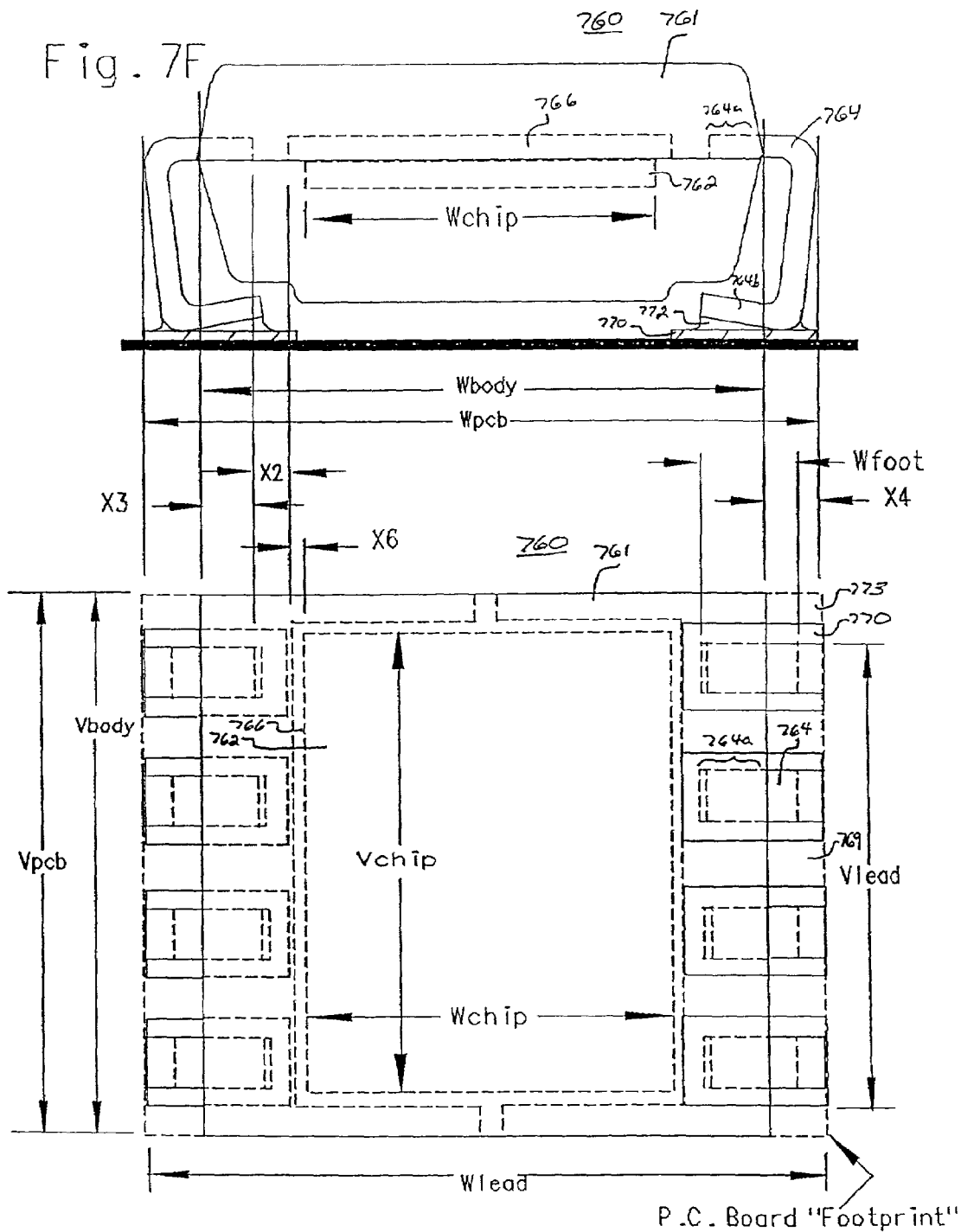

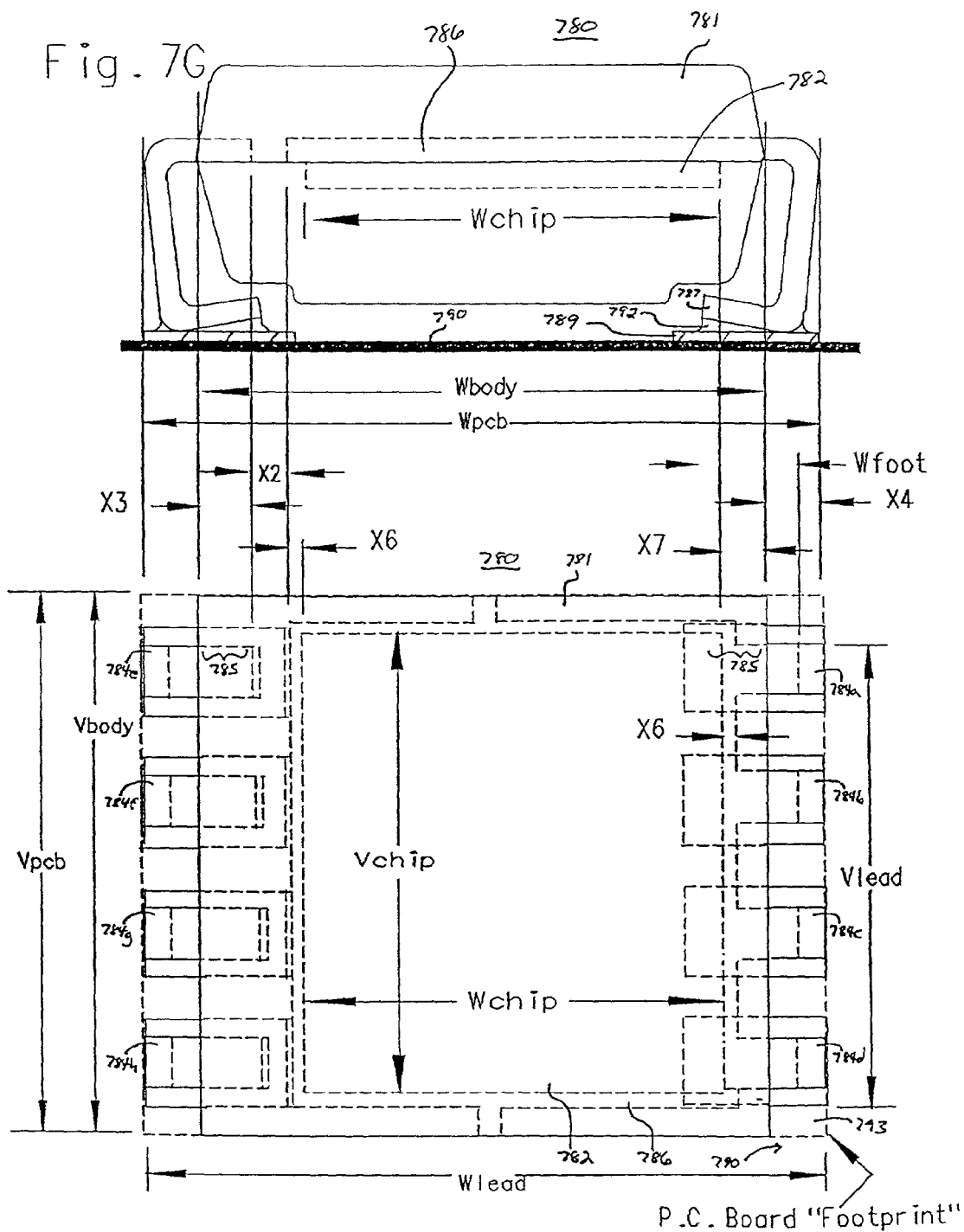

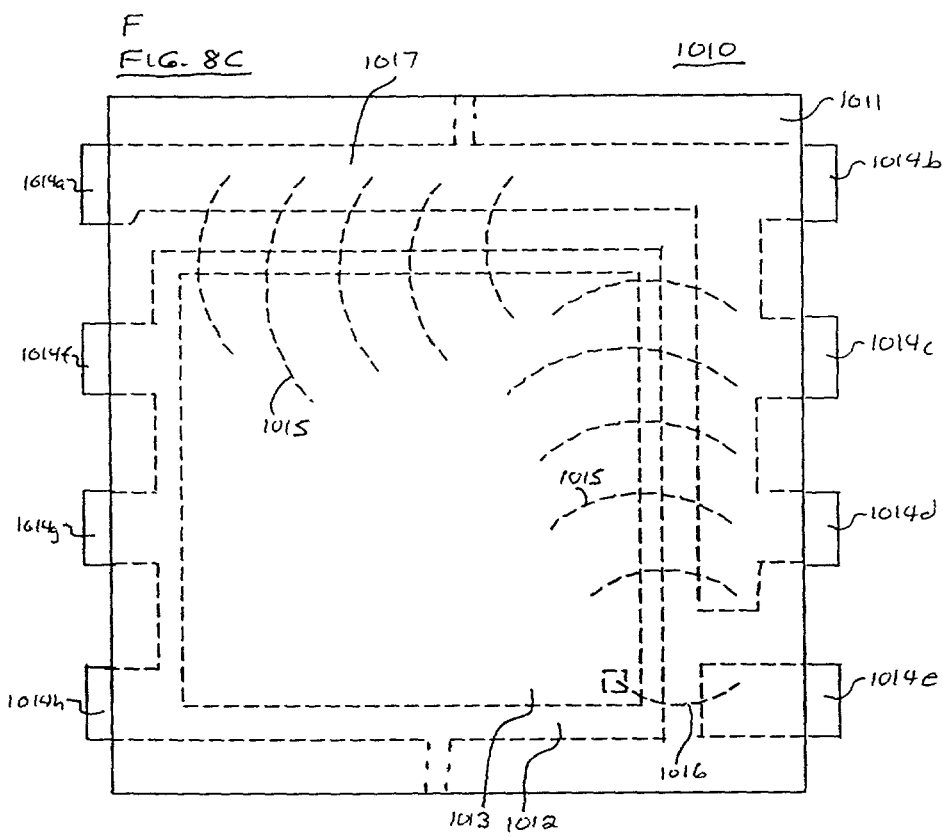
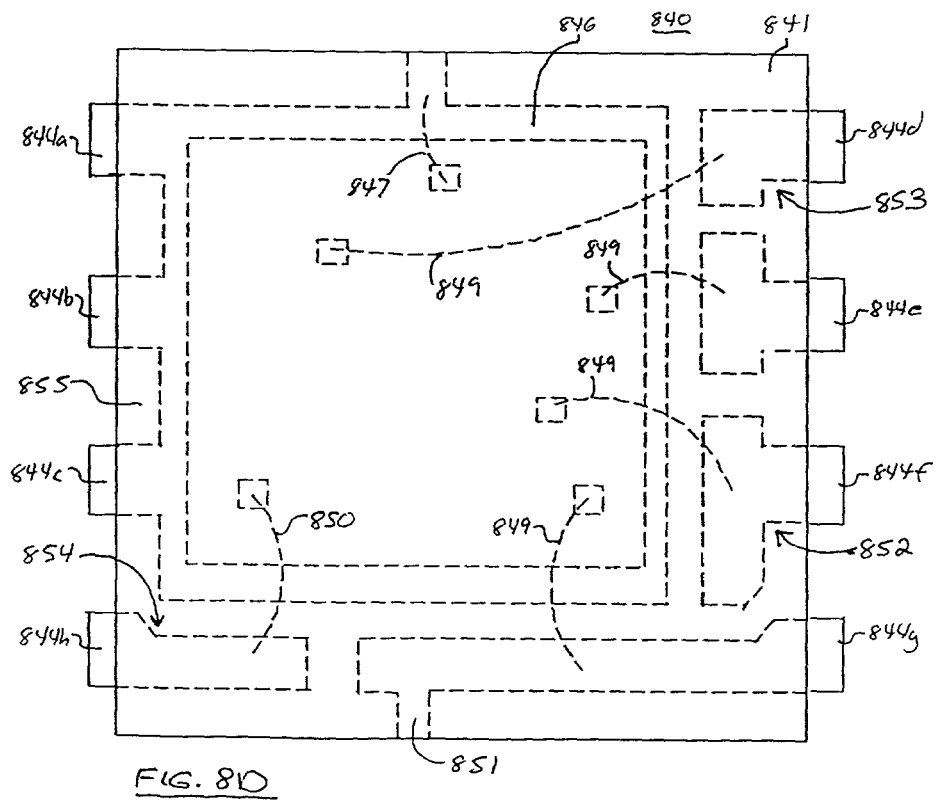

Fig. 14

| Package | | LxW(mm) | | (JW = J-lead/Wide Body) |
|---|---|---|---|---|
| SO-8 | | 4.83X6.00 | | SO-8JW |
| MSOP-8 | | 3.05X4.9 | | MSOP-8JW |
| SC-59 | | 3.05X2.85 | | SC-59JW |
| TSOP-6 | | 3.05X2.85 | | TSOP-6JW |
| TSOP-8 | | 3.05X2.85 | | TSOP-8JW |
| SOT-23 | | 3.0X2.5 | | SOT-23JW |
| SC-70 | | 2.0X2.1 | | SC70JW |
| SC-70-8 | | 2.0X2.1 | | SC70-8JW |

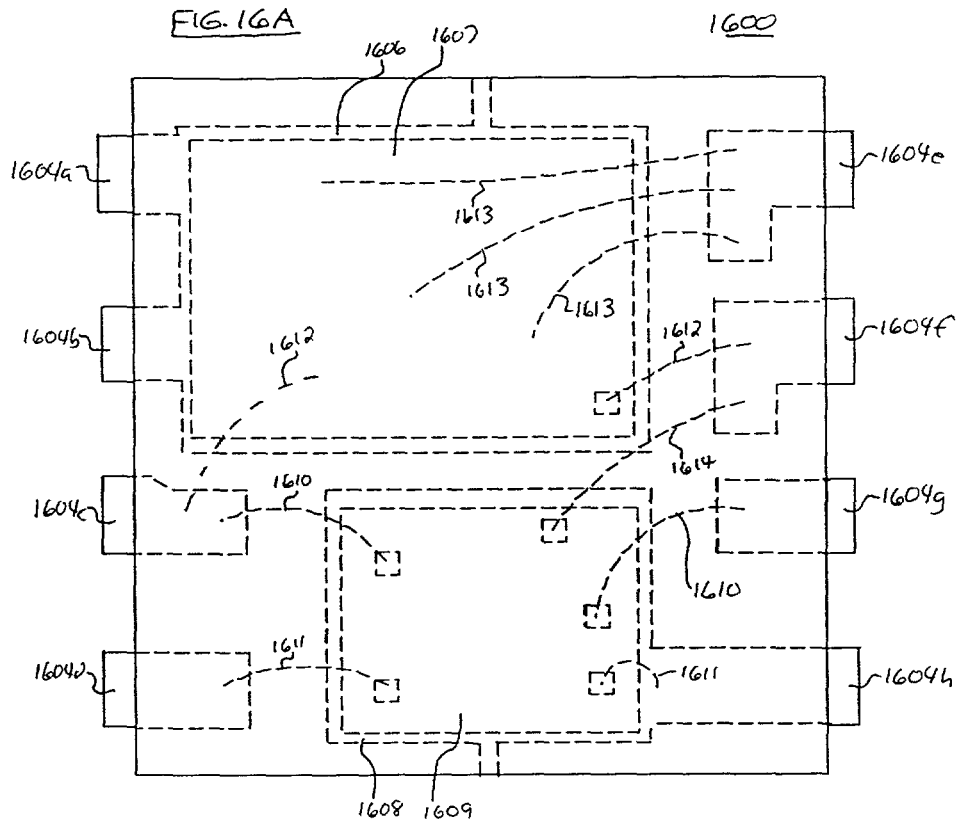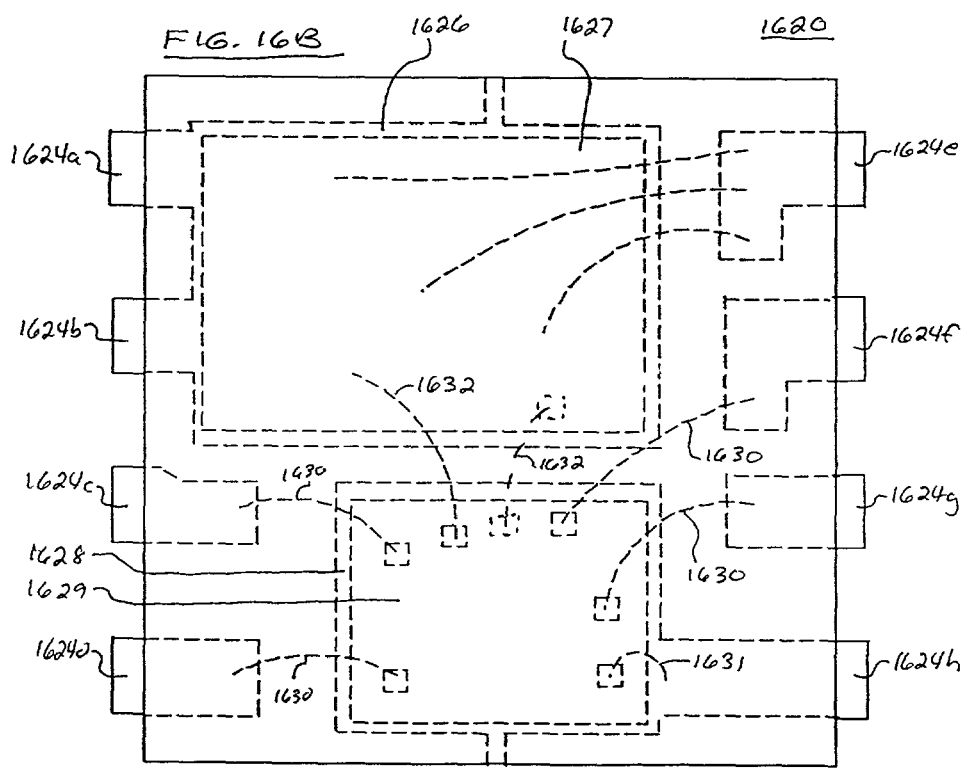

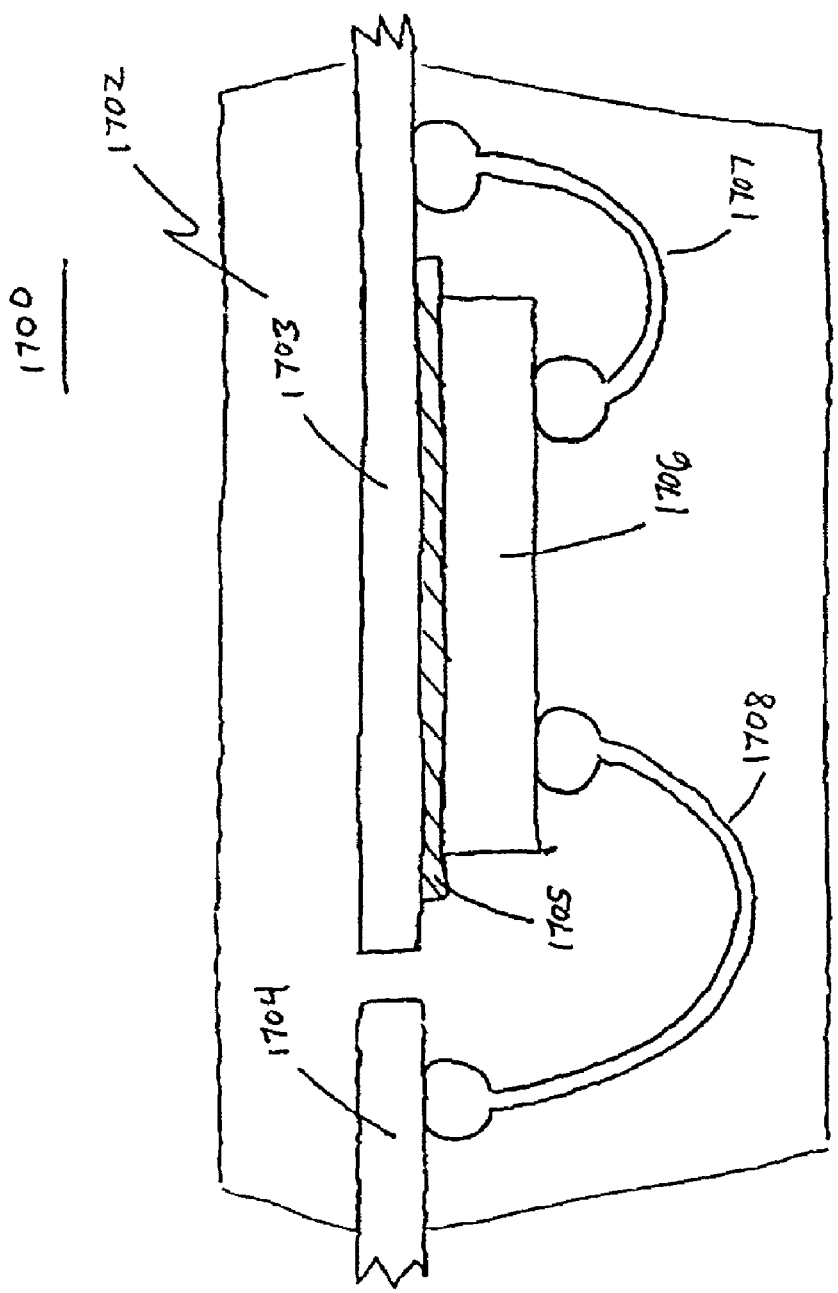

SURFACE MOUNT PACKAGE

CROSS-REFERENCE TO RELATED APPLICATION

The instant non-provisional patent application claims priority from U.S. provisional patent application No. 60/291,212, filed May 15, 2001 and entitled "Improved Surface Mount Package". This provisional patent application is hereby incorporated by reference.

BACKGROUND OF THE INVENTION

The present invention relates generally to electronic devices. More particularly, the invention provides an improved package, packaging system and method for packaging of electronic devices. Merely by way of example, the present invention can be used for producing "small footprint sized packages" for integrated circuit devices and discrete devices often used for a variety of digital, analog, small signal discrete, and power applications, such as electronically controlled switches for power on/off control of system and sub-system components, and switching components in DC/DC conversion, especially in mobile and battery powered applications such as cell phones, portable and notebook computers, personal digital assistants (PDAs), digital cameras, and other computing applications, as well as in non-mobile applications such as set-top boxes, flat panel monitors; motherboards, desktop, server and main frame computers; in automotive electronics, and in cellular base station and in fiber and datacom networks.

A class of packages for microelectronic devices are "small footprint sized", low pin count packages. Microelectronic circuits enclosed by these packages are in low- and medium integration level devices employing a low pin count. Such packages are often very small as compared to more conventional integrated circuit device packages (e.g., BGAs, PLCC, QFP, PGA) for conventional large DSPs (digital signal processors), ASICs (application specific integrated circuits), memory devices (e.g., Flash, DRAM, ROM) for computers, microprocessors (e.g., Intel™ Pentium), and the like, which often use very high pin counts and extremely large die sizes. Unlike such conventional integrated circuit device packages, small footprint sized, low pin count packages attempt to minimize footprint size as well as provide the minimum required pin count for a given type of product. With ever-increasing demands for enhanced performance, new applications for electronics often require such smaller sized packages and increased package efficiency as measured in performance per unit area of PC board. Such increased efficiency may take the form of smaller package footprints for a given performance level, or increased performance for an existing footprint. This increased need for space efficiency exists for discrete, power and small signal MOSFET and power control circuits, power management ICs, power ICs and analog ICs including electronic devices used in portable computer products and notebooks, portable telecommunication products, and portable entertainment products such as handheld games, MP-3 players, digital cameras (DSCs, camcorders), in lithium ion battery-pack protection electronics, and the like.

Although there has been much development with package designs for conventional devices, to date there has been little focus on improving the design of packages for the smaller, low pin count and low integration devices, especially for power applications. Many conventional small footprint packages still lack efficiency and performance. For example, conventional packages have not been configured to provide enhanced performance per unit area of PC board occupied. In many conventional packages, only 10 percent or less of the total available package footprint area on the PC board is occupied by an active semiconductor device. This poor area efficiency limits the functionality or performance of the semiconductor component in its application, especially when the available board space is determined by the maximum allowable size and three-dimensional form-factor of the end product, such as a cell phone. In this context, poor performance may constitute a lack of desirable features in the semiconductor (features not possible because of a limited amount of available silicon real estate), or as a higher resistance device, transistor, power MOSFET or other switching element leading to increased power losses, self heating, and further increases in resistance as a result of self heating. These increased power losses can be viewed as both a potential thermal problem, and as a loss in efficiency and battery life.

Furthermore, such small, low-pin count packages typically lack sufficient ability to remove heat from the semiconductor die and to conduct that heat out of the package into the PC board and into the ambient. The high thermal resistance characteristic of a package's inability to remove heat limits the utility of these conventional type small packages in applications (and in products) where the semiconductor die is forced to dissipate substantial power, even if but for a few seconds. In high power dissipation conditions, unless the power dissipation is limited, the semiconductor die may malfunction, or be damaged, and may also damage its own package and even other components in its vicinity on the PC board.

As a further limitation of such conventional packages, methods used to increase the number of potential pins on any given package, may in fact reduce the maximum die size that can fit into the package, and in so doing lead to even higher power losses and lower efficiencies.

It can also be shown, that adjusting the lead frame design in a conventional package to maximize the die size, may in fact lead to an inadequate number of pins to connect the IC or die, and may also result in the position of such pins and bond pads such that it becomes difficult or impossible to facilitate proper or optimal wire bonding.

Likewise, it can be shown that adjusting the number of pins for optimum bonding may result in a smaller die and poorer silicon performance, for example increasing the resistance in a power transistor, and in other cases, may result in a higher thermal resistance in a package with no convenient means to conduct heat out of the silicon and into the printed circuit board (PCB). This tradeoff may force an undesirable compromise between the number of pins and the thermal resistance and power handling capability of the package.

So in conventional type packages, there is an intrinsic tradeoff among factors such as the size of the die, the number of pins, the location of the pins relative to the die, the number of bond wires which may be bonded from any given pin and the bond length and the bonding angles which result, and the means to directly conduct heat through metal or through one or more leads into the PCB. Any or all of these factors make it difficult to achieve optimal performance for many IC and discrete devices, especially those involved in power applications or carrying high current.

As merely examples, we have provided some illustrations of conventional packages and their limitations below. For the purposes of the present invention, the term "lead frame" refers to electrically conducting portions of a package, apart from bond wires, that enable electrical communication with a die enclosed by a package. As a matter of terminology, the name "lead frame" includes both the pins and the die pad of the package because these elements are typically held together into a single inter-connected piece or frame until such time in the packaging process that the leads and the die pad are secured by the injection of plastic, after which the frame holding the leads and the die pad in place can be cut or disconnected. The term "die pad" refers to the portion of the lead frame in direct physical contact with the semiconductor die. Typically, the semiconductor die is attached to the die pad by a solder or adhesive material interposed between the die and the die pad.

Referring to FIGS. 1A–1F, illustrations of conventional six lead packages are shown. FIG. 1A is a simplified perspective view of conventional six-lead package 100 including package body 102 and exposed leads 104. FIG. 1B is a simplified plan view of conventional six-lead package 100 of FIG. 1A. FIG. 1C is a simplified plan view of conventional six-lead package 100 of FIG. 1A. FIG. 1C shows internal components such as lead frame 110 including die pad 106 and internal portion 104a of leads 104. FIG. 1D is a simplified plan view of the conventional six-lead package of FIG. 1A additionally showing die 108 and bond wires 110. Bond wires 110 permit electrical communication between die 108 and leads 104. Since the package has six independent leads 104, it is electrically a six pin package. Thermally it is a "zero" pin package since none of the pins connect directly to the die pad and so that there is no direct path for heat to flow from the die to the PC board.

As shown in the figures, the die pad occupies a very small region of the entire area of the package, including outer portions of the leads. The conventional package occupies less than 10% of the entire package footprint on the PC board, which is undesirable for today's high performance applications. The conventional package is also not configured in a manner to efficiently draw away thermal energy that may dissipate or build up in certain types of power integrated circuits and in discrete power devices. Accordingly, conventional six lead packages have many limitations.

FIG. 1E is a simplified plan view of a configuration of a conventional six lead package like that shown in FIG. 1D having a lead frame modified to (somewhat) reduce the thermal resistance of the package. Specifically, package 120 of FIG. 1E shows five leads 122 connected to die 124 by bond wires 126, and sixth lead 128 integral to die pad 130. Because of its greater area of contact with die pad 130, integral lead 128 permits a larger quantity of thermal energy to be drawn away from operating die 124 through die pad 130 and then to be dissipated into the external environment. The improvement in thermal resistance is somewhat mitigated by the limited cross-sectional area of a single package lead (through which heat must flow) and on the limited contact area and surface area of the lead where it contacts the PC board. The limited contact area between the board and a single lead means the heat enters the PC board in a small region, like a thermal "point source". The heat spreading into the board from a point source is redistributed across the PC board's surface less efficiently than if a larger lead or, even better, multiple leads were to carry the heat from the die to the PC board. Accordingly a single lead, such as 128, connected directly to the die pad, while improving thermal resistance, results in less improvement than expected and depends heavily on the PC board layout. Although a larger pin (or multiple pins) carrying heat would be less sensitive to the influence of the board layout on the resulting thermal resistance, such design features are not available or anticipated by conventional packages. Another drawback with this configuration of a six-lead package is it still lacks an ability to efficiently use package space. Specifically, only 10% of the available footprint area is occupied by die 124. The remainder of the footprint area is allocated to other, non-performance-related considerations, especially to satisfy all the mechanically related design rules FIG. 1F shows a simplified cross-sectional view of the conventional six-lead package 100 of FIG. 1D, along line 1F–1F'. The cross-sectional view of FIG. 1F shows package body 102 enclosing die pad 106 and semiconductor die 108. Leads 104 projecting from package body 102 include portions 104a internal to package body 102, a distance requiring some minimum dimension to insure that the plastic molding of the package is sufficient to hold the lead 104 tightly in place. Lead portions 104b are external to package body 102, a dimension requiring some minimum distance needed to facilitate bending the lead without cracking or otherwise damaging the molded plastic package. Foot portions 104c of leads 104 are in contact with trace 112 of underlying PC board 114, to guarantee some minimum contact area between the foot and the PC board's conductive trace. The forming and bending of lead 104 including the bent portion of the lead and the minimum sized foot are determined by mechanically-related design rules chosen to produce repeatable results at rapid manufacturing through-put rates consistent with the use of industry standard machines commonly used in semiconductor packaging.

FIG. 2A shows a simplified cross-sectional view, including dimensions, of the conventional six-lead package of FIG. 1D, also along 1F–1F'. Dimensions indicated in FIG. 2A include die width (Wchip) of die 108, package body width (Wbody) of plastic body 102, package body thickness (Zpkg) of plastic body 102, vertical package profile (Zprofile) of package 100, and lead foot width (Wfoot) of lead 104, and clearance (gap) Z1 between the bottom of package body 102 and metal trace 112 located on PC board 114.

FIG. 2B shows a simplified plan view, including dimensions, of conventional six-lead package 100 of FIG. 1D. Dimensions indicated in FIG. 2B include the aforementioned package body width (Wpkg), die width (Wchip), length (X3) of internal lead portion 104a, and width (Wfoot) of lead foot 104c, along with additional design dimensions including distance (X2) between internal lead portion 104a and die pad 106 (a gap needed to prevent shorting between the pin and the die pad), setback or inset (X1) of die 108 from edge of die pad 106 (a minimum dimension needed to make sure the die doesn't substantially hang over or extend beyond the die pad), and width (X4) of external lead portion 104b (needed to facilitate bending and forming of the lead after plastic molding occurs).. The package shown in FIG. 2B further elaborates the rules governing the construction of package 100 (shown previously in FIG. 1D), and therefore suffers from the same inefficient use of space as described above in conjunction with FIG. 1D.

FIG. 2C shows a simplified plan view, including dimensions, of conventional six lead package 100 of FIG. 1D as occupying footprint 110 on PC board 112. In this figure, each lead 104 of the package lead includes foot 104c sitting atop and contained within a portion of a PC board conductive trace 114 (shown here as a rectangle to represent the minimum possible dimension of the conductive trace). In practice these traces continue in various different directions, connecting to other elements on the PC board. The minimum spacing around the lead foot 104c however can be simply estimated as a border or "enclosure" rule of dimension X5. The intention of this exercise is to relate the physical dimensions of the PC board occupied by the package (in Cartesian nomenclature as (Wpcb, Vpcb)) to the actual semiconductor die dimensions (Wchip, Vchip). Dimensions labeled in FIG. 2C are summarized in TABLE 1 below

TABLE 1

DIMENSIONS LABELED IN FIG. 2C

| LABEL | DESCRIPTION |
|---|---|
| Wpcb | width of package footprint 110 |
| Vpcb | length of package footprint 110 |
| Wchip | width of die 108 |
| Vchip | length of die 108 |
| Wbody | width of package body 102 |
| Vbody | length of package body 102 |
| X5 | setback of lead foot 104c from edge of trace 112 |
| X2 | distance between edge of die pad 106 and internal portion 104a of lead 104 |
| Wlead | distance between ends of opposite lead feet 104c |
| X4 | width of external portion 104b of lead 104 |
| X3 | width of internal portion 104a of lead 104 |
| Wfoot | length of lead foot 104c |
| X8 | setback of die pad 106 within package body 102 |

From the above definitions it can be seen the following geometric rules define the package's body dimensions as a function of the chip dimension as approximately $$Wbody=2*X3+2*X2+2*X1+Wchip$$

$$Vbody=2*X8+2*X1+Vchip$$

And determines the package footprint on the PC board as approximately given by $$Wpcb=2*X5+2*Wfoot+2*X4+Wbody$$

$$Vpcb=Vbody$$

The package shown in FIG. 2C exhibits the same inefficient use of space as described above in conjunction with FIG. 1D, except that now the wasted space outside the package becomes more evident.

FIG. 3A is a simplified plan view of an alternative configuration of a conventional six-lead package, showing internal components of package body 301. Package 300 includes three leads 302, 304, and 306 integral with die pad 308. Leads 310, 312, and 314 are each connected to die 316 by bond wires 318. The one-sided orientation and surface area provided by integral leads 302, 304, and 306 enables heat flow from operating die 316 and out of package body 301, to be dissipated in the external environment, thereby improving the thermal resistance of the package. The pins connected directly to the die pad are herein referred to as "thermal pins" because they carry heat away from the die and into the PC board. Note that even through leads 302, 304, and 306 comprise three thermal pins, they represent only a single electrical pin since they are all shorted to a single potential, namely the die pad potential.

So increasing the number of pins connected directly to the die pad improves the package's electrical thermal resistance but at the penalty of decreasing the number of leads available for distinct electrical connections. Furthermore, even with this modified lead frame conventional package configuration shown in FIG. 3A still suffers from inefficient utilization of footprint area, as die 316 occupies only approximately 10 to 15% of the total available footprint area.

Another limitation of this conventional package, is its number of electrically independent pins, which as shown comprises 4 distinct electrical connections, the three separate pins 310, 312, and 314, and the die pad connected pins 302, 304, 396 constituting a fourth connection. So this modified package is a 4 electrical pin, 3 thermal pin package. While a 4 electrical pin package is often applicable for the packaging of discrete transistors, many ICs need more pins to include various control functions FIG. 3B is a simplified plan view, including dimensions, of the package shown in FIG. 3A. Dimensions labeled in FIG. 3B are summarized below in TABLE 2.

TABLE 2

DIMENSIONS LABELED IN FIG. 3B

| LABEL | DESCRIPTION |
|---|---|
| Wlead | width between lead feet ends on opposite side of package 300 |
| Vlead | length between lead feet on opposite ends of the same side of package 300 |
| Wchip | width of die 316 |
| Vchip | length of die 316 |
| Wbody | width of package body 301 |
| Vbody | length of package body 301 |
| X7 | width of internal portion of integral leads 302, 304, 306 |
| X2 | distance between edge of die pad 308 and internal portion of non-integral leads 310, 312, 314 |
| Wlead | distance between ends of opposite lead feet 104c |
| X4 | width of external portion of non-integral leads 310, 312, 314 |
| X3 | width of internal portion of non-integral leads 310, 312, 314 |
| Wfoot | length of lead foot |

The package shown in FIG. 3B exhibits the same inefficient use of space as described above in conjunction with FIG. 3A.

FIG. 3C is a simplified plan view of another alternative configuration of a conventional six lead package. Like the package embodiment shown in FIG. 3A, package 350 includes three leads 352, 354, and 356 positioned on the same package side that are integral with die pad 358. Two of the remaining leads 360 and 362 are integral with one another and connected to die 364 through bond wires 366. Sixth lead 368 is connected to die 364 by bond wire 369. As described above in conjunction with the embodiment shown in FIG. 3A, the three integral leads 352, 354, and 356 offer the advantage of unidirectional flow and enhanced dissipation of heat generated by die 364. Formation of leads 360 and 362 out of a single piece of metal creates space for an additional third bond wire to connect leads 360 and 362 to die 364. The resulting package has 3 electrical pins and 3 thermal pins.

The additional bond wire results in a lower resistance electrical contact with die 364. However, the package shown in FIG. 3C exhibits the same inefficient use of space as described above in conjunction with FIG. 3B, in that die 364 occupies only 10 to 15% of the total available footprint area.

FIG. 3D is a simplified plan view of yet another configuration of a conventional six lead package, showing internal components of package body 371. Package 370 includes four leads 372, 374, 376, and 378 that are integral with die pad 380. One of the remaining leads 382 is connected to die 385 through bond wire 384. The other remaining lead 384 features a lengthy internal portion 384a that is connected to die 385 through multiple bond wires 387. As described above in conjunction with the package embodiment shown in FIG. 3A, leads 372, 374, 376, and 378 integral with die pad 380 offer the advantage of enhanced heat dissipation from die 385. Elongated lead 384 offers the advantage of multiple bond wire connections and reduced resistance. However, the package shown in FIG. 3D exhibits the same inefficient use of space as described above, in that die 385 occupies only 10% to 15% of the total available footprint area. The resulting package has 4 thermal pins but only 3 electrical pins.

FIG. 3E is a simplified plan view of still another configuration of a conventional six lead package, showing internal components of package body 391. Package 390 includes four leads 392, 393, 394, and 395 integral with die pad 396. The remaining two leads 397a and 397b comprise opposite ends of a single metal piece that is connected to die 399 through multiple bond wires 398. Unlike the similar, previously illustrated embodiments package 390 of FIG. 3E includes only two contacts to die 399, which can perform the function of a simple device such as a diode. Package 390 is therefore a six-leaded package with 4 thermal pins but only two electrical pins. Furthermore, package 390 shown in FIG. 3E exhibits the same inefficient use of space as described above, in that die 399 occupies only 10% to 15% of the total available footprint area.

While the conventional packages described so far utilize six leads, other types of conventional packages may utilize a different number of leads. For example, FIG. 4A is a simplified perspective view of a larger footprint conventional eight lead package. Package 400 includes package body 402 and exposed leads 404. Like the previously described six lead package, the leads of this package type must be bent to connect to the PC board with the foot of each lead being substantially co-planar.

FIG. 4B is a simplified plan view of the eight lead package of FIG. 4A, showing internal components within package body 402. Specifically, package 400 includes first die 406 positioned on first die pad 408, and second die 410 positioned on second die pad 412. First die 406 is connected to leads 404a–d through bond wires 411, and second die 410 is connected to leads 404e–h through bond wires 415. Package 400 is therefore a dual die eight lead package offering a total of 8 electrical pins but no (zero) thermal pins. Like the conventional six-lead packages described above, conventional eight-lead package 400 also suffers from inefficient use of available footprint area, in that even less than 10% of the total package footprint is occupied by dies 406 and 408.

FIG. 4C is a simplified plan view of another configuration of a conventional eight-lead dual package, showing internal components within package body 421. Package 420 includes first die 422 positioned on first die pad 423, and second die 426 positioned on second die pad 428. First die 422 is connected to leads 404a–c through bond wires 425, and lead 404d is integral with first die pad 423. Second die 426 is connected to leads 404e–g through bond wires 429, and lead 404h is integral with second die pad 428. Package 420 is therefore a dual die eight lead package offering a total of 8 electrical pins with only two thermal pins (one per each die). While integral leads 404d and 404h offer the advantage of some degree of enhanced heat dissipation from dies 422 and 426, respectively, package 420 suffers from the same inefficient allocation of footprint area as the package of FIG. 4B.

FIG. 4D is a simplified plan view of another configuration of an eight-lead dual package, showing internal components within package body 431. Package 430 includes first die 433 positioned on first die pad 432, and second die 435 positioned on second die pad 436. First die 433 is connected to leads 434c–d through bond wires 437, and leads 404a–b are integral with first die pad 432. Second die 435 is connected to leads 404g–h through bond wires 439, and leads 434d–e are integral with second die pad 436. Integral leads 434a–b and 434e–f offer the advantage of enhanced heat dissipation (conduction into the PC board) from dies 433 and 435, respectively. Package 430 is therefore a dual-die eight-lead package offering a total of 6 electrical pins but with 4 thermal pins (two per die pad). However, while dies 433 and 435 are shown as being somewhat larger in area than the dies of FIG. 4C, package 430 exhibits the inefficient allocation of footprint area as the package of FIG. 4C.

FIG. 4E is a simplified plan view of a configuration of an eight-lead package enclosing a single die, showing internal components of package body 441. Package 440 includes elongated die 442 positioned on die pad 446 and in communication with each of leads 444a–h through bond wires 448. Like all of the conventional packages described above, package 440 suffers from the same inefficient allocation of footprint area. Specifically, die 442 occupies less than 10% of the total footprint area available to the package. Moreover, the aspect ratio (the ratio of length to width) of the maximum possible die size to fit in this package may be too extreme (over a 3-to-1 ratio of dimensions). High aspect ratio die can exhibit poor die attach and increased incidence of die cracking and stress related failures. Package 440 is a single-die eight-lead package offering a total of 8 electrical pins but no (zero) thermal pins. So the number of thermal pins is compromised in order to increase the number of electrical pins.

FIG. 4F is a simplified plan view of still another configuration of an eight-lead package enclosing a single die, showing internal components of package body 451. Package 450 includes elongated die 452 positioned on die pad 456 that is integral with leads 454a–d. Three of the remaining leads 454e–g are formed from a single piece of metal that is connected with die 452 through multiple bond wires 457. Remaining lead 454h is connected with die 452 through bond wire 459. As described above, the four integral leads 404a–d offer the advantage of enhanced heat dissipation (heat conduction into the PC board). Formation of leads 404e–f out of a single piece of metal offers the advantage of multiple bond wire connections offering reduced electrical resistance. Package 450 is therefore a single-die eight lead package offering a total of 3 electrical pins with 4 thermal pins. Despite these advantages however, package 450 offers the same relatively poor utilization of footprint area as the conventional package shown in FIG. 4E, as well as exhibiting a high aspect ratio of die length to die width.

While the above embodiments of a conventional package are functional, each suffers from the disadvantage of inefficient utilization of space afforded by the package footprint. Specifically, TABLE 3 shows die area versus footprint area for single-die conventional packages of five standard types:

TABLE 3

| Package Type | Lead-Lead Width (mm) | Package Body Length (mm) | Footprint Area (mm²) | Package Body Width (mm) | Die Width (mm) | Die Length (mm) | Die Area (mm²) | Die/Footprint Area (%) |
|---|---|---|---|---|---|---|---|---|
| SO-8 | 6 | 4.83 | 28.98 | 3.81 | 2.49 | 3.96 | 9.8604 | 34 |
| MSOP-8 | 4.9 | 3.0 | 14.7 | 3.0 | 1.69 | 2.13 | 3.6 | 24 |
| TSOP-6 | 2.85 | 3.05 | 8.6925 | 1.65 | 0.65 | 1.78 | 1.157 | 13 |
| SOT-23 | 2.5 | 3 | 7.5 | 1.35 | 0.35 | 1.73 | 0.6055 | 8 |
| SC-70 | 2.1 | 2 | 4.2 | 1.25 | 0.25 | 1.4 | 0.35 | 8 |

TABLE 3 shows that even in the largest package, the enclosed die occupies less than 35% of the total footprint area. In the two smaller packages, the die occupies a mere 8% of the total available area of the package footprint. In order to maximize the space efficiency of the package, it is therefore desirable to redesign the package to allocate as much space as possible to the die. Likewise, it is desirable to redesign the package to offer the lowest possible thermal resistance and the maximum number of die-pad connected thermal pins without sacrificing the number of available distinct electrical pins. It is also desirable to redesign the package to minimize the aspect ratio for any given die area, and to maximize the number of available bond wires. Finally it is desirable to redesign the package for the most flexible and optimum bonding of the wire bonds, and to be able to maximize the number of bond wires for a given pin if the pin is carrying high current. Accordingly, there is a need for improved packaging systems and methods.

SUMMARY OF THE INVENTION

According to the present invention, techniques for packaging electronic devices are provided. More particularly, the invention provides an improved packaging system and method for electronic devices. Merely by way of example, the present invention can be used for packaging of "small footprint sized packages" for integrated circuit devices and discrete devices often used for power and power management applications, such as electronically controlled switches for power on/off control of system and sub-system components, and switching components in DC/DC conversion, primarily in battery powered applications such as cell phones, portable computers, personal digital assistants (PDAs), digital cameras, and other computing applications.

In certain embodiments, packages having leads of a reverse gull wing shape or a curved J-lead shape allocate increased space in the package footprint to the packaged die. Use of such a reverse gull wing shaped or J shaped lead also serves to maximize the portion of the package body width (i.e. laterally parallel to the PC board) in order to expand the lead frame size and accommodate a larger possible die size (herein referred to as a wide-body package). The present invention applies to small footprint packages that are often and generally less than 7 mm in dimension, and should not be confused with very large and very high pin count packages often used with memory chips for computers, microprocessing integrated circuits, and the like. More generally, no specific package size per se determines the maximum size package in accordance with the present invention, as the methods employed herein can be applied to larger die. However, the benefits in efficiency of spacing taper off in packages larger than 7 mm.

In a specific embodiment, the invention provides a small footprint semiconductor device package. The package has a plastic package body for enclosing a die. The plastic package body has a top coupled to a bottom through a plurality of sides, which house the die. The package also has a lead including a partially enclosed portion by the package body and in electrical communication with the die. An exposed portion of the lead is also included. The exposed portion extends from the side of the package body. The exposed portion also folds back along the side of the package toward the bottom of the package and folds back toward a center of the bottom. The portion of the lead along the side of the package and the portion of the lead along the bottom of the package form an angle of less than 90 degrees from each other and, the lead foot being inclined relative to an underlying planar PC board. The inclined surface has advantages such as promoting solder wetting and the like.

The present invention has many advantages in maximizing the available silicon real estate or die size for a given package footprint on the PC board. In a preferred embodiment, the invention includes a package which includes metal leads extending out of a plastic body such that the lateral width of the package at its widest point including the combined width of the plastic body and the protruding leads, is widest in the cross sectional plane where the leads protrude from the plastic body. In this present invention, the maximum width of the leads (including the lead foot) in any cross sectional plane parallel to the PC board is substantially the same size or even smaller in dimension than in the plane where the leads protrude or exit from the plastic package body. Since the width of the package and leads in this specific preferred embodiment is widest in the cross sectional parallel plane parallel to the PC board where the leads exit the plastic package body, then it follows the width is smaller in dimension on the plane where the leads contact the PC board. In other words, the package leads are smaller (or substantially the same dimension) where they contact the PC board. A reverse-gull-wing-shaped or J-shaped lead configuration are shown as one such means to implement this preferred embodiment.

In another preferred embodiment the maximum lateral extent of the leads in the cross sectional plane contacting the PC board are smaller than (or not substantially larger than) elsewhere, in any plane above the PC board's surface. In such a preferred embodiment, the leads of the package have a vertical portion that are substantially perpendicular to the PC board's surface or that tilt outward away from the PC board's surface, being wider away from surface of the PC board.

In another embodiment, the package body is maximized relative to the PC board space such that package width including the leads is widest in a plane parallel to the PC board where the leads protrude from the package (or in any plane other than that where the leads contact the PC board) and where the plastic body of the package extends over the feet of the package's leads.

In another embodiment, the package's plastic body extends over each and every lead foot of the leads of the package.

In another embodiment, a semiconductor package has conductive leads each with a lead foot where each lead foot is mounted to a printed circuit board's conductive traces such that the conductive traces on the PC board where the lead foot contacts the board (a PCB pad) has a some minimum dimension to facilitate the attachment of the die foot to the PCB pad, i.e. a minimum PCB pad and where the plastic body of the package laterally extends over the top of the minimum PCB pads.

Numerous advantages may be achieved utilizing the present invention. For example, apparatuses in accordance with embodiments of the present invention produce packages that occupy a smaller lateral area and therefore allow for higher packing densities of packaged microelectronic products.

In addition, embodiments in accordance with the present invention result in packages having a reduced vertical profile, thus further allowing these devices to be employed in the confined spaces typical of portable applications such as telephones and laptop computers. In some embodiments, the invention also provides a novel structure for dissipating thermal energy in the form of heat. The invention also provides a novel lead foot structure that enhances solderability and electrical contact to an underlying PC board. In other aspects, electrical resistance is also reduced using novel pin configurations and packaging design, including maximizing the number of available bond wires, improving the location, distribution, length and bonding angles of the bond wires, and maximizing the silicon die area. Furthermore, embodiments in accordance with the present invention allow for flexibility of the design of space-efficient packages for a variety of die types and sizes. The invention also includes certain novel methods to maximize the number of die pad connected pins (for improving thermal resistance) without sacrificing the available number of distinct electrical connections. Depending upon the embodiment, one or more of these benefits may exist.

An embodiment of a small footprint semiconductor device package in accordance with the present invention comprises a plastic package body for enclosing one or more die, the plastic package body including a top coupled to a bottom through a plurality of sides. A lead includes an enclosed portion by the package body and is in electrical communication with the die. An exposed portion of the lead extends from the side of the package body, folding back or being vertically disposed substantially perpendicular to the PC board along the side of the package toward the bottom of the package at a first angle, and folding toward a center of the bottom of the package to form a lead foot. The portion of the lead along the side of the package and the portion of the lead along the bottom of the package form an angle of less than 90° from each other and the lead foot being inclined at a second angle relative to an underlying planar PC board to promote solder wetting.

An embodiment of a small footprint semiconductor device package in accordance with the present invention comprises a package body enclosing a die having an area, and a lead including an enclosed portion by the package body and in electrical communication with the die. An exposed portion of the lead extends from the side of the package body, folding back along the side of the package toward the bottom of the package, and folding toward a center of the bottom of the package to form a lead foot. A combined width and length of the package body and the exposed lead portion defines a lateral footprint area, such that the die area occupies about 40% or more of the footprint area.

An embodiment of a small footprint semiconductor device package in accordance with the present invention comprises a package body enclosing a die having an area, and a lead. The lead includes an enclosed portion by the package body, the enclosed portion integral with a die pad supporting the die, the enclosed portion in electrical communication with the die. The lead also includes an exposed portion of the lead extending from the side of the package body, folding back along or being substantially vertically disposed along the side of the package toward the bottom of the package, and folding toward a center of the bottom of the package to form a lead foot. A combined width and length of the package body and the exposed lead portion defines a lateral footprint area. The die area occupies about 40% or more of the footprint area and the enclosed lead portion draws heat away from the operating die to the exposed lead portion, and the exposed lead portion dissipates the heat.

An embodiment of a small footprint semiconductor device package in accordance with the present invention comprises a plastic package body for enclosing a die having a thickness, the plastic package body including a top coupled to a bottom through a plurality of sides. The package further comprises a lead including an enclosed portion by the package body and in electrical communication with the die, an exposed portion of the lead extending from the side of the package body, folding back along or being substantially vertically disposed along the side of the package toward the bottom of the package at a first angle relative to a plane of the package, and folding toward a center of the bottom of the package to form a substantially straight lead foot inclined at a second angle relative to an underlying PC board. A recess formed in a side of the package body receives an end of the lead foot.

An embodiment of a small footprint semiconductor device package in accordance with the present invention comprises a plastic package body for enclosing a die having a thickness, the plastic package body including a top coupled to a bottom through a plurality of sides. A lead includes an exposed portion of the lead extending from the side of the package body, the exposed portion folding back along or being substantially vertically disposed along the side of the package toward the bottom of the package at a first angle relative to a plane of the package, and folding toward a center of the bottom of the package to form a substantially straight lead foot inclined at a second angle relative to a trace on an underlying PC board. Adhesion of the lead foot to the solder is enhanced by the second angle.

Another embodiment of the present invention includes a semiconductor package with J-shaped or reverse-gull-wing shaped leads containing a lead frame having all the pins on one side of the package directly connected to the die pad so that heat may easily flow from the die pad into the PC board, where in a preferred embodiment the lead frame is composed of copper or another metal with high electrical and thermal conductivity. Specific examples of this invention include but are not limited to a six pin package where three pins on the same side of the package are tied to the die pad, an eight pin package where four pins on the same side of the package are tied to the die pad, and a twelve (or fourteen) pin package where six (or seven) pins on the same side of the package are directly connected to the die pad. In a preferred embodiment of this invention the die pad size can be expanded closer to the inside edge of the plastic body (i.e. to a smaller dimension minimum enclosure of the die pad by the plastic body) on the side where the pins are tied to the die pad than the minimum enclosure of the die pad by the plastic body on the opposite side of the package where the pins are not connected to the die pad, thereby allowing a larger die pad facilitating the maximum possible die size to fit within the package.

Another embodiment of the present invention includes a semiconductor package with J-shaped or reverse-gull-wing shaped leads containing a lead frame having all the pins on one side of the package directly connected to the die pad except for one pin so that heat may easily flow from the die pad into the PC board, where in a preferred embodiment the lead frame is composed of copper or another metal with high electrical and thermal conductivity. Specific examples of this invention include but are not limited to a six pin package where two pins on the same side of the package are tied to the die pad and one pin on the same side is not connected to the die pad, an eight pin package where three pins on the same side of the package are tied to the die pad and one pin on the same side is not connected to the die pad, and a twelve (or fourteen) pin package where five (or six) pins on the same side of the package are directly connected to the die pad and one pin on the same side is not connected to the die pad. In a preferred embodiment of this invention the die pad size can be expanded closer to the inside edge of the plastic body (i.e. to a smaller dimension minimum enclosure of the die pad by the plastic body) on the side where the pins are tied to the die pad than the minimum enclosure of the die pad by the plastic body on the opposite side of the package where the pins are not connected to the die pad, thereby allowing a larger die pad facilitating the maximum possible die size to fit within the package.

Another embodiment of the present invention includes a semiconductor package with J-shaped or reverse-gull-wing shaped leads containing a lead frame having all the pins on one side of the package directly connected to the die pad except for two pins so that heat may easily flow from the die pad into the PC board, where in a preferred embodiment the lead frame is composed of copper or another metal with high electrical and thermal conductivity. Specific examples of this invention include but are not limited to an eight pin package where two pins on the same side of the package are tied to the die pad and two pins on the same side are not connected to the die pad, a twelve pin package where four pins on the same side of the package are tied to the die pad and two pin on the same side are not connected to the die pad, and a fourteen pin package where five pins on the same side of the package are directly connected to the die pad and two pins on the same side are not connected to the die pad. In a preferred embodiment of this invention the die pad size can be expanded closer to the inside edge of the plastic body (i.e. to a smaller dimension minimum enclosure of the die pad by the plastic body) on the side where the pins are tied to the die pad than the minimum enclosure of the die pad by the plastic body on the opposite side of the package where the pins are not connected to the die pad, thereby allowing a larger die pad facilitating the maximum possible die size to fit within the package.

Another preferred embodiment of this invention is that the two pins not connected to the die pad along the side where the other pins connect to the die pad, are positioned on each side of the die pad, near opposite ends of the package.

Another embodiment of the present invention includes a semiconductor package with J-shaped or reverse-gull-wing shaped leads containing a lead frame having two separated die pads such that all the pins (for each die pad) on one side of the package are directly connected to the die pad so that heat may easily flow from each die pad into the PC board, where in a preferred embodiment the lead frame is composed of copper or another metal with high electrical and thermal conductivity. Specific examples of this invention include but are not limited to an eight pin package where two pins on the same side of the package are tied to each die pad, an twelve pin package where three pins on the same side of the package are tied to each die pad, and a fourteen pin package where four pins on the same side of the package are directly connected to one die pad, while three pins are tied directly to the other die pad. In a preferred embodiment of this invention the die pad size can be expanded closer to the inside edge of the plastic body (i.e. to a smaller dimension minimum enclosure of the die pad by the plastic body) on the side where the pins are tied to the die pad than the minimum enclosure of the die pad by the plastic body on the opposite side of the package where the pins are not connected to the die pad, thereby allowing a larger die pad facilitating the maximum possible die size to fit within the package.

Another embodiment of the present invention includes a semiconductor package with J-shaped or reverse-gull-wing shaped leads containing a lead frame where none of the pins are directly connected to the die pad, thereby maximizing the number of bond wires and package pins available not shorted to other pins.

Another embodiment of the present invention includes a semiconductor package with J-shaped or reverse-gull-wing shaped leads containing a lead frame having two separate die pads where none of the pins are directly connected to either die pad, thereby maximizing the number of bond wires and package pins available not shorted to other pins.

Another embodiment of the present invention includes a semiconductor package with J-shaped or reverse-gull-wing shaped leads containing a lead frame where some number of adjacent pins not directly connected to the die pad are shorted together inside the package by a strip of metal, facilitating a greater number of bond wires from those pins.

Another embodiment of the present invention includes a semiconductor package with J-shaped or reverse-gull-wing shaped leads containing a lead frame where some of the pins not directly connected to the die pad have a T-shape (from a top view) such that the width of the lead inside the package is wider than the width of the lead external to the package, thereby accommodating more bond wires than the normal lead width would otherwise allow.

Another embodiment of the present invention includes a semiconductor package with J-shaped or reverse-gull-wing shaped leads containing a lead frame having a die pad where a semiconductor die is mounted onto said lead frame using a conductive layer of solder or conductive adhesive (e.g. silver filled epoxy), where the die pad and any pins connected to the die pad have substantially the same electrical potential as the back of semiconductor die or substrate. The die pad potential may typically be "ground" in an integrated circuit and may be the "drain" potential in a vertical device such as a vertical DMOS (whether of the planar or the trench gated variety of device). In a one embodiment a bond wire (or wires) attached to a bonding pad(s) on the die's top surface (electrically connected to the substantially the same potential as the substrate or die's backside) is bonded down to the die pad (i.e. a "down-bond') or bonded onto any pin attached to the die pad, thereby substantially shorting out the substrate's series resistance by the lower parallel resistance of the bond wire(s).

Another embodiment of the present invention includes a semiconductor package with J-shaped or reverse-gull-wing shaped leads containing a lead frame having a die pad where a semiconductor die is mounted onto said lead frame using an insulating layer adhesive (e.g. epoxy with no silver filling), where the die pad and any pins connected to the die pad have substantially a different electrical potential as the back of semiconductor die or substrate. In a preferred embodiment a bond wire attached to a bonding pad on the die's top surface (and not electrically connected to the substrate or backside potential) is bonded down to the die pad (i.e. a "down-bond') or bonded onto any pin attached to the die pad.

Another embodiment of the present invention includes a semiconductor package with J-shaped or reverse-gull-wing shaped leads containing a lead frame where at least two leads not connected to the die pad on opposite sides of the package are shorted together internally within the package by a continuous piece of copper of other conductive lead frame material.

Another embodiment of the present invention includes a semiconductor package with J-shaped or reverse-gull-wing shaped leads containing a lead frame where at least two leads not connected to the die pad on the same side of the package are shorted together internally within the package by a continuous piece of copper of other conductive lead frame material.

Another embodiment of the present invention includes a semiconductor package with J-shaped or reverse-gull-wing shaped leads containing a lead frame with one or two die pads where only one pin is directly connected to either die pad. In such an instance, the pin tied to the die pad improves the thermal resistance of the package (compared to having no pins tied to the die pad), but it does not provide for a larger are die pad or die.

Another embodiment of the present invention includes a semiconductor package with J-shaped or reverse-gull-wing shaped leads containing a lead frame where the die pad is directly connected to at least two leads on opposite sides of the package, and may by example include two or three leads on each of the opposite sides of the package tied to the die pad. In this embodiment, the die pad is enlarged to the minimum possible enclosure of the die pad by the plastic body.

Another embodiment of the present invention includes a semiconductor package with J-shaped or reverse-gull-wing shaped leads soldered to a PC board using conventional surface mount solder techniques, whereby the wetting and solder quality of the package's attachment to the PC board can be visually inspected on the sides of the package along where the leads touch the PC board's conductive traces.

The invention also includes an algorithm to generate the maximum possible die pad size (and therefore the maximum die size) given any desired or predetermined PC board footprint. The resulting die size will be larger produced by the algorithm will be larger than the conventional gull wing packaged die in virtually every form factor or shaped package.

These and other embodiments of the present invention, as well as its advantages and features, are described in more detail in conjunction with the text below and attached figures.

BRIEF DESCRIPTION OF THE DRAWINGS

FIG. 3C is a simplified plan view of another configuration of a conventional six-lead package, showing the lead frame, die, and bond wires within the package body.

FIG. 3D is a simplified plan view of yet another configuration of a conventional six-lead package showing the lead frame, die, and bond wires within the package body.

FIG. 7F is a simplified cross-sectional and plan view, including dimensions, of an embodiment of an eight-lead package in accordance with the present invention, having no leads connected to the die pad.

FIG. 7G is a simplified cross-sectional and plan view, including dimensions, of an embodiment of an alternative embodiment of an eight-lead package in accordance with the present invention, having leads directly connected to the die pad.

FIG. 8C is a simplified plan view of another embodiment of an eight-lead package in accordance with the present invention, showing a die, lead frame, and bond wires.

FIG. 8D is a simplified plan view of another embodiment of an eight-lead package in accordance with the present invention, showing a die, lead frame, and bond wires.

FIG. 14 shows a simplified perspective view of a number of package types in accordance with embodiments of the present invention.

FIGS. 16A–B are simplified plan views of embodiments of asymmetric multi-chip eight lead packages in accordance with the present invention.

FIG. 17 is a simplified cross sectional view of an embodiment of a package in accordance with the present invention, showing internal components of the package body.

DESCRIPTION OF THE SPECIFIC EMBODIMENTS

According to embodiments of the present invention, apparatuses and techniques for design of space-efficient packaging for microelectronic devices are provided. Packages in accordance with embodiments of the present invention allocate increased space in the package footprint to the packaged die, and in some embodiments offer improved the thermal resistance of the package, provide for a greater number of bond wires, offer improved bond wire angles and positioning, and accommodate both single and multiple die while maintaining a compact vertical profile for the package. A more comprehensive discussion of various aspects of the present invention is provided in detail below.

Embodiments of the present invention provide space-efficient package designs for low pin count, small footprint electronic devices as are typically utilized in portable applications. In one embodiment in accordance with the present invention, the present invention provides for space-efficient packaging design wherein exposed lead feet of the package fold back underneath the package and thereby allow a packaged die of greater width to occupy the peripheral footprint area consumed by laterally-extending lead feet of conventional (commonly called "gull wing") packages. Recesses in the exterior surface of the package body may receive the ends of the lead feet, thereby permitting a reduced vertical package profile. The present invention applies to small footprint packages that are often less than 7 millimeters in dimension and should not ordinarily be confused with larger high-pin count packages often used with memory chips used for computers, microprocessing integrated circuits, and the like. Such packages may include more than one hundred pins. Many analog and power packages have fewer than 24 pins, and generally between 3 and 8 pins. These and other details of the invention are provided throughout the present specification and more particularly below.

Here, we have provided many drawings and descriptions below to further describe these features. In a specific embodiment, the package design offers a larger package body for a given PC board footprint thereby accommodating a larger semiconductor die and also has a smaller profile, which is desirable for many mobile computing applications.

Figure 5A:
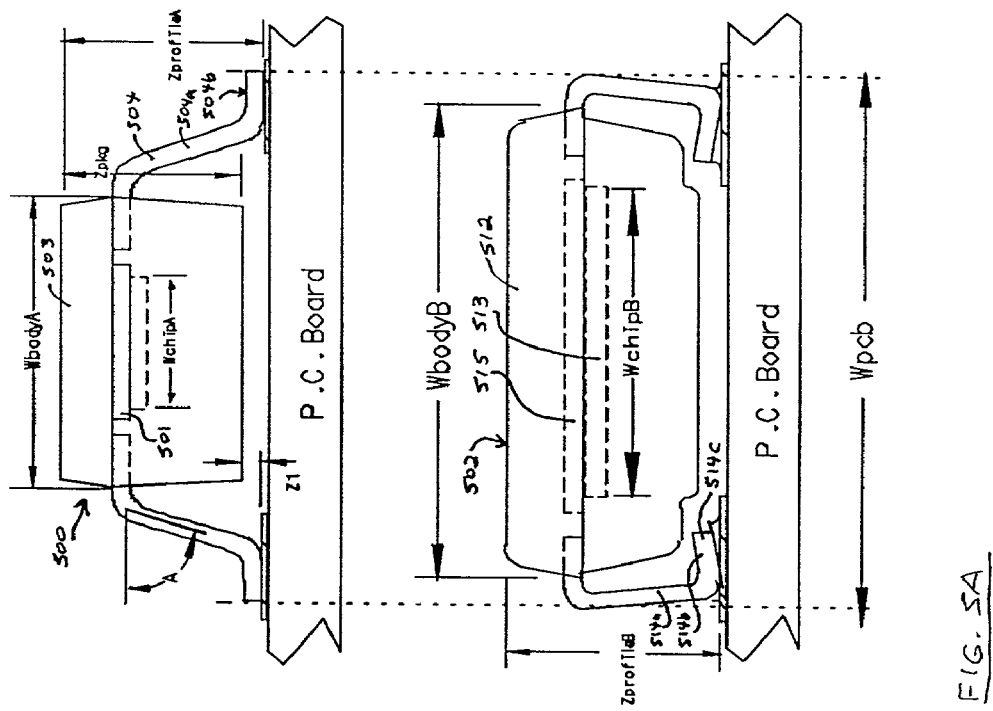
FIG. 5A is a cross-sectional view, including dimensions, of a conventional package versus an embodiment of a package (both mounted on a PC board) in accordance with the present invention.
Figure 4F:
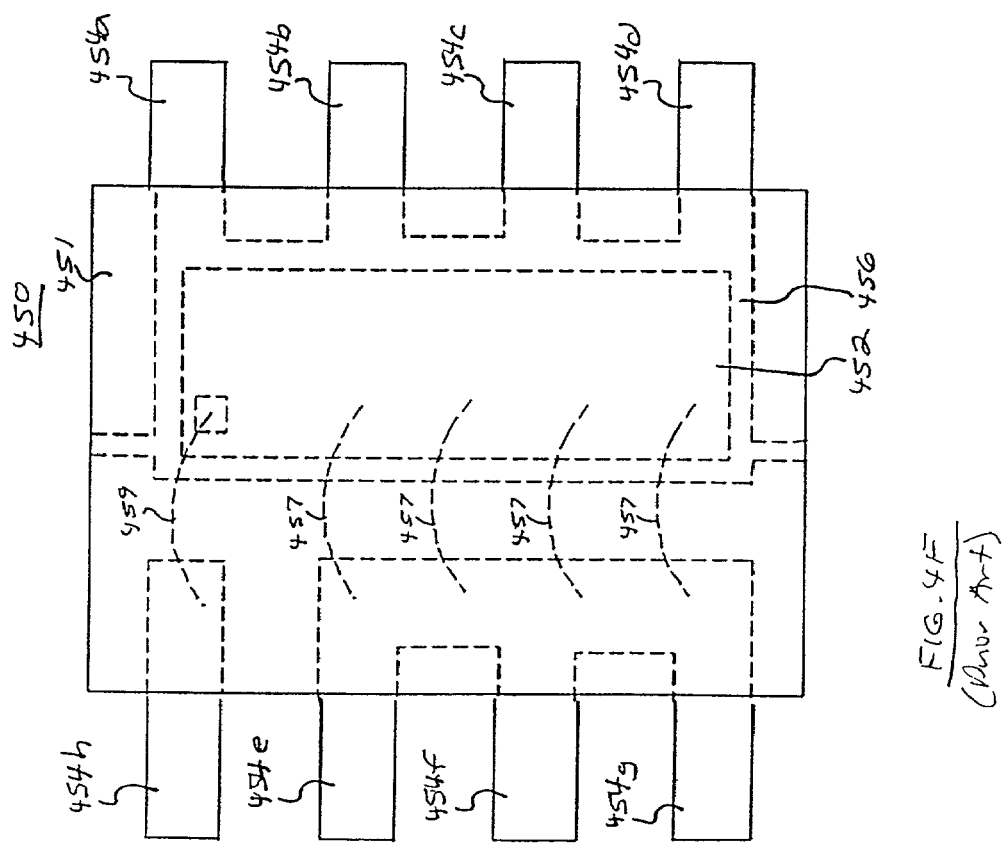
FIG. 4F is a simplified plan view of still another configuration of an eight-lead single-die-pad package showing the die, lead frame, and bond wires.

As shown, FIG. 5A is a cross-sectional view, including lateral and vertical dimensions, of conventional package 500 versus package 502 in accordance with one embodiment of the present invention. Package 502 includes package body 512 formed from an injection-molded compound. One type of suitable injection molded compounded useful for forming package 502 includes epoxy-based compounds such as the 6600CR or 6300H materials manufactured by Sumitomo Chemical Co. The choice of a particular injection molded material will of course vary depending upon the specific requirements of a particular packaging application.

Die 513 is in physical contact with die pad 515. Die pad 515 is typically part of a patterned lead frame that includes electrically conducting leads 514 extending outward from the side of package body 512. Leads are in electrical contact with die 513, either through bond wires or as integral to die pad 515. The lead frame may be formed from various types and thickness of materials that exhibit desirable physical characteristics such as malleability, and high electrical and thermal conductivity. Suitable lead materials for the lead frame include metals and alloys. A metal that may be used to form the lead frame is copper. An alloy that may be used to form the lead frame is Alloy 42. The choice of a particular material for a lead frame is of course dictated by the requirements of particular package application. The lead frame and leads are typically 5 mils thick (125 micrometers), much thinner than leads of packages enclosing the large-integration, high pin count devices.

Because of the space efficient design of package 502, a larger size die 513 and a larger sized package body 512 may occupy a footprint of the same size as conventional package 500. Specifically, package structure 502 shown in FIG. 5A features package body 512 of width (WbodyB) that is approximately 1.6× greater than width (WbodyA) of conventional package body 500. This broader package body width in turn encloses die 503 of width (WchipB) approximately 1.8× greater than the width (Wchip) of die 501 of conventional package 500.

The package design also has other desirable features. For example, the width of the chip relative to the width of the body is at a ratio of greater than about 60% and preferably greater than about 75%. Additionally, the ratio of width (WbodyB) of the package to width (Wpcb) of the package footprint is greater than about 90%.

The proportions of the package in accordance with an embodiment of the present invention is to be contrasted with those of a conventional package. Specifically, the conventional package shown in FIG. 5A would have a ratio of package body width:enclosed die width (WbodyA:Wchip)

of about 30% and a ratio of footprint width: package body width (Wpcb:WbodyA) of about 50%. Of course, the specific length and width of the package, and the respective ratios of lateral package dimensions, will depend upon the application.

FIG. 5A also shows vertical dimensions of the conventional and novel packages. Specifically, conventional package 500 exhibits a package body thickness of (Zpkg), a die thickness (Zchip), and an overall vertical profile (ZprofileA). Package 502 in accordance with an embodiment of the present invention exhibits the same package body thickness (Zpkg), the same die thickness (Zchip), and the same vertical profile (ZprofileB) as the conventional package, and thus the increased space efficiency just described is not achieved at the expense of a taller vertical package profile.

Other important distinctions between a conventional small footprint package and embodiments of packages in accordance with the present invention are shown in FIG. 5A. For example, external portion 514a of leads 514 projects from package body 512, and then turns sharply downward at a first angle A, preferably greater than 90° relative to the plane of the package body. While the angle A may be implemented over a range of angles and still achieve a die area to PC board footprint improvement, e.g. any angle over 75°, the benefit is greatest where angle A is at least 90° (i.e. perpendicular to the board) and preferably greater than 90 degrees. At an angle of between about 90° and 100° a good area utilization improvement results. For obtuse angles greater than this range the bending (forming) of lead 514 may become more difficult and even greater angles can force the plastic body size WbodyB to be reduced, offsetting any die area benefit.

In the illustration, lead foot 514b folds underneath the package body and is straight and inclined at a second angle B between about 1–8°, and preferably 6±2°, relative to the plane of underlying PC board. As a result of this configuration, external portion 514a of lead 514 is oriented at an angle of less than 90° relative to lead foot 514b.

By contrast, for the conventional package, exterior portion 504a of leads 504 projects from package body 503, and then eventually turns downward at a first angle A of less than 90° relative to the plane of the package body. Lead foot 504b therefore extends outward for a substantial distance, occupying at least a length Wfoot of a peripheral portion of the package footprint. This increase in the dimension of the periphery has a great influence on the overall wasted area, since any regular geometric object such as a rectangle, circle or square has its greatest area at its periphery. In contrast, the disclosed invention of package 502, offers two sharp contrasts to conventional package 500.

First, since the conventional package lead bends outward (i.e. has an angle less than 90° and typically as low as 7° to 80°), the area for the lead bend adds to the peripheral area of the package. Secondly, since the lead foot 504b of conventional package 500 points outward, rather than inward (as in the case of lead foot 514b in the disclosed package 502), it adds a dimension Wfoot to the periphery of the package. In the improved package 502, the lead folds in toward the package and therefore does not add peripheral area to the package.

In relative terms, peripheral area conserved by the inward bending lead foot is greater than the obtuse angle A design change. Together, these characteristics offer a substantial improvement in package body width WbodyB over the package body width of the conventional package WbodyA for the same PC board dimension Wpcb.

FIG. 5A also shows that end 514c of lead foot 514 is recessed within notch 516 in the side of package body 512. Notch 516 may have a depth of approximately ⅔ the lead thickness (Zlead), which is the same for the conventional package and the package in accordance with an embodiment of the present invention. Notch 516 of package 502 thus allows vertical clearance Z2 between package body 512 and the PC board to be smaller than vertical clearance Z1 between conventional package body and the PC board. This further reduces the vertical profile of a package in accordance with an embodiment of the present invention. While the notch may provide for added reduction in the package height ZprofileB, its key feature is to enable the inward bending lead foot without increasing the profile height to one greater than ZprofileA, the height of a conventional package. The notch 516 further enables lead foot 514b to angle upward relative to the PC board to improve the solder wetting during board assembly. A perfectly flat lead foot 514b is undesirable since it can cause the package to "float" atop the molten solder during wave soldering of the PC board.

Figure 5B:
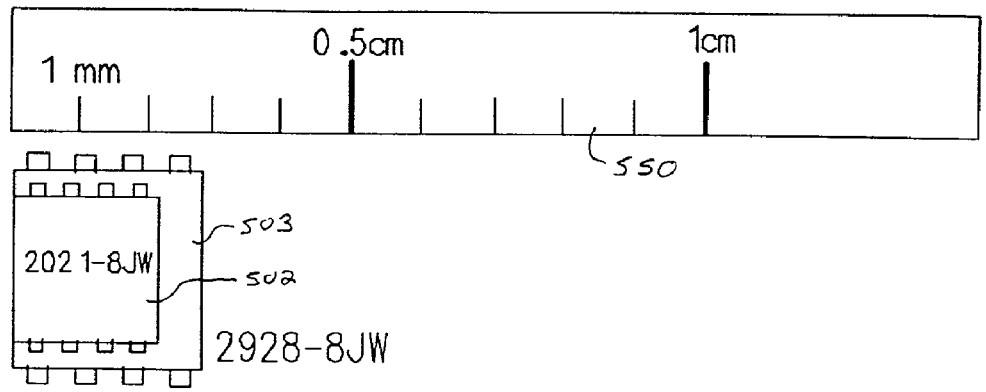
FIG. 5B is an enlarged scale view of an embodiment of a package in accordance with the present invention.

FIG. 5B is an enlarged scale view of an embodiment of a package in accordance with the present invention. Comparison of eight-lead packages 502 and 503 with ruler 550 reveals the small size of packages 502 and 503, which have dimensions on the order of mm. This is to be compared with larger-sized packages enclosing large-integration, high pin count devices such as microprocessors and memory chips having dimensions on the order of cm.

Figure 5C:
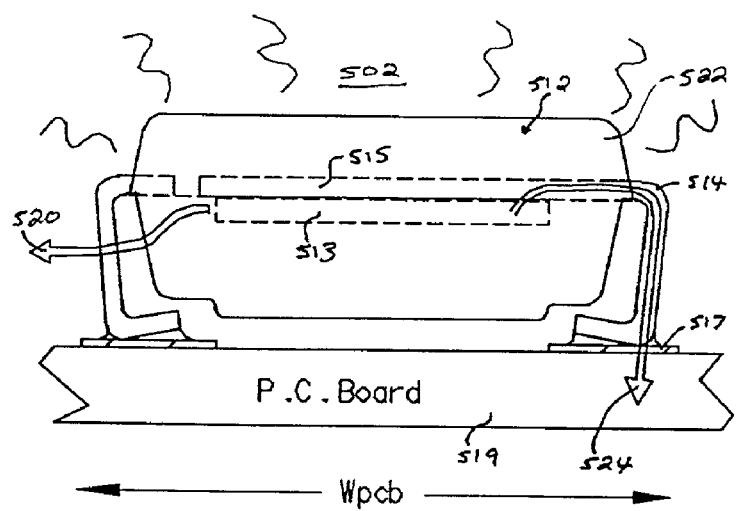
FIG. 5C shows a schematic view of the flow of thermal energy (heat) through the package shown in FIG. 5A.

FIG. 5C shows a schematic view of thermal energy flow through package 502. Specifically, operation of die 513 generates heat which be dissipated from package by one of two paths. Less than 10% of the generated heat flows along first heat flow path 520 out of die 513 directly into the surrounding injection molded plastic package material 522, from which the heat is then radiated into the environment. The remaining 90% of the heat generated by operating die 513 flows along second heat flow path 524 to die pad 515. This transferred heat then flows from die pad 515 to leads 514. Leads 514 draw the heat to the external environment and to traces 517 and underlying PC board 519, where the heat can be dissipated.

At each stage of this heat transfer process, a (thermal) resistance to the flow of heat associated with each package element (i.e. the semiconductor die, the injection molded plastic package material, the die pad and the leads) dictates the overall efficiency for conduction of energy away from the operating die. A lead frame featuring leads integral with the die pad substantially improves the flow of heat away from the die, since heat is not required to flow through the more thermally-resistive plastic package body material.

Figure 6A:
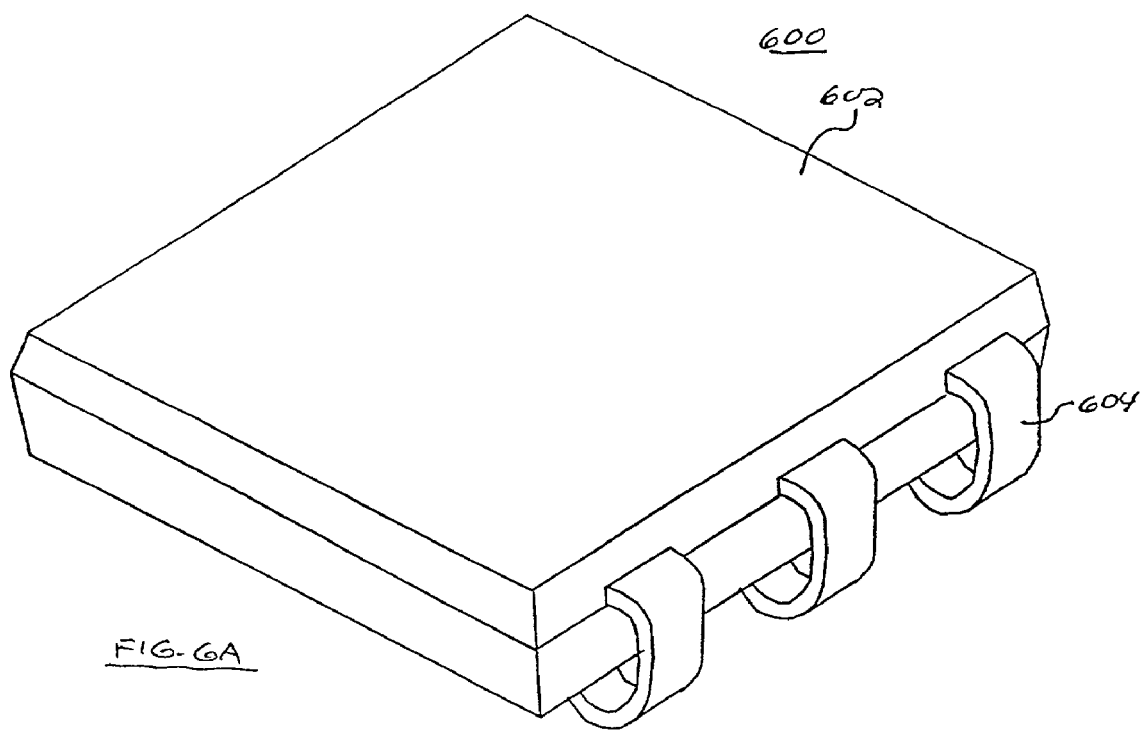
FIG. 6A is a simplified perspective view of one embodiment of a six lead package in accordance with an embodiment of the present invention.
Figure 6B:
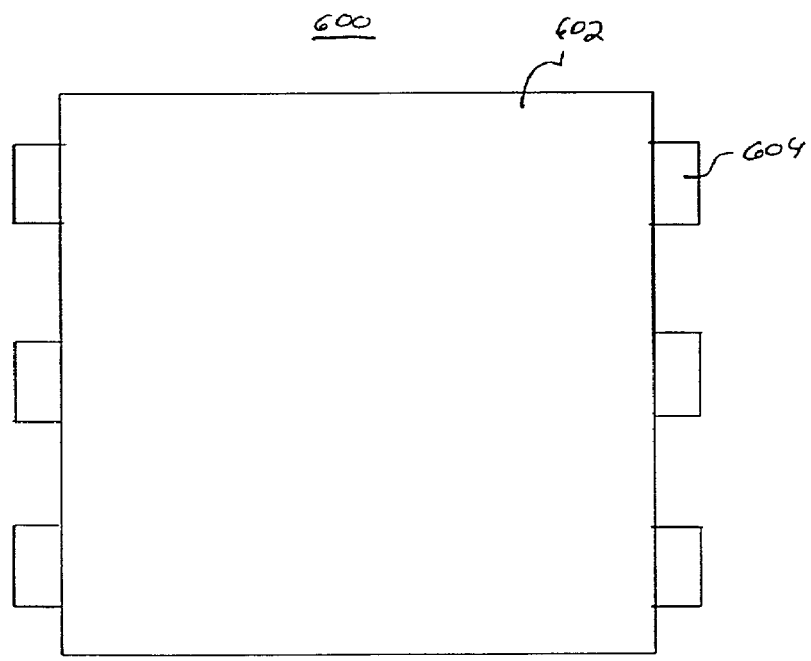
FIG. 6B is a simplified plan view of the six lead package shown in FIG. 6A.
Figure 6C:
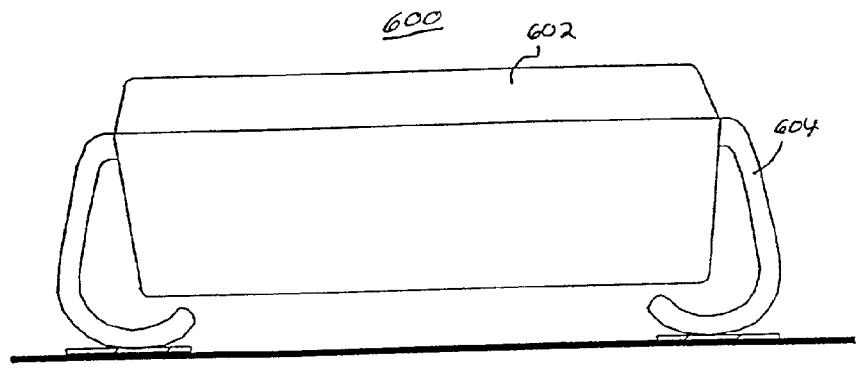
FIG. 6C is a simplified end view of the six lead package shown in FIG. 6B.
Figure 6D:
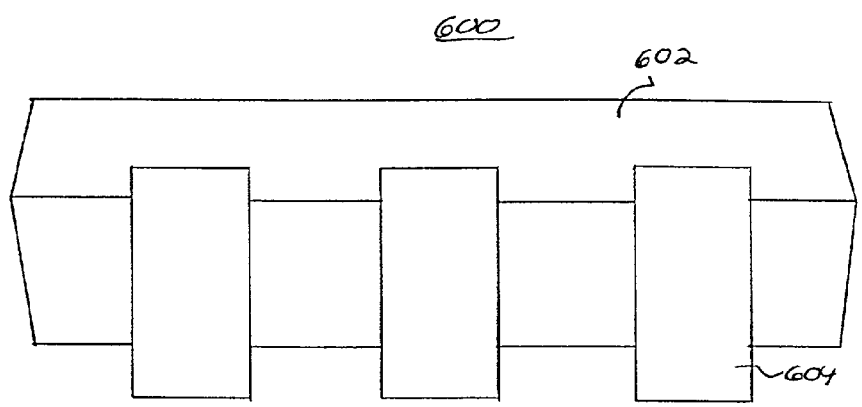
FIG. 6D is a simplified edge view of the six lead package shown in FIG. 6A.

FIG. 6A is a simplified perspective view of one embodiment of a six lead package in accordance with an embodiment of the present invention. Package 600 includes package body 602 and exposed lead portions 604. FIG. 6B is a simplified plan view of the package shown in FIG. 6A. FIG. 6C is a simplified end view of the package shown in FIG. 6A, illustrating the rounded J-shape of exposed lead portions 604. FIG. 6D is a simplified edge view of the six lead package shown in FIG. 6A.

Figure 6E:
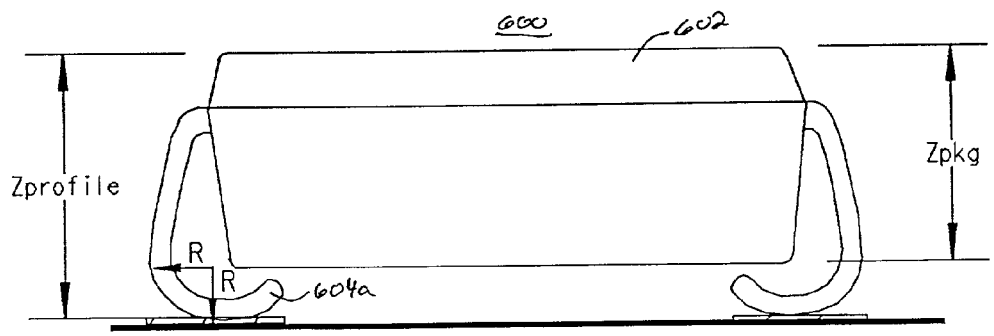
FIG. 6E is a simplified cross-sectional view of another embodiment of a six lead package in accordance with the present invention.

FIG. 6E is a end view showing vertical dimensions of the package of FIG. 6A. Package 600 of FIG. 6E features J-shaped lead feet 604a that fold back underneath package body 602 in a rounded profile exhibiting a radius of curvature R. The package of FIG. 6E thus accomplishes space efficient design by freeing up peripheral regions of the package footprint formerly occupied by the lead feet to instead be occupied by a packaged die of greater width.

FIGS. 6A–6E have described and illustrated embodiments of the present invention in connection with a package having lead feet of a J-shape having a uniform radius of curvature. While this lead shape is useful for allocating maximum space efficiency to the package, it does serve to slightly raise the vertical profile of the package. While a J-shaped lead may be combined with the notch in the package to reduce impact on the package profile height, it is generally more difficult to control the curvature (and hence the height) of a semicircular bend than it is to perform a simple L-shaped bend as shown in FIG. 5A using lead forming (bending) machines in high volume production. The vertical portion of the lead exhibits an angle A less than 90°, which does not improve die-to-board area utilization.

Figure 6F:
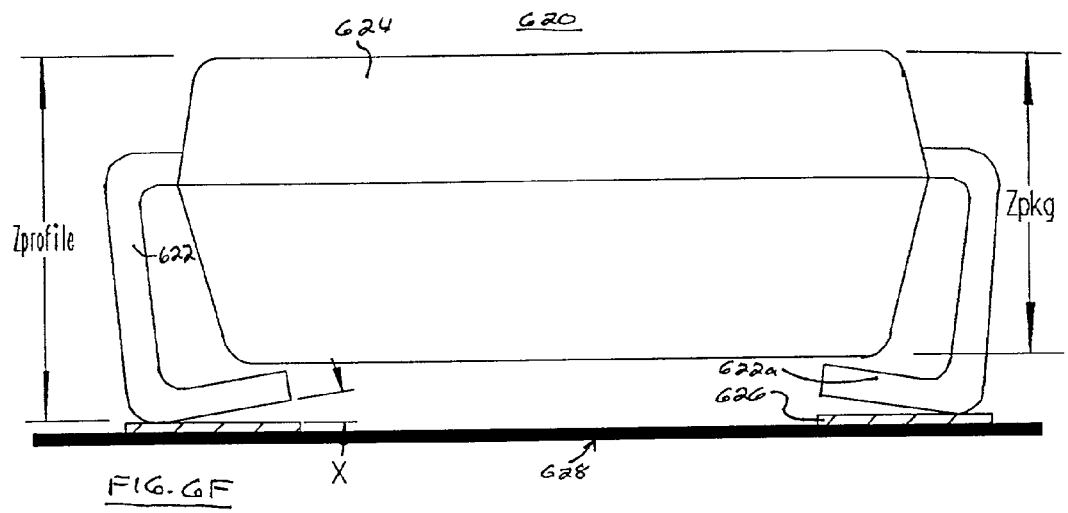
FIG. 6F is a simplified end view of still another embodiment of a six lead package in accordance with the present invention.

Accordingly, FIG. 6F is a simplified end view of an alternative embodiment of a six lead package in accordance with the present invention, wherein leads 622 projecting from package body 624 assume a reverse gull wing shape, such that lead feet 622a fold back underneath package body 624 at an angle of incline of between about 4–8° relative to trace 626 of PC board 628. As a result of the angular, rather than rounded, shape of the lead foot, package 620 of FIG. 6F exhibits a vertical profile (Zprofile) that is shorter than that of a package of equivalent body thickness employing a rounded J-shaped lead foot (Zprofile of FIG. 6E.)

Figure 6G:
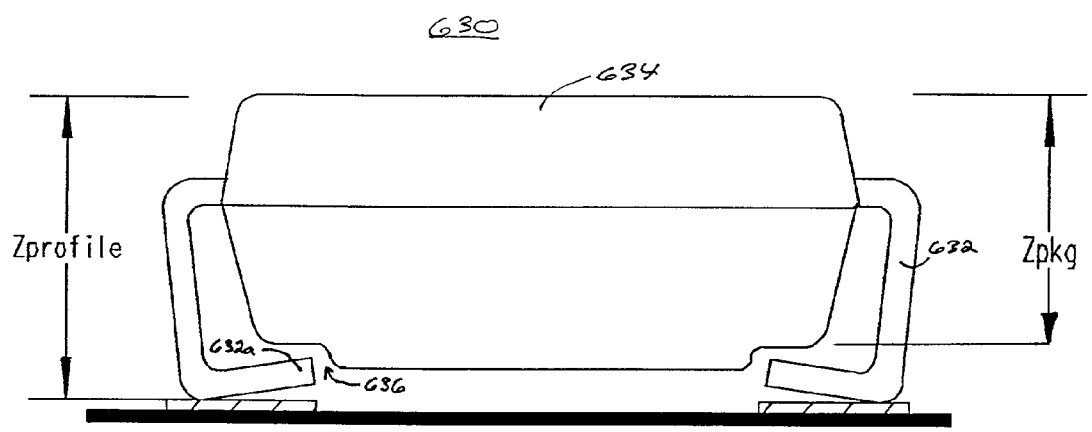
FIG. 6G is a simplified plan view of an alternative embodiment of a six lead package in accordance with the present invention.

FIG. 6G is a simplified cross-sectional view of yet another embodiment of a six lead package in accordance with the present invention that further reduces the vertical profile of the package. Like the package of FIG. 6F, package 630 of FIG. 6G includes leads 632 projecting from package body 634 and folding back underneath package body 634 in a reverse gull wing shape. However, package body 634 of package 630 further includes notches 636 configured to receive ends 632a of lead feet 632. Providing recesses 636 to receive ends 632a of lead feet 632 effectively lowers the clearance between the bottom of the package and the PC board, and hence reduces the vertical profile (Zprofile) offered by package 630 even in relation to the vertical profile (Zprofile) of the package of FIG. 6F. In one embodiment of the present invention the notches may accommodate a length of an lead foot end equal to ⅔ the thickness of the lead.

In general, the notched reverse-gull-wing-shaped lead and package implementation shown in FIG. 6G is preferred over that of the notch-less package of FIG. 6F or the true J-shaped lead of FIG. 6C. All three packages 6C, 6F, and 6G are inventive variants of a family of packages in accordance with the present invention. Because the package body overlaps the lead foot of its lead, and because of the substantially right angle or obtuse angle A of the major lead bend, the package in accordance with embodiments of the present invention should be considered as exhibiting a "widebody" profile, and can be considered a "JW" type package.

The package design also has other desirable features. For example, the ratio of the thickness of the package body relative to the overall vertical profile (Zpkg:ZprofileB) is greater than about 90% and preferably greater than about 95%, comparable with conventional package heights and larger than the ratios for an embodiment of a space-efficient package in accordance with an embodiment of the present invention which utilize J-shaped and reverse-gull-wing-shaped leads.

Figure 6H:
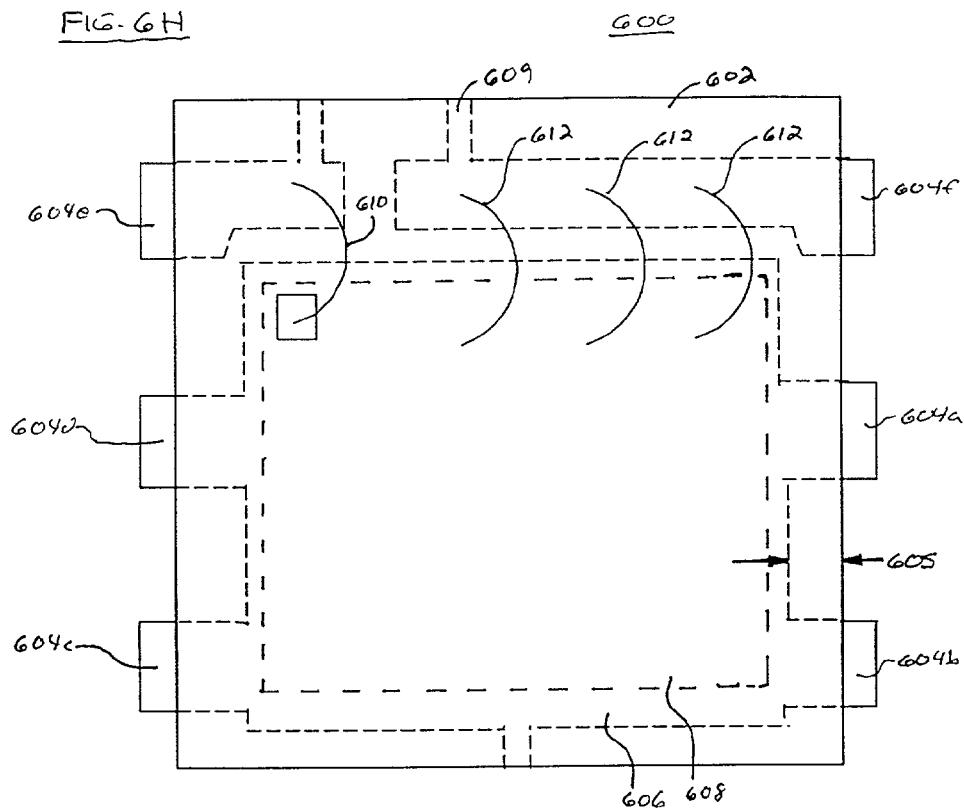
FIG. 6H is a simplified plan view of the six lead package of FIG. 6A showing a die, lead frame, and bond wires.

FIG. 6H is a simplified plan view of the six lead package of FIG. 6A, showing by example internal components of package body 602. Package 600 includes four leads 604*a–d* integral with die pad 606. Since leads 604*a–d* are tied, i.e. electrically shorted, to the die pad, leads 604*a–d* can be considered as one electrical pin but as four thermal pins. One remaining lead 604*e* is connected to die 608 through bond wire 610. The other remaining lead 604*f* features a lengthy internal portion that is connected to die 608 through bond wires 612. Together the four-shorted leads and the two independent leads comprise a three electrical pin, four thermal pin package. The package and lead frame shown in FIG. 6H offers a number of important advantages.

Figure 3A:
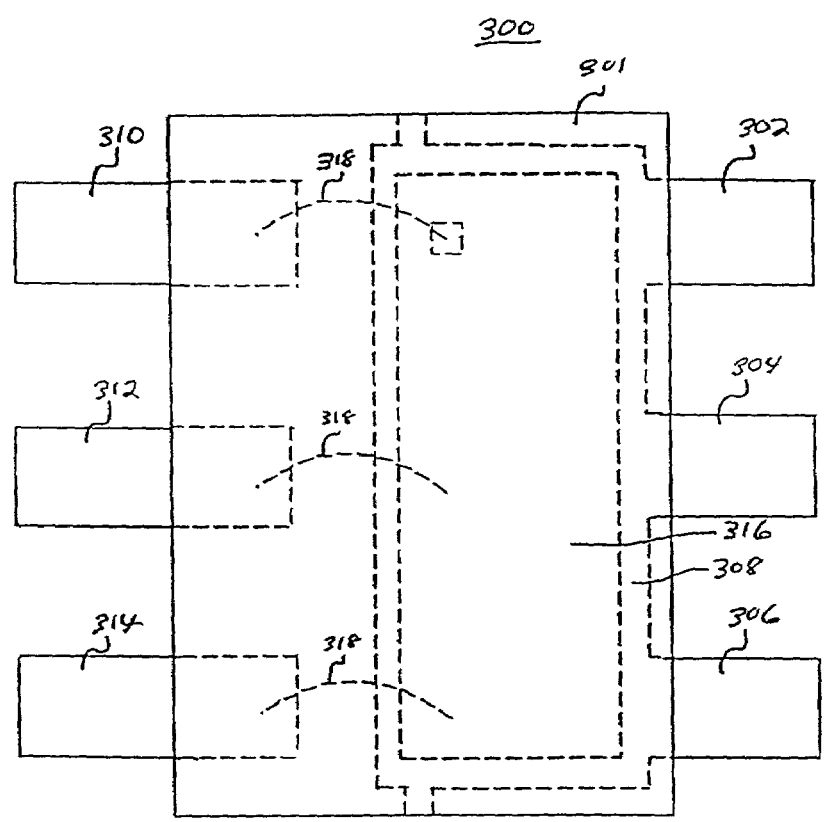
FIG. 3A is a simplified plan view of another configuration of a conventional six-lead package.
Figure 3B:
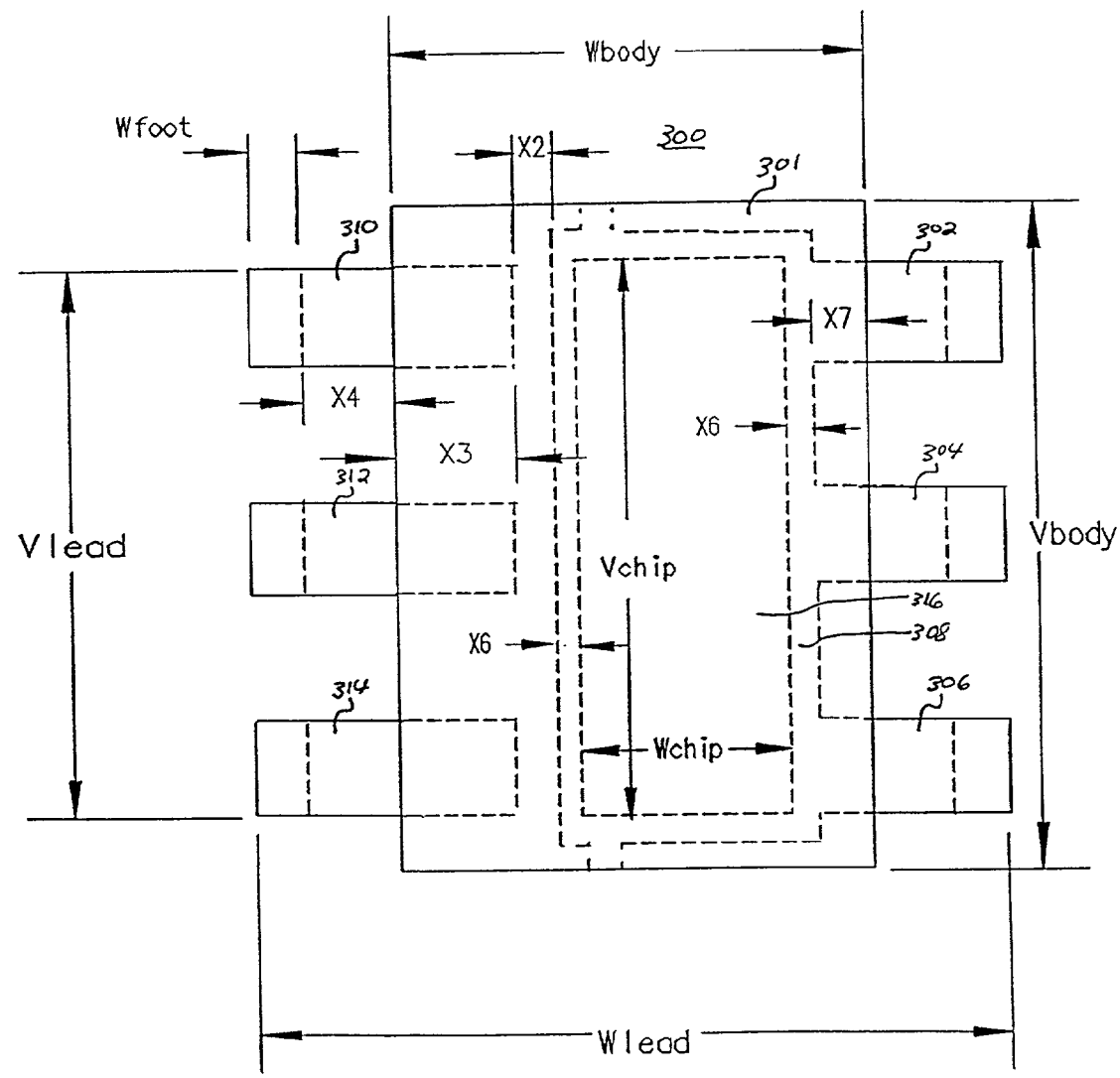
FIG. 3B is a simplified plan view, including dimensions, of the conventional six-lead package shown in FIG. 3A.
Figure 3E:
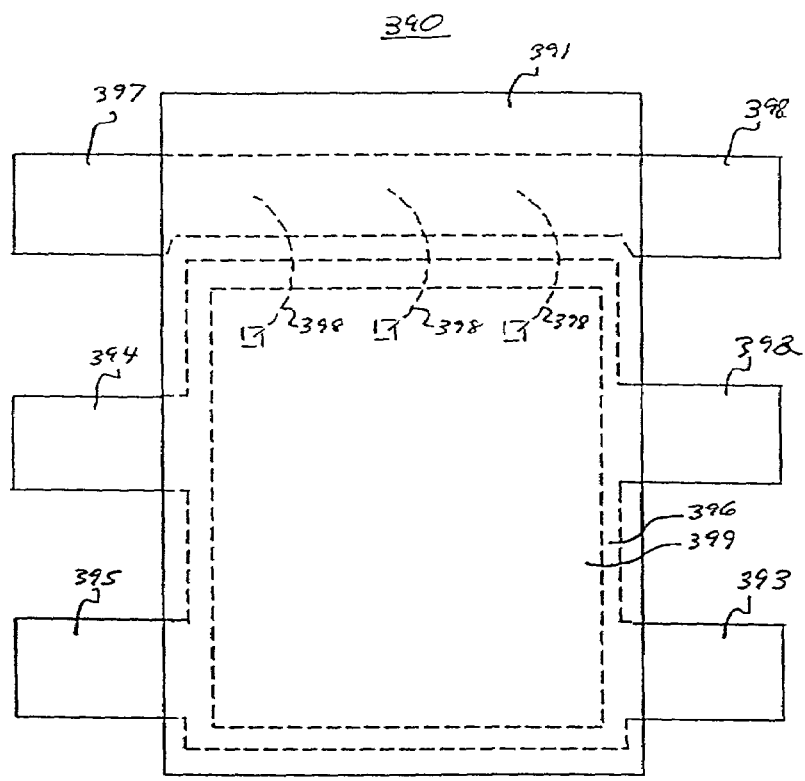
FIG. 3E is a simplified plan view of still another configuration of a conventional six-lead package showing the lead frame, die, and bond wires within the package body.
Figure 4A:
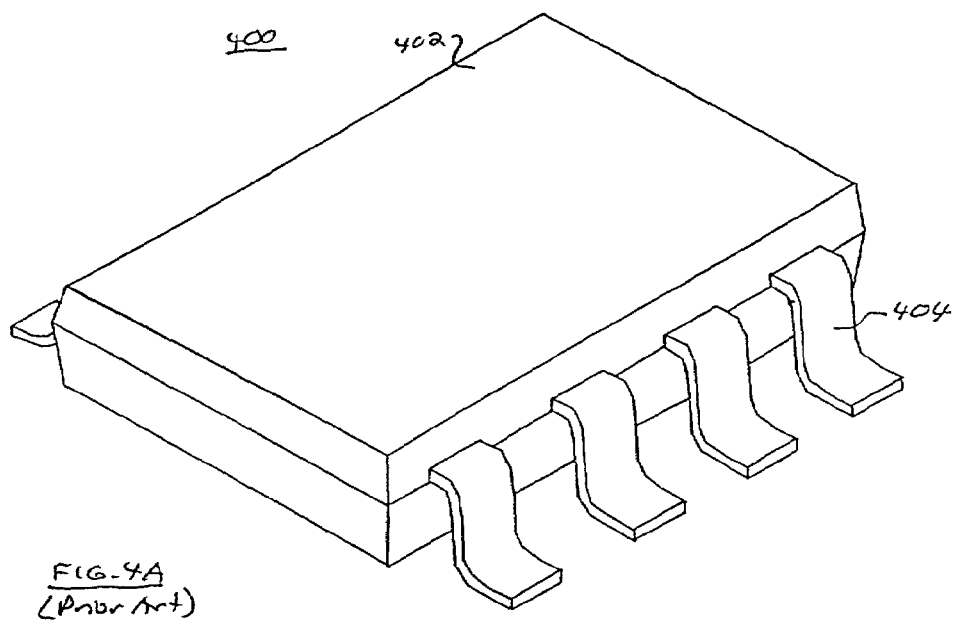
FIG. 4A is a simplified perspective view of a conventional eight lead package.
Figure 4B:
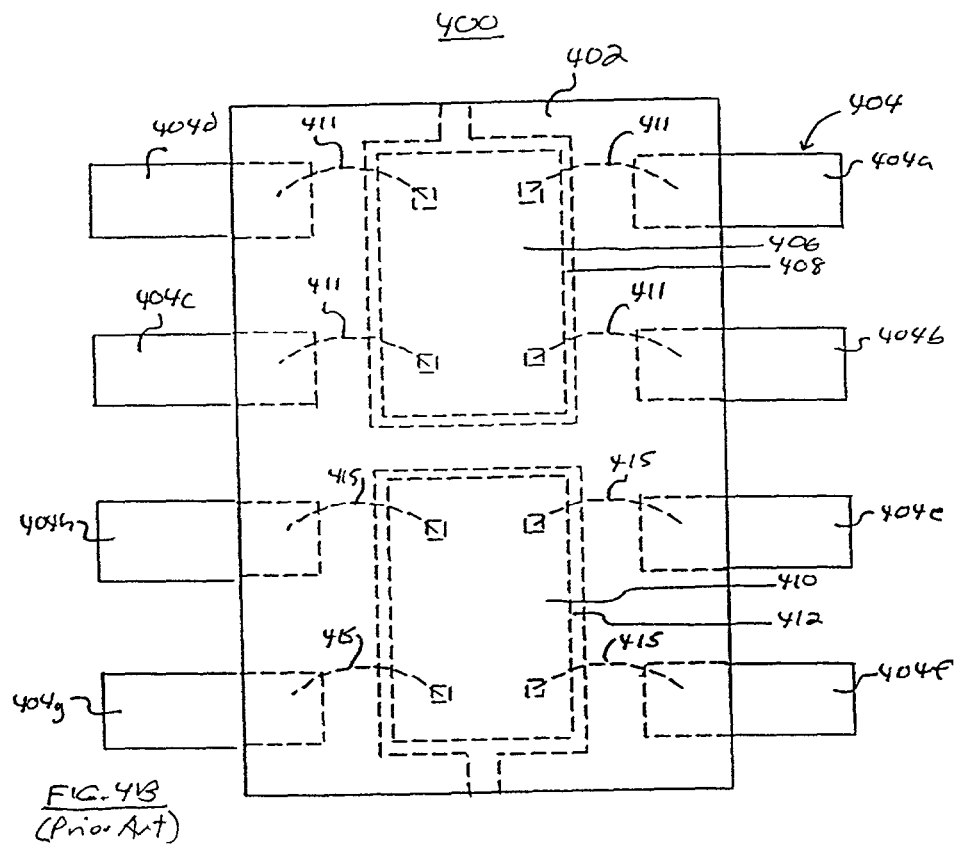
FIG. 4B is a simplified plan view of the eight lead dual-die-pad package of FIG. 4A, showing the die, lead frame, and bond wires.
Figure 4C:
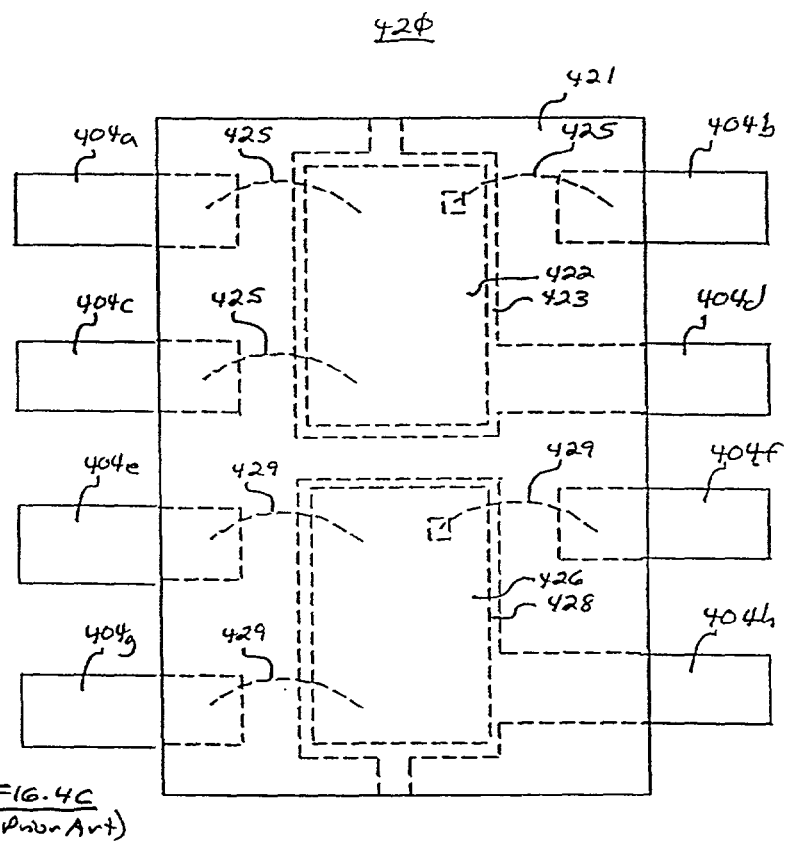
FIG. 4C is a simplified plan view of another configuration of an eight-lead dual-die-pad package showing the dies, lead frame, and bond wires.
Figure 4D:
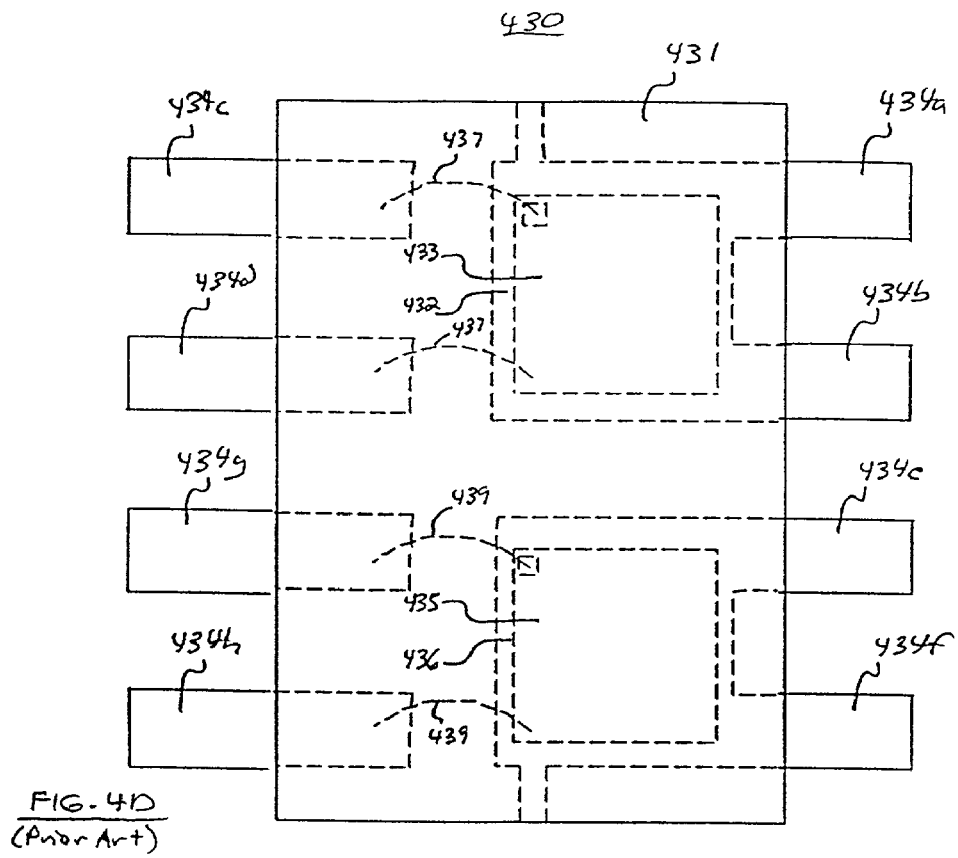
FIG. 4D is a simplified plan view of another configuration of an eight-lead dual-die-pad package showing the dies, lead frame, and bond wires.
Figure 4E:
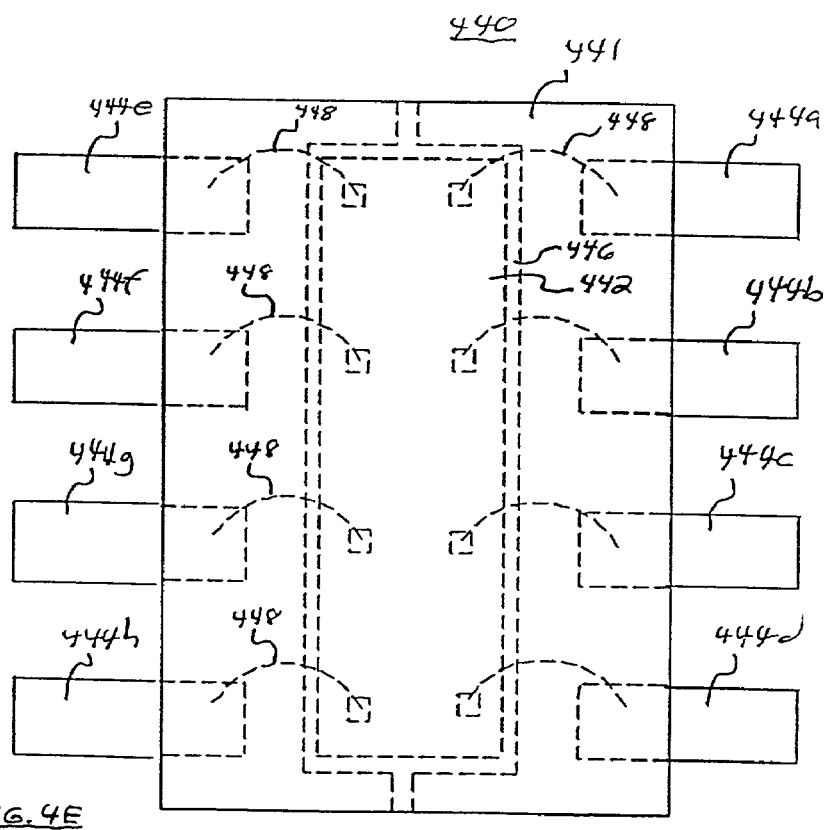
FIG. 4E is a simplified plan view of yet another configuration of an eight-lead single-die-pad package showing the die, lead frame, and bond wires.

One advantage of package 600 is its efficient utilization of the available footprint area, such that die 608 occupies 40% of the footprint. This figure is a considerable improvement over the 13% footprint utilization associated with the conventional package shown in FIG. 3D. One reason for the larger die size and improved area efficiency is a consequence of the basic "JW-type package concept", namely the combination of J-lead shaped or reverse-gull-wing-shaped leads combined with a wide body plastic molding results in more useable area for a given a board space.

Another reason for the large die area is the die pad 606 can be expanded to within distance 605 of the edge of plastic body 602. Distance 605 is a significantly smaller dimension than in the conventional prior art package of FIG. 2C, where the enclosure distance of the die pad 106 inset from the plastic body edge 102 is the sum of X2 and X3. The prior art dimension X2+X3 may be 2 to 3 times that of the value of the minimum allowable enclosure dimension 605. Dimension 605 is reduced in the package of FIG. 6H because the integral nature of leads 604*a–d* provides enhanced physical strength that stabilizes the leads against movement. Because leads 604*a–d* are secured to the package by virtue of their integral formation with die pad 606, a reduced thickness of encapsulating package body material is required to prevent the leads from being accidentally dislodged, and the die pad can be set back a shorter distance within the edge of the package, allowing more area to be allocated to the die pad and the die.

The benefit in increased die pad area attributable to integral leads is experienced two-fold in the package/leadframe configuration shown in FIG. 6H. Specifically, integral leads are present on both sides of the package (leads 604*a–b* on one side, and leads 604*c–d* on the opposite side). The die pad is also extended along the package length to within a minimum allowed dimension of the internal portion of leads 604*e* and 604*f*.

Leads 604*a–d* integral with die pad 606 also offer the advantage of enhanced heat dissipation from die 608. Specifically, because of the large lead surface area in contact between die pad 606 and integral leads 604*a–d*, these leads can successfully conduct large amounts of heat away from the operating die through the die pad and out of the package. External portions of the integral leads may then permit excess heat to be dissipated into the environment, and especially to be conducted into the printed circuit board where the heat can be spread over a larger area and subsequently radiated or drawn by convection into the air.

Still another advantage of the package shown in FIG. 6H is the low resistance electrical contact between elongated lead 604*f* and die 608 that is possible due to the greater number of bond wires 612 connected to the die and because those bond wires can be distributed along the length of die 608 offering more uniform current conduction in and along the die surface In the drawing shown lead 604*e* is shown to be short in comparison to the length of 604*f*, if for example, the lead were used for a low current signal such as a gate connection to a power MOSFET. If it is necessary to more evenly distributed wire bonds from both leads 604e and 604f, the leads can be of more equivalent length to facilitate the best tradeoff in bond wire length and position.

The internal portion of long lead 604f is stabilized during manufacturing by tie lead 609 that remains connected to the lead frame up until and during plastic molding. After molding when the leads 604a–f are cut from the lead frame, tie lead 609 is trimmed to a minimum possible dimension so as to not substantially protrude from the plastic body of the package.

Figure 1A:
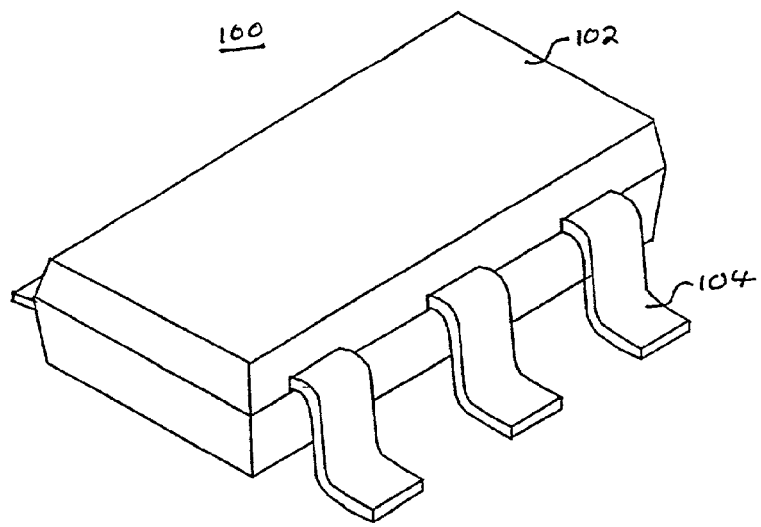
FIG. 1A is a simplified perspective view of a conventional six-lead package.
Figure 1B:
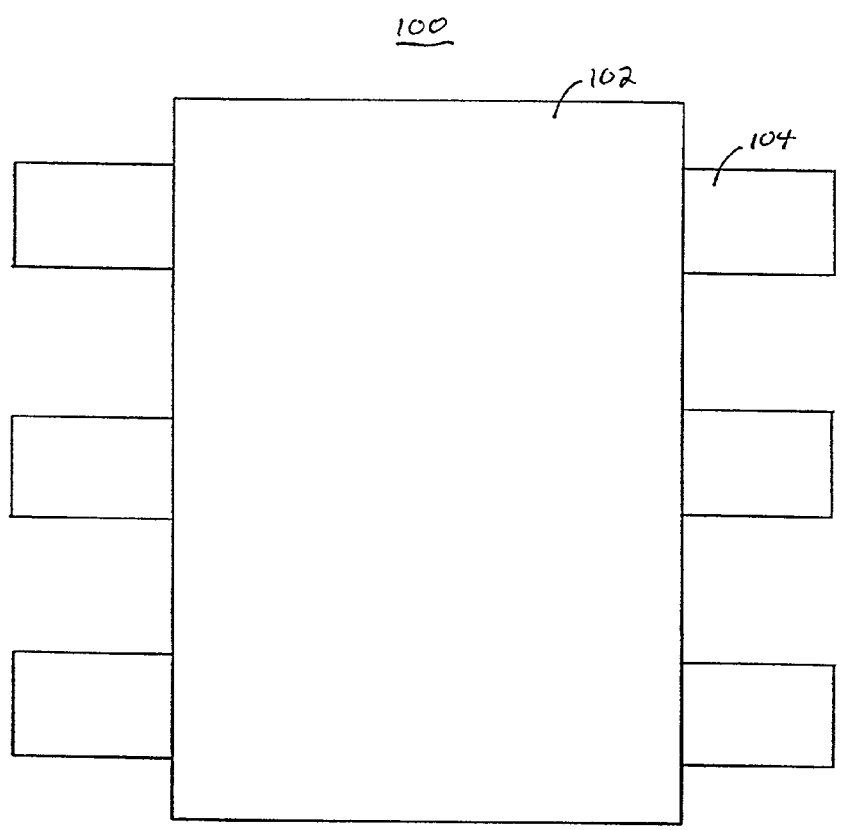
FIG. 1B is a simplified plan view of the conventional six-lead package of FIG. 1A.
Figure 1C:
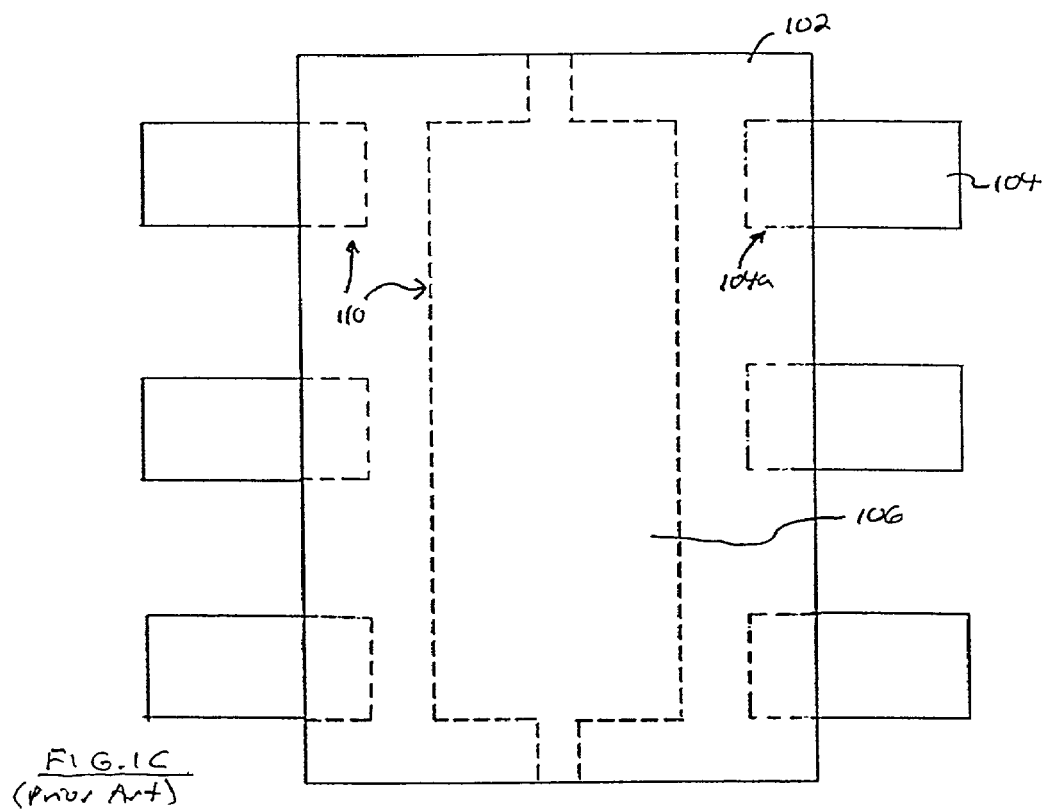
FIG. 1C is a simplified plan view of the conventional six-lead package of FIG. 1A showing the lead frame within the package body.
Figure 1D:
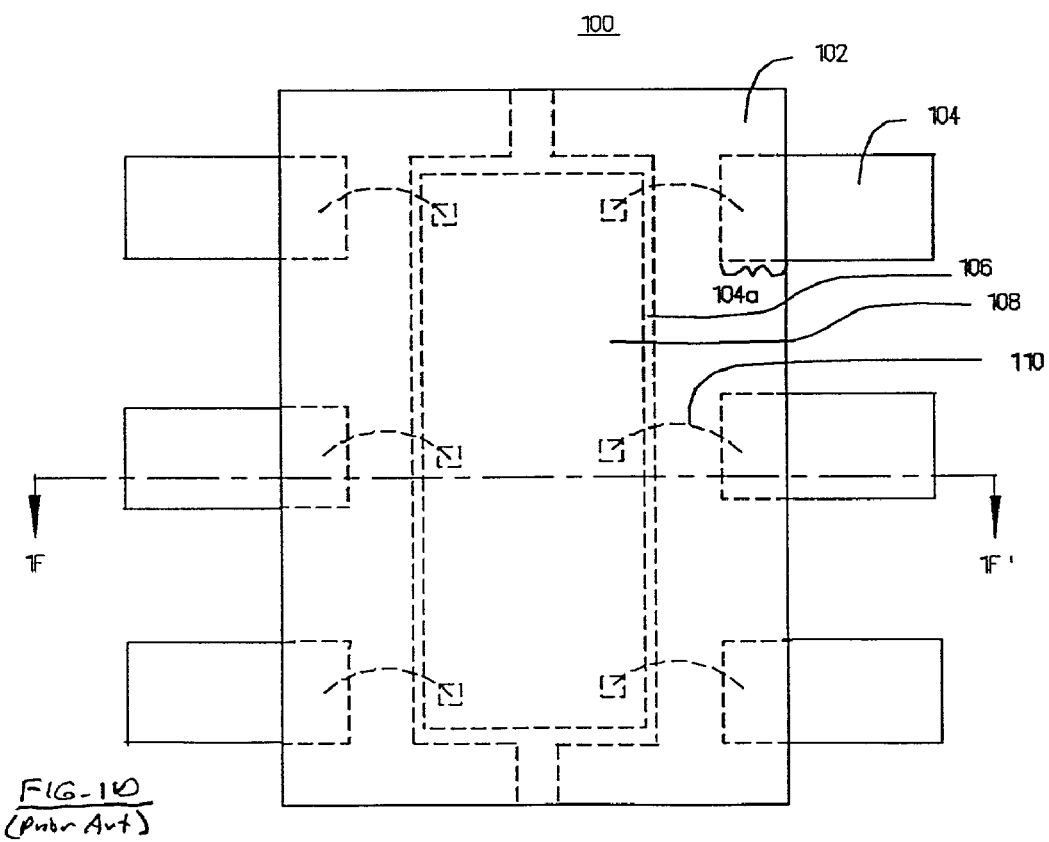
FIG. 1D is a simplified plan view of the conventional six-lead package of FIG. 1A showing the lead frame, die, and bond wires within the package body.
Figure 1E:
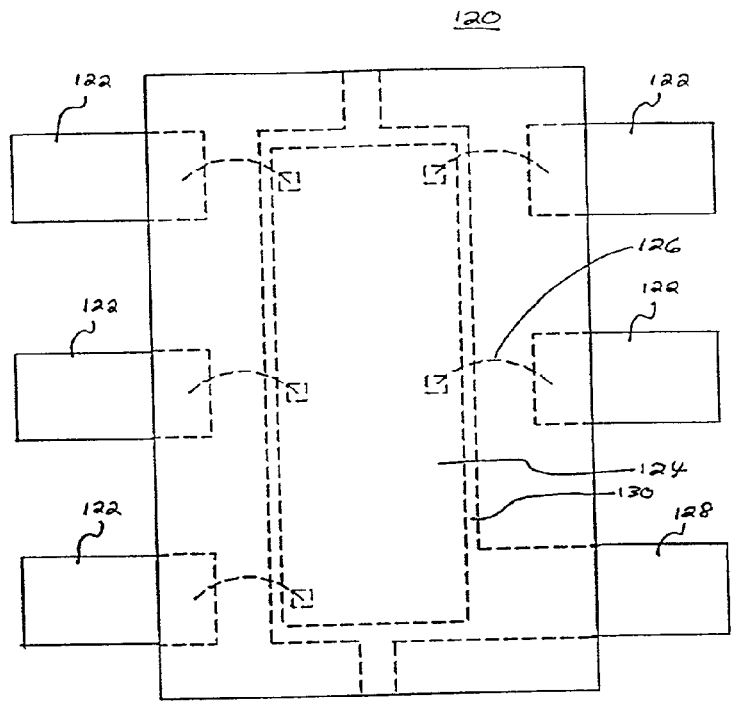
FIG. 1E is a simplified plan view of an alternative configuration of a conventional six-lead package.
Figure 1F:
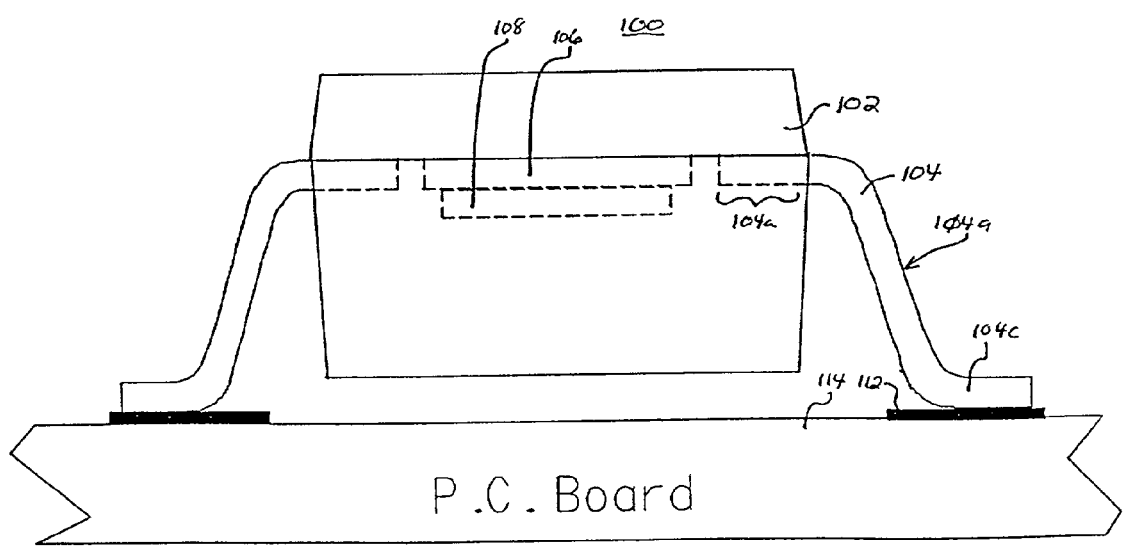
FIG. 1F shows a simplified cross-sectional view of the conventional six-lead package of FIG. 1A.
Figure 6I:
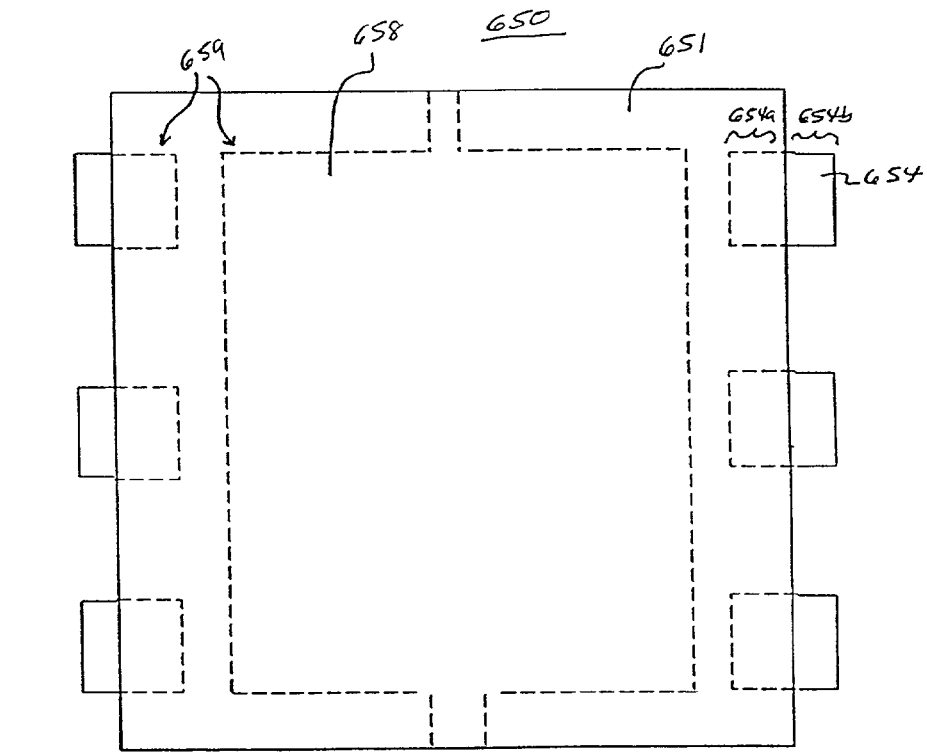
FIG. 6I is a simplified plan view of another alternative embodiment of a six lead package in accordance with the present invention.

FIG. 6I is a simplified plan view of an alternative embodiment of a six lead package in accordance with the present invention, showing internal components of package body 651. Package 650 includes lead frame 659 including die pad 658 and leads 654 including internal portion 654a within body 651 and external portion 654b projecting from body 651. Because of the space-efficient layout of package 650, die pad 650 occupies a considerably greater width than the die pad of the conventional package shown in FIG. 1C. Specifically, the larger die size and improved area efficiency of this package-lead-frame combination is a consequence of the basic "JW-type package concept", namely the combination of J-lead shaped or reverse-gull-wing-shaped leads combined with a wide body plastic molding results in more useable area for a given a board space.

Specifically, package 650 does not offer an enhanced die size due to die pad connected leads. In this package, none of the leads are connected to the die pad. Accordingly package 650 can be considered a six-electrical pin, zero-thermal pin package. So while package 650 offers advantages over prior art conventional packages in its maximum die size, it does not offer a low thermal resistance solution for packages offering six distinct electrical connections of differing signals or potentials. In this lead frame design, any one or even two leads may be connected to the die pad to improve the thermal resistance of the package at the expense of reducing the number of distinct electrical connections. However, die pad area remains fixed at a width determined by its narrowest portion, and the die pad size of FIG. 6I can be modified without changing, or improving, the usable die pad area. Variants include packages with six electrical pins and zero thermal pins (FIG. 6I), six electrical pins and 1 thermal pin (FIG. 6J), and five electrical pins and 2 thermal pins (FIG. 6K).

Packages having a greater number of thermal pins, i.e. leads integral to the die pad, offer improved thermal resistance but with less flexibility in wire bonding angles and configurations. Certain leads in such packages may be shorted electrically to the die pad and possibly to one another.

Figure 6J:
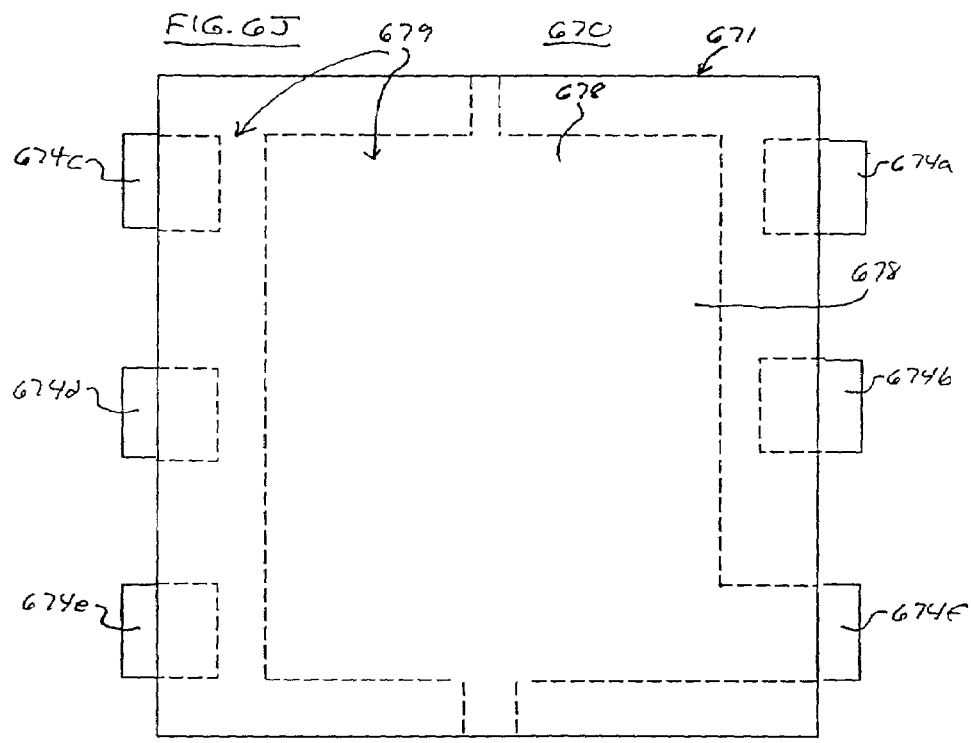
FIG. 6J is a simplified plan view of another alternative embodiment of a six lead package in accordance with the present invention.

FIG. 6J is a simplified plan view of an alternative embodiment of a six lead package in accordance with the present invention, showing internal components of package body 671. Package 670 includes lead frame 679 including die pad 678 and leads 674a–f including electrically independent leads 674a–e and die pad connected lead 674f. The die pad connected lead improves the ability of the package to conduct heat and thereby lower its thermal resistance. Because of the space-efficient layout of package 670, die pad 678 occupies a considerably greater width than the die pad of the conventional package shown in FIG. 1C, but has a usable die pad area no larger than package 650 of FIG. 6I. Specifically, package 670 does not offer an enhanced die size due to die pad connected leads. Its larger die size and improved area efficiency is a consequence of the basic "JW-type package concept", namely the combination of J-lead shaped or reverse-gull-wing-shaped leads combined with a wide body plastic molding results in more useable area for a given a board space.

Figure 6K:
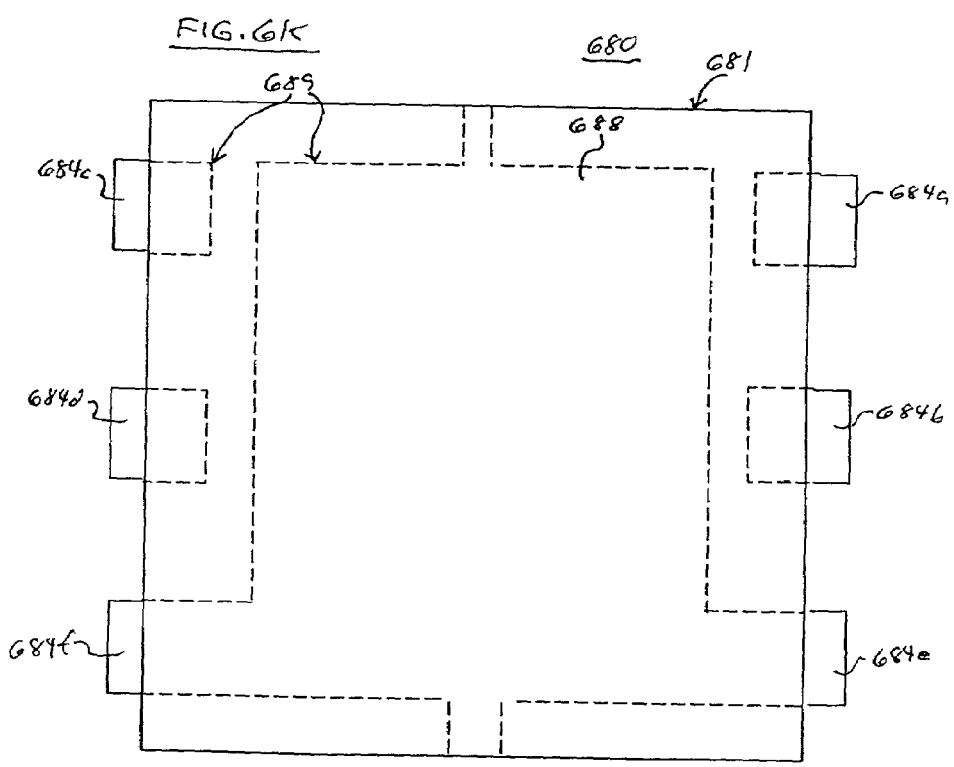
FIG. 6K is a simplified plan view of another alternative embodiment of a six lead package in accordance with the present invention.

FIG. 6K is a simplified plan view of an alternative embodiment of a six lead package in accordance with the present invention, showing internal components of package body 681. Package 680 includes lead frame 689 including die pad 688 and leads 684a–f including electrically independent leads 684a–d and die pad connected leads 684e–f. The die pad connected leads improves the ability of the package to conduct heat and thereby lower its thermal resistance. Because of the space-efficient layout of package 680, die pad 688 occupies a considerably greater width than the conventional package shown in FIG. 1C, but has a usable die pad area no larger than package 650 of FIG. 6I. Specifically, package 680 does not offer an enhanced die size due to die pad connected leads. Its larger die size and improved area efficiency is a consequence of the basic "JW-type package concept", namely the combination of J-lead shaped or reverse-gull-wing-shaped leads combined with a wide body plastic molding results in more useable area for a given a board space. For packages having four electrical pins in a six-pin package, other lead frame configurations such as the example shown in FIG. 6L are advantageous.

Figure 6L:
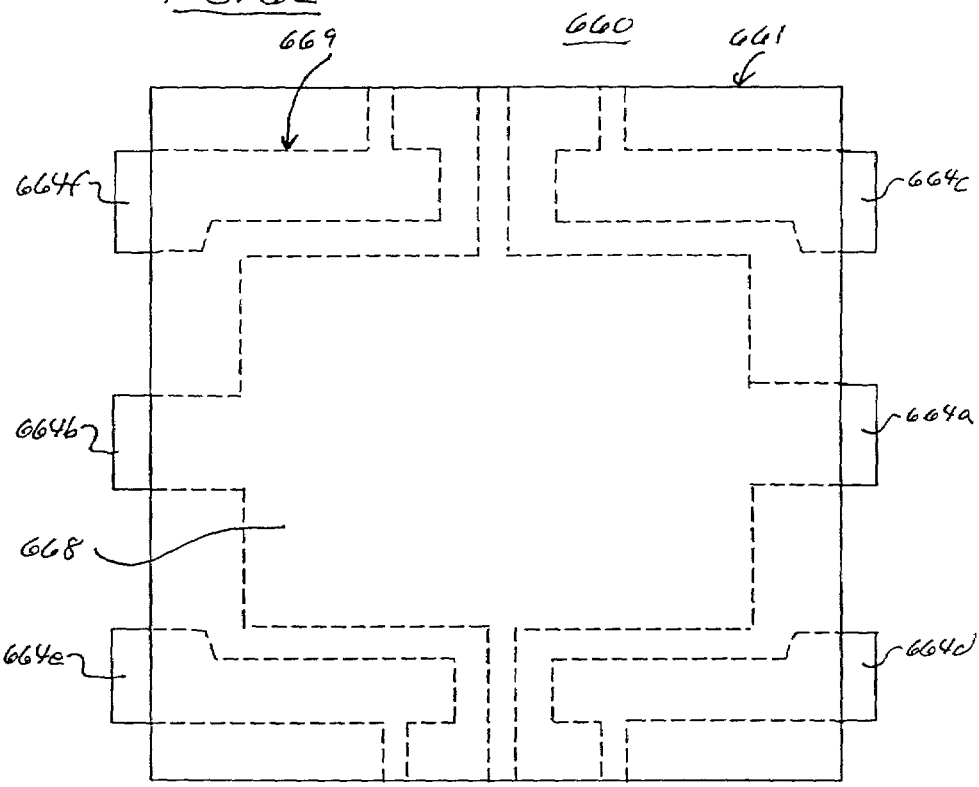
FIG. 6L is a simplified plan view of another alternative embodiment of a six lead package in accordance with the present invention.

FIG. 6L is a simplified plan view of another alternative embodiment of a six lead package in accordance with the present invention, sharing internal components of package body 661. Package 660 includes lead frame 669 comprising leads 664a–b integral with die pad 668. Leads 664c–f are not integral to die pad 668, i.e. not electrically shorted through the lead frame. Integral leads 664a–b confer the advantage of greater dissipation and conduction of heat from die pad 668 to the PC board and ambient, while the space-efficient design permits die pad 668 to be substantially widened, but only in the lateral extent (i.e. along the length of the package) to within a minimum allowable spacing from the internal portion of leads 664c–d on one end and to within a minimum spacing from the internal portion of leads 664e–f on the other end of the package.

Package 660 offers excellent bonding locations and angles since leads are available on all four corners of the die pad. For a single die to benefit from a further expanded die and die pad area, at least three pins must be die-pad connected in a six lead package.

Figure 6M:
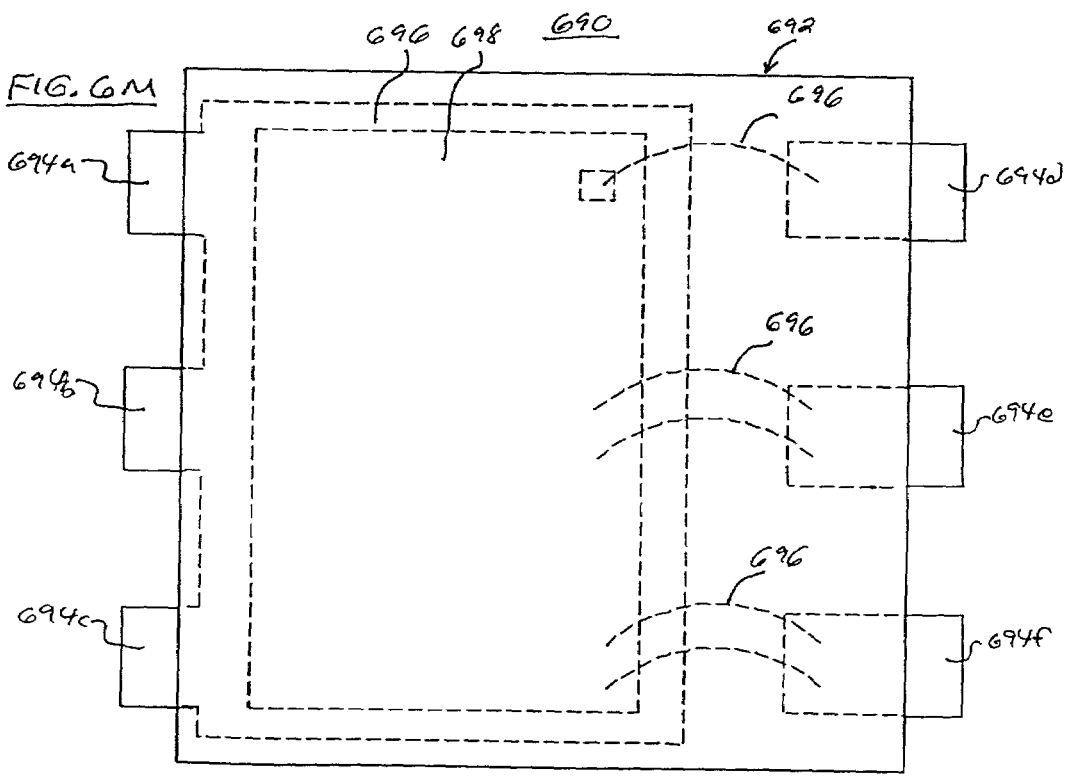
FIG. 6M is a simplified plan view of another alternative embodiment of a six lead package in accordance with the present invention.

FIG. 6M is a simplified plan view of the six lead package of FIG. 6A, showing by example internal components of package body 692. Package 690 includes three leads 694a–c integral with die pad 696. Since leads 694a–c are tied, i.e. electrically shorted, to the die pad they can be considered as one electrical pin but as four thermal pins. The three remaining leads 694d–f are connected to die 698 through bond wire 696. Together the three-shorted leads and the three independent leads comprise a four electrical pin, three thermal pin package. The package and lead frame shown in FIG. 6M offers a number of important advantages.

One advantage of package 690 is its efficient utilization of the available footprint area, such that die 698 occupies 40% of the footprint. This figure is a considerable improvement over the 13% footprint utilization associated with the conventional package shown in FIG. 3D. One reason for the larger die size and improved area efficiency is a consequence of the basic "JW-type package concept", namely the combination of J-lead shaped or reverse-gull-wing-shaped leads combined with a wide body plastic molding results in more useable area for a given a board space.

Figure 2A:
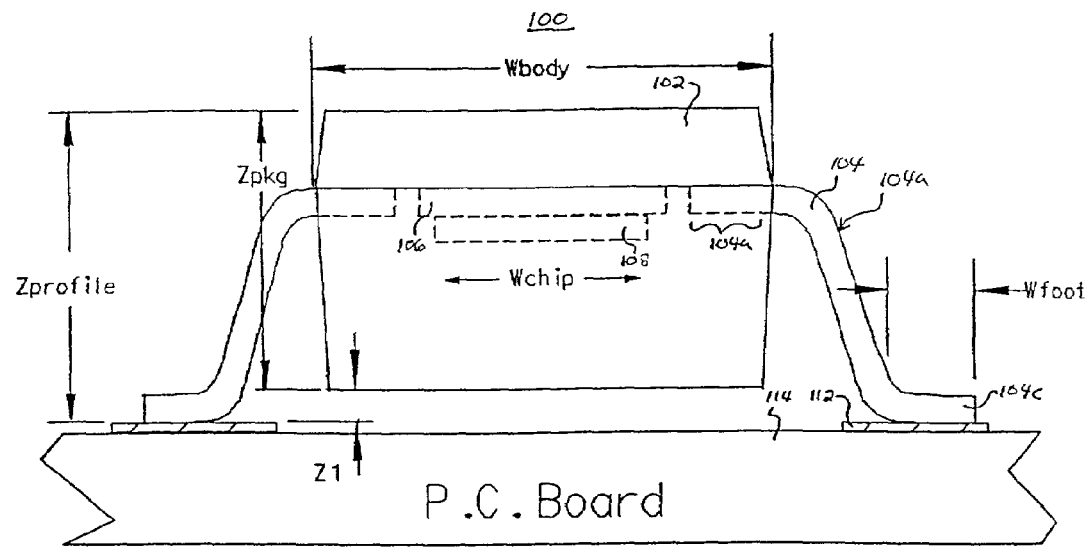
FIG. 2A shows a simplified cross-sectional view, including dimensions, of the conventional six-lead package of FIG. 1A positioned on a PC board.
Figure 2B:
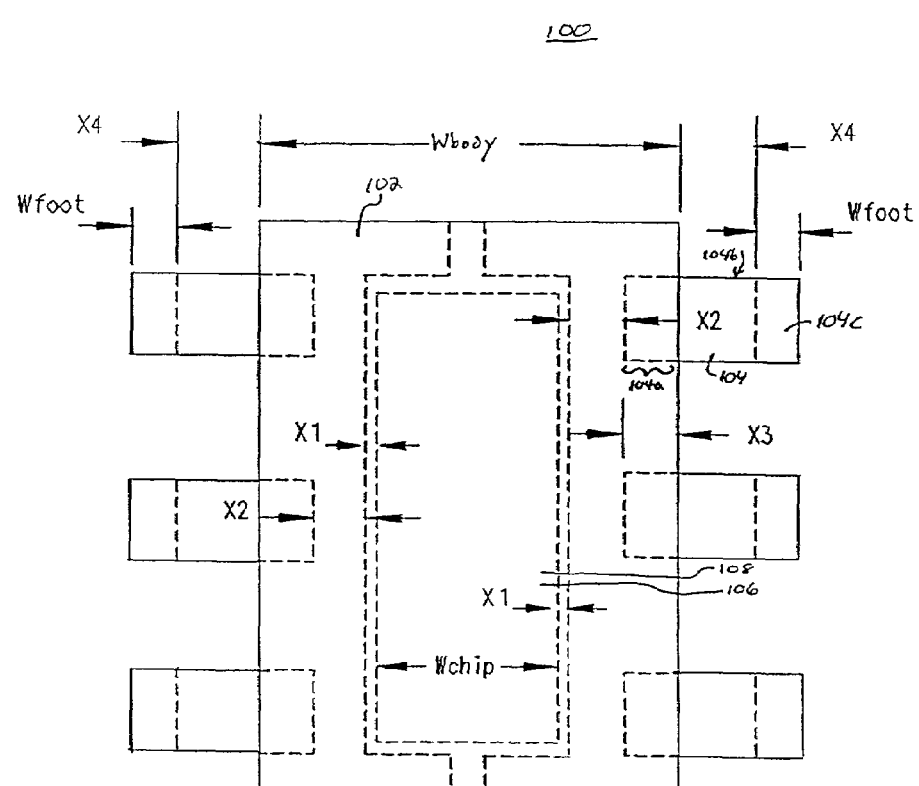
FIG. 2B shows a simplified plan view, including dimensions, of the conventional six-lead package of FIG. 1A.
Figure 2C:
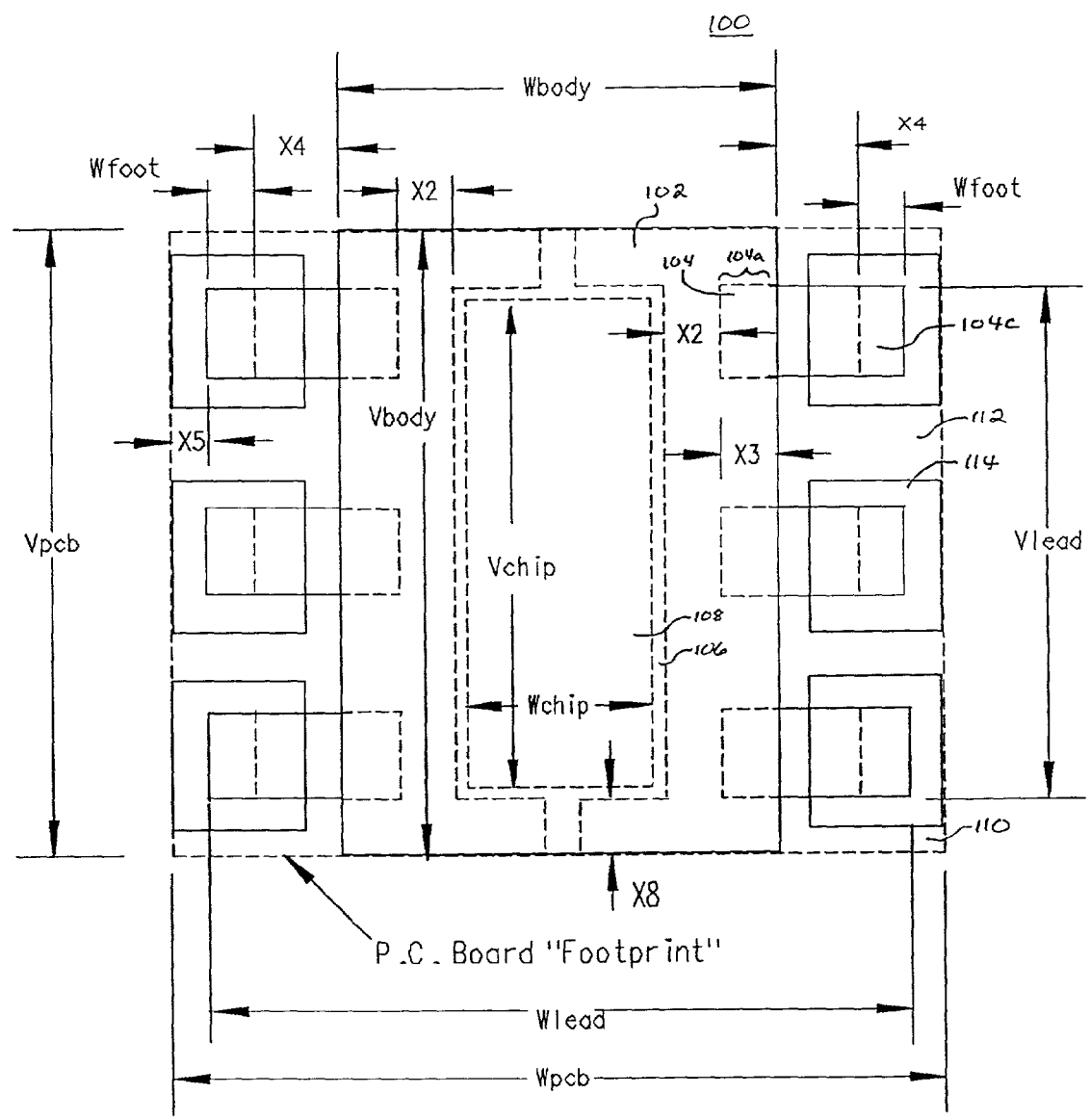
FIG. 2C shows a simplified plan view, including dimensions, of the conventional six-lead package of FIG. 1A positioned on a PC board.

Another reason for the large die area is the die pad 696 can be expanded to within a distance 695 of plastic body 692 (a significantly smaller dimension than in the conventional prior art package of FIG. 2C, where the enclosure distance of the die pad 106 inset from the plastic body edge 102 is the sum of X2 and X3). The prior art dimension X2+X3 may be 2 to 3 times that of the value of the minimum allowable enclosure dimension 695. The dimension 695 can be smaller since the pins 694a–c are stabilized against movement by being secured to the die pad 696 and suffer no risk of accidentally being pulled out of the plastic body during manufacturing, handling, or PC board assembly.

Leads 694a–c integral with die pad 696 also offer the advantage of enhanced heat dissipation from die 698. Specifically, because of the large lead surface area in contact between die pad 696 and integral leads 694a–c, these leads can successfully conduct large amounts of heat away from the operating die through the die pad and out of the package. External portions of the integral leads may then permit excess heat to be dissipated into the environment, and especially to be conducted into the printed circuit board where the heat can be spread over a larger area and subsequently radiated or drawn by convection into the air.

Still another advantage of the package shown in FIG. 6M is the low resistance electrical contact due to the greater number of bond wires 696 connected to the die and leads 694d–e and because those bond wires can be distributed along the length of die 698 offering more uniform current conduction in and along the die surface. The usable area to bond wires to this leads can be further improved by expanding the lead width inside the package body 692 (forming one or more T-shaped leads) or by connecting the two leads with a metal strap thereby shorting the two (or three) independent leads. TABLE 4 below compares a number of attributes of the packages shown in FIGS. 6H–6M.

table, the term "package body length" is the length of the plastic package's boy on the sides of the package where the leads are located.

TABLE 5

| PACKAGE NAME | PACKAGE BODY LENGTH | LEAD PITCH | LEAD WIDTH | NO. OF LEADS |
|---|---|---|---|---|
| SC70JW-4 | 20 mm | 1 mm | 0.35 mm | 4 |
| SC70JW-6 | 20 mm | 0.65 mm | 0.3 mm | 6 |
| SC70JW-8 | 20 mm | 0.5 mm | 0.25 mm | 8 |
| TSOP8-JW | 29.5 mm | 1 mm | 0.35 mm | 8 |
| TSOP10-JW | 29.5 mm | 0.65 mm | 0.3 mm | 10 |
| TSOP12-JW | 29.5 mm | 0.5 mm | 0.25 mm | 12 |

Package 700 includes reverse gull wing shaped leads 704 projecting from package body 702 and extending into notch 701. Four leads projecting from the opposite side of package 702 are not visible in FIG. 7A. In an alternative embodiment, however, the leads 704 could be J-shaped, and the plastic body 702 may or may not include notch 701.

Figure 7A:
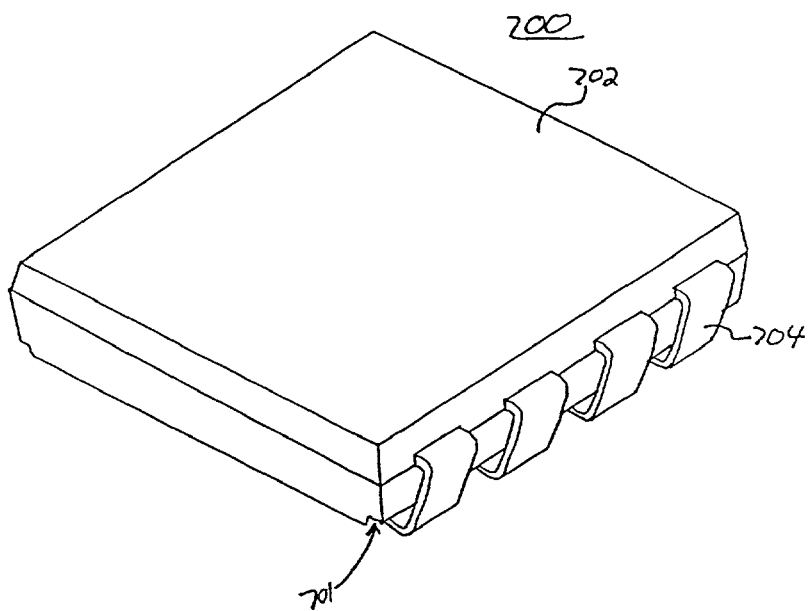
FIG. 7A is a simplified perspective view of an embodiment of an eight lead package in accordance with the present invention.
Figure 7B:
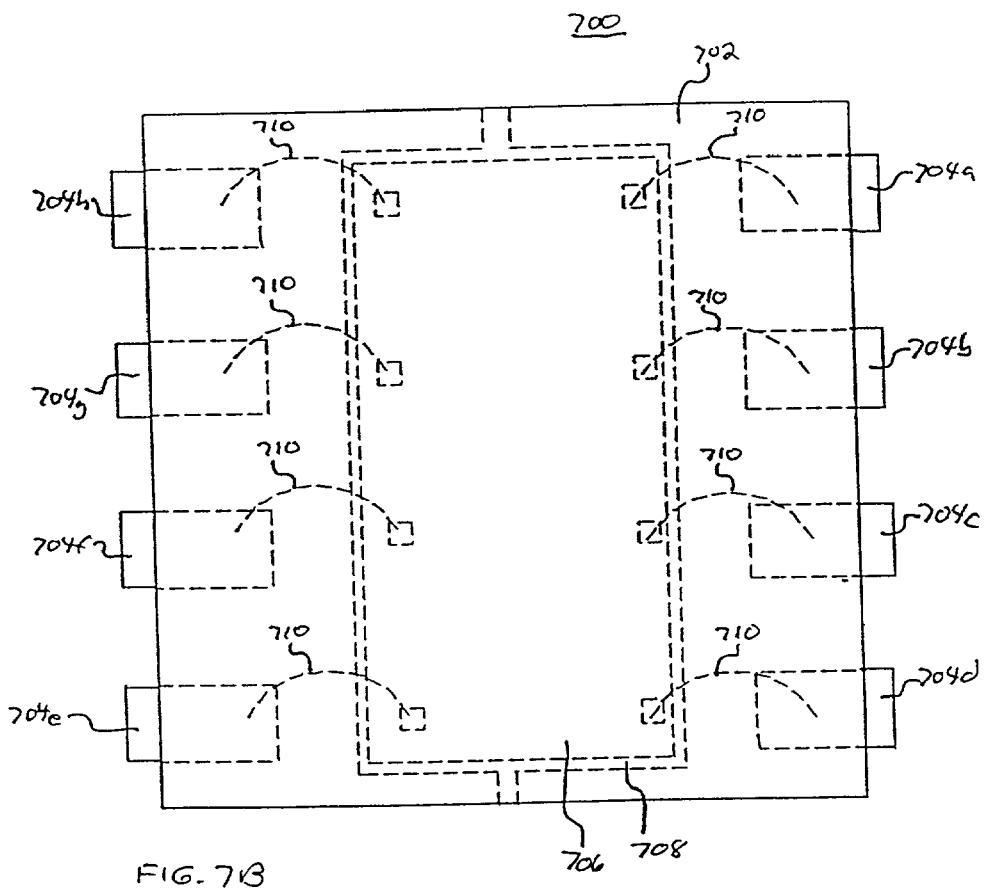
FIG. 7B is a simplified plan view of the package of FIG. 7A showing a die, lead frame, and bond wires.

FIG. 7B is a simplified plan view of the package of FIG. 7A showing internal components of package body 702. Package 700 includes die 706 positioned on die pad 708 and in communication with each of leads 704a–h through bond wires 710. The orientation of the feet of leads 704a–h, which fold back underneath package body 702, allows die pad 708 to extend into the footprint area formerly occupied by the lead feet of conventional package designs, thereby enabling die 706 to enjoy a greater width.

Specifically, package 700 does not offer an enhanced die size due to die pad connected leads. In this package, none of

TABLE 4

Package Footprint: SC70
Type: JW (reverse gull wing, widebody)
Number of Die: one
Number of External Leads: six

| | Connections | | | | | Area Efficiency | | | Refer to | | Thermal | Manufact |
|---|---|---|---|---|---|---|---|---|---|---|---|---|
| # of total pins | Lead pitch mm | # of electrical pins | # of thermal pins | # integral die pad leads | # of free leads | Die area mm² | PC board area mm² | Area ratio % | FIG. # | ID # | θja approx ° C./W | Bonding Wire # & Angles |
| 6 | 0.5 | 6 | 0 | 0 | 6 | 1.5 | 4.2 | 36 | 6I | 650 | 200 | Excellent |
| 6 | 0.5 | 6 | 1 | 1 | 5 | 1.5 | 4.2 | 36 | 6J | 670 | 150 | Good |
| 6 | 0.5 | 5 | 2 | 2 | 4 | 1.5 | 4.2 | 36 | 6K | 680 | 120 | Moderate |
| 6 | 0.5 | 5 | 2 | 2 | 4 | 0.8 | 4.2 | 19 | 6L | 660 | 100 | Excellent |
| 6 | 0.5 | 4 | 3 | 3 | 3 | 1.87 | 4.2 | 45 | 6M | 690 | 80 | Good |
| 6 | 0.5 | 3 | 4 | 4 | 2 | 1.47 | 4.2 | 35 | 6H | 600 | 62 | Moderate |

While the present invention has been described and illustrated so far in connection with a package having six leads, the present invention is not limited to a package having this number of leads. Accordingly, FIG. 7A is a simplified perspective view of an embodiment of an eight-lead package in accordance with the present invention.

More leads are possible on a package either by making the package larger or by reducing the pitch and the width of the leads. For example a common lead pitch win the prior art is 1 mm, but now 0.65 mm and 0.5 mm are manufacturable in high volume PC board assembly. Some other combinations of lead pitch, package size, and the corresponding number leads are described in TABLE 5 below as examples. In this the leads are connected to the die pad. Accordingly package 700 can be considered an eight-electrical pin, zero-thermal pin package. So while package 700 offers advantages over prior art conventional packages in its maximum die size (due to its use of the JW package concept), it does not offer a low thermal resistance solution for packages offering eight distinct electrical connections of differing signals or potentials. In this lead frame design, any one, two, or even three leads may be connected to the die pad to improve the thermal resistance of the package (at the expense of sacrificing, i.e. reducing, the number of distinct electrical connections), but the die pad area remains fixed at a width set by its narrowest portion.

Figure 7C:
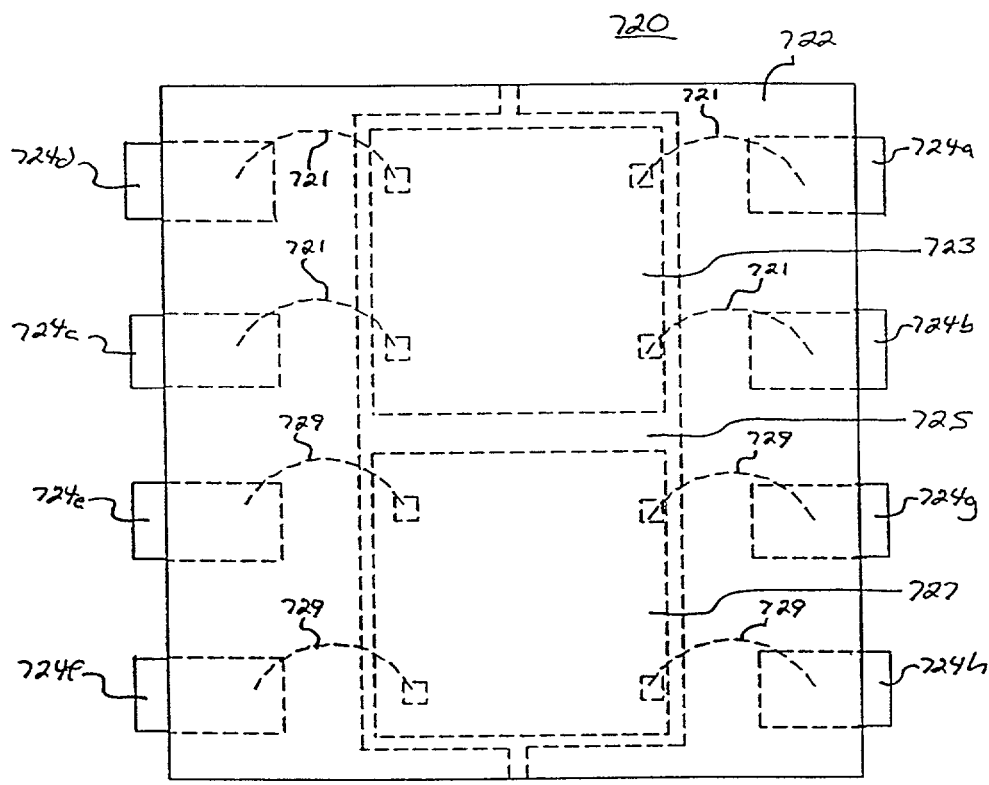
FIG. 7C is a simplified plan view of an alternative embodiment of an eight-lead package in accordance with the present invention, showing two die, a single-die-pad lead frame, and bond wires.

FIG. 7C is a simplified plan view of an alternative embodiment of an eight lead package in accordance with the present invention, also showing internal components of package body 722. Specifically, package 720 encloses first die 723 and second die 727 positioned on a single die pad 725. First die 723 is connected to leads 724a–d through bond wires 721, and second die 727 is connected to leads 724e–h through bond wires 729. As described above in connection with FIG. 7B, dies 723 and 727 may occupy a greater width of the package body due to the space efficient design of the package. They also do not necessarily be of the same dimension or same construction or type, so long that bond wires 721 and 729 are of reasonable length and bonding angles.

The two die 723 and 727 may both be attached to the common die pad 725 using a conductive attach layer such as solder or silver-filled epoxy in which case the substrate of both die will share the same electrical potential. Alternatively one or both die may be mounted on the die pad using an electrically insulating layer (such as epoxy with no silver filling) in which case the two die can be biased to differing substrate potentials.

Specifically, package 720 does not offer an enhanced die size due to die pad connected leads. In this package, none of the leads are connected to the die pad. Accordingly package 720 can be considered an eight-electrical pin, zero-thermal pin package. In this embodiment the package 720 includes dual die 723 and 727 despite sharing a single die pad 725. So while package 720 offers advantages over prior art conventional packages in its maximum die size, it does not offer a low thermal resistance solution for packages offering eight distinct electrical connections of differing signals or potentials. In this lead frame design, any one, two, or even three leads may be connected to the die pad to improve the thermal resistance of the package (at the expense of sacrificing, i.e. reducing, the number of distinct electrical connections), but the die pad area remains fixed at a width set by its narrowest portion. FIG. 7E is an example where one lead is integral to the die pad, but where no increase in die pad size is facilitated by inclusion of the integral, die-pad connected, lead.

Additional area may also be available for increasing the die size of either die 723 and/or 727 by placing the two die as close as possible on the same die pad. A common minimum dimension for the die-to-die spacing is typically no smaller than 0.1 mm (approximately 4 mils).

Figure 7D:
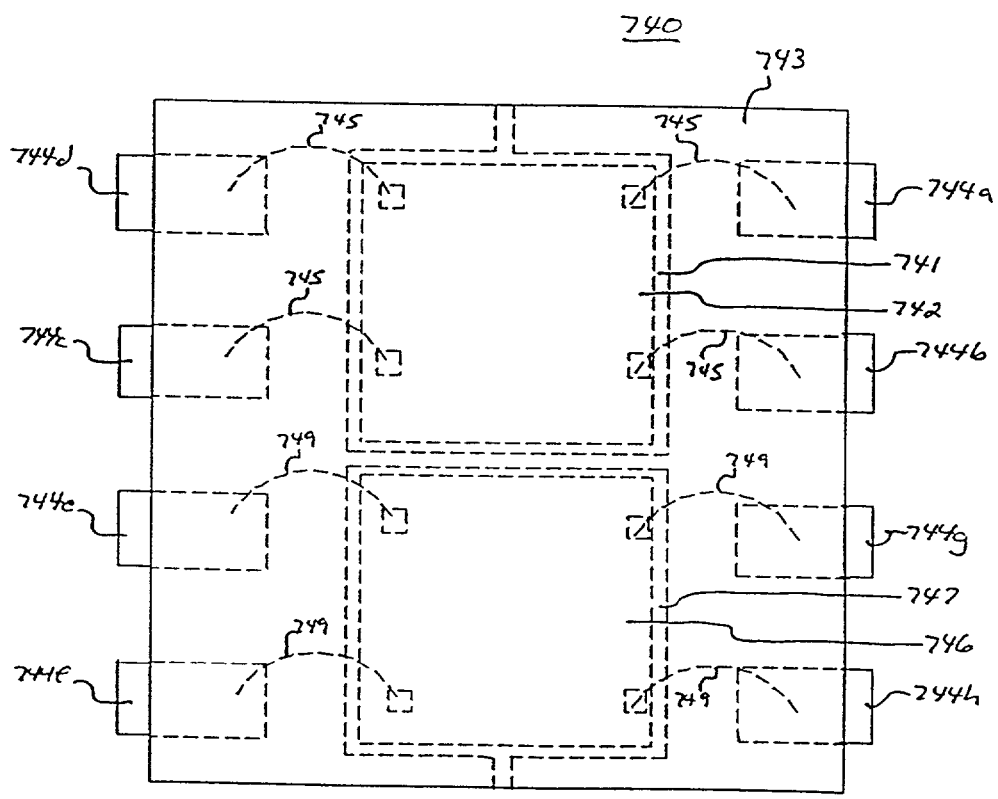
FIG. 7D is a simplified plan view of another alternative embodiment of an eight-lead package in accordance with the present invention, showing two die, a dual-die pad lead frame, and bond wires.
Figure 7E:
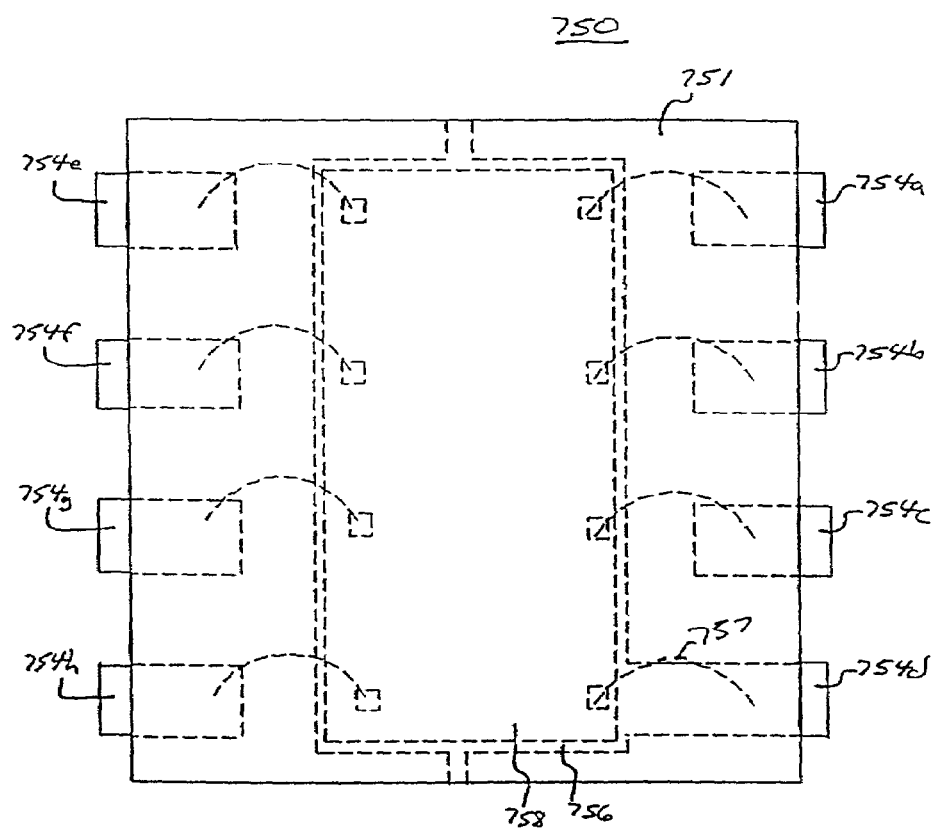
FIG. 7E is a simplified plan view of still another embodiment of an eight-lead package in accordance with the present invention, showing a die, lead frame, and bond wires.

FIG. 7D is a simplified plan view of another alternative embodiment of an eight lead package in accordance with the present invention, also showing internal components of package body 743. The embodiment of FIG. 7D is similar to package 720 of FIG. 7C, except that each die 742 and 746 is positioned on a separate die pad. Specifically, package 740 includes first die 742 positioned on first die pad 741, and second die 746 positioned on second die pad 747. First die 742 is connected to leads 744a–d through bond wires 745, and second die 746 is connected to leads 744e–h through bond wires 749. Again, the space efficient package design enables each enclosed die to occupy a greater width of the package than could be accommodated by conventional, space-inefficient package designs.

Specifically, package 740 does not offer an enhanced die size due to die pad connected leads. In this package, none of the leads are connected to the die pad. Accordingly package 740 can be considered an eight-electrical pin, zero-thermal pin dual die package. In this embodiment the package 740 includes dual die 742 and 746 mounted on separate and distinct die pads. So while package 740 offers advantages over prior art conventional packages in its maximum die sizes (due to its use of the JW package concept), it does not offer a low thermal resistance solution for packages offering eight distinct electrical connections of differing signals or potentials. In this lead frame design, any one, two, or even three leads per die may be connected to the die pad to improve the thermal resistance of the package (at the expense of sacrificing, i.e. reducing, the number of distinct electrical connections), but the die pad area remains fixed at a width set by its narrowest portion.

FIG. 7E is a simplified plan view of still another embodiment of an eight lead package in accordance with the present invention, showing internal components of package body 751. Package 750 is similar to package 700 of FIG. 7B, except that lead 754d is integral with die pad 756, offering the advantageous thermal management properties described above. Moreover, integral lead 754d is separately connected to a terminal of die 758 through bond wire 757. Such a configuration may be useful where the die substrate and another terminal of the die are tied to the same voltage level, for example where a MOSFET source and substrate are grounded.

FIG. 7F is a simplified cross-sectional and plan view, including dimensions, of an embodiment of an eight lead package in accordance with the present invention. Package 760 includes die 762 mounted on die pad 766. Leads 764 are not in electrical communication with lead frame die pad 766 except through connection using a bond wire (not shown). Package body 761 encloses die 762 and internal portion 764a of leads 764. Feet 764b of leads 764 are bonded to trace 770 of PC board 769 by solder 772, such that package 760 occupies footprint 773. Package dimensions labeled in FIG. 7F are summarized below in TABLE 6:

TABLE 6

DIMENSIONS LABELED IN FIG. 7F

| LABEL | DESCRIPTION |
| --- | --- |
| Wpcb | width of package footprint |
| Vpcb | length of package footprint |
| Wchip | width of die |
| Vchip | length of die |
| Wbody | width of package body |
| Vbody | length of package body |
| X6 | Set back of die from die pad edge |
| X2 | distance between die pad edge and non-integral lead |
| Wlead | distance between ends of opposite lead feet |
| X3 | length of internal portion of lead |
| X4 | length of lateral extension of external lead portion from package body |
| Wfoot | length of lead foot |

Optimal sizing of the above-referenced dimensions can result in a package of maximum space efficiency for a given size footprint.

FIG. 7G is a simplified cross-sectional and plan view, including dimensions, of an embodiment of an eight lead package in accordance with the present invention. Package 780 includes die 782 mounted on die pad 786. Leads 784a–d on one side of package 780 are integral with die pad 786, and leads 784e–h on the opposite side of package 780 are non-integral with (i.e. not attached to) die pad 786. Package body 781 encloses die 782 and internal portions 785 of leads 784. Feet 787 of leads 784 are bonded to trace 789 of PC board 790 by solder 792, such that package 780 occupies footprint 793. Package dimensions labeled in FIG. 7G are summarized below in TABLE 7:

TABLE 7

DIMENSIONS LABELED IN FIG. 7G

| LABEL | DESCRIPTION |
|---|---|
| Wpcb | width of package footprint |
| Vpcb | length of package footprint |
| Wchip | width of die |
| Vchip | length of die |
| Wbody | width of package body |
| Vbody | length of package body |
| X6 | setback of die from die pad edge |
| X7 | distance from die edge to end of package body |
| X2 | distance between die pad edge and non-integral lead |
| Wlead | distance between ends of opposite lead feed |
| X4 | length of lateral extension of external lead portion from package body |
| X3 | length of internal portion of non-integral lead |
| Wfoot | length of lead foot |

The package shown in FIG. 7G retains the space-efficient design of the embodiment of a package shown in FIG. 7F, while permitting substantial conduction and dissipation of heat from the enclosed die due to the integral leads. Again, optimal sizing of the above-referenced dimensions can result in a package of maximum space efficiency for a given footprint size. Because the leads on one side of the package are integral with die pad 786, the area of die pad 786 can be expanded to a dimension larger than that of die pad 766 in FIG. 7F.

Figure 8A:
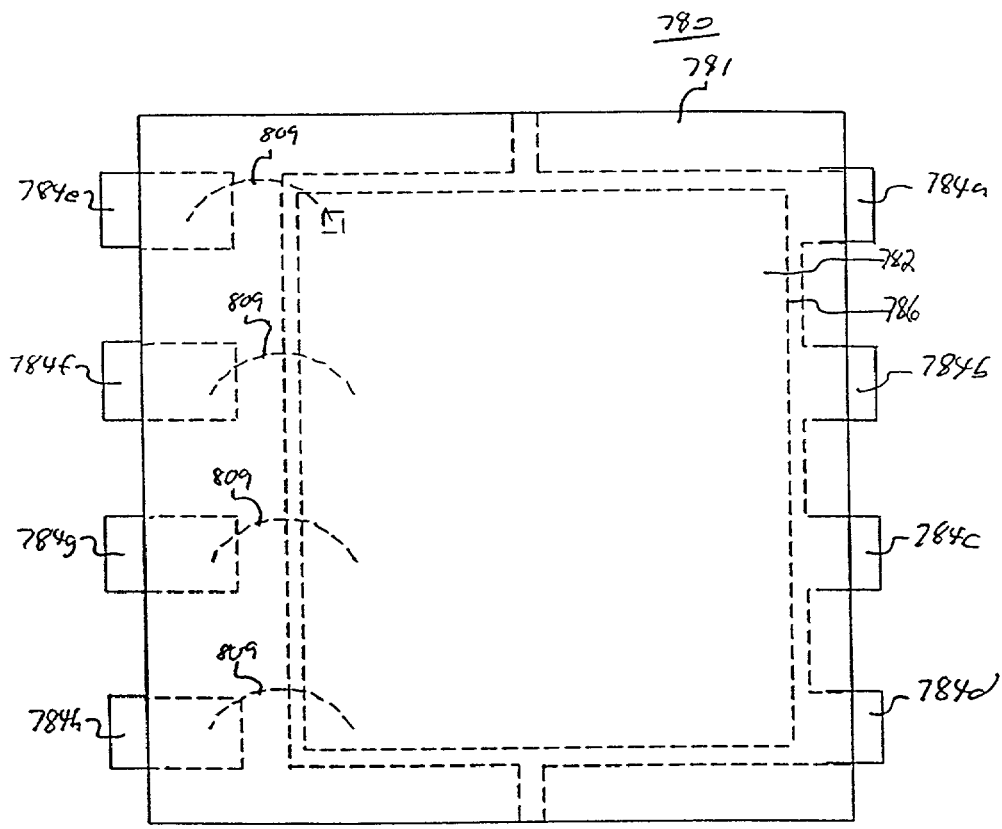
FIG. 8A is a simplified plan view of another embodiment of an eight-lead package in accordance with the present invention, showing a die, lead frame, and bond wires.

FIG. 8A is a simplified plan view of the eight-lead package shown in FIG. 7G, showing internal components of package body 781. Package 780 includes four leads 784a–d integral with die pad 786, and four leads 784e–h connected to die 782 by bond wires 809. The one-sided orientation and surface area of integral leads 784a–d enables thermal energy to be drawn from die 782 and dissipated in the external environment and for the area of die pad 786 can be expanded to a dimension substantially larger than that of die pad 708 in FIG. 7B. Area improvements in die pad 786 can exceed 30% over conventional packages.

Since leads 784a–d are tied, i.e. electrically shorted, to the die pad they can be considered as one electrical pin but as four thermal pins. The four remaining leads 784e–h are connected to die 782 through bond wire 809. Together the four-shorted leads and the four independent leads comprise a five electrical pin, four thermal pin package.

Figure 8B:
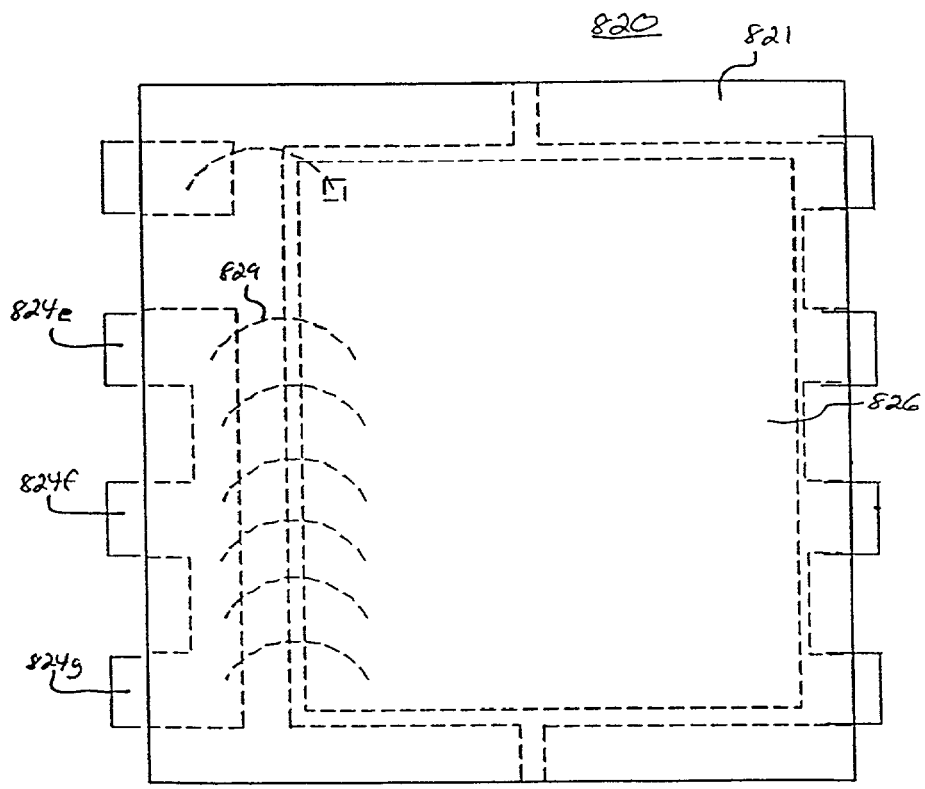
FIG. 8B is a simplified plan view of another embodiment of an eight-lead package in accordance with the present invention, showing a die, lead frame, and bond wires.

FIG. 8B is a simplified plan view of another embodiment of an eight lead package in accordance with the present invention, showing internal components of package body 821. Package 820 is similar to package 800 shown in FIG. 8A, except that leads 824e–g are formed from a single piece of metal, thereby permitting the use of multiple bond wires 829 to form a low-resistance contact and interconnect with die 826 and to allow a more uniform placement of bond wires along the length of die 826..

FIG. 8C is a simplified plan view of another embodiment of an eight lead package in accordance with the present invention, showing internal components of package body 1011. Package 1010 is similar to package 800 shown in FIG. 8A, except that leads 1014a–e not integral to die pad 1012 are formed from a single piece of metal 1017, thereby permitting the use of multiple bond wires 1015 to form a low-resistance contact and interconnect with die 1013 and to allow a large number of bond wires 1015 to be connected with die 1013. Lead 1014e is connected to die 1013 by separate bond wire 1016, and remaining leads 1014f–h are integral with die pad 1012.

FIG. 8D is a simplified plan view of another embodiment of an eight lead package in accordance with the present invention, showing internal components of package body 841. Package 840 includes leads 844a–c integral with die pad 846 where all the integral leads are positioned on the same side of die pad 846. Electronic communication between leads 844a–c and die 842 takes place through bond wires 847. Of the remaining five non-integral leads of package 840, leads 844d–g are located on the opposite side of the package from leads 844a–c and are in electrical communication with terminals on die 842 through bond wires 849. The eighth, non-integral lead 844h is on the same side of the package as integral leads 844c and is connected to a separate terminal on die 842 through bond wire 850. The package therefore comprises a six-electrical pin, three-thermal pin package.

The internal portion of the lead connected to 844g is in one embodiment is made longer, i.e. extended in the proximity of lead frame 846 to facilitate convenient bonding locations and manufacturable bonding angles. The internal extended portion of 844g is stabilized during manufacture by tie lead 851, whose external portion is clipped and removed after plastic molding is complete and the die and lead frame are securely held.

The lead frame and package of FIG. 8D offers a number of advantages. For example, the orientation of the leads relative to the lead frame permits a total of six independent contacts to be made with die 842, which may be a power IC device or a MOSFET. At the same time, the one-sided orientation and surface area of integral leads 844a–c enables thermal energy to be drawn efficiently from die 842 and dissipated in the external environment. In addition, the space-efficient design of package 840 enables a substantial amount of the available footprint area to be occupied by die 842, as described in detail above in conjunction with other novel package designs. Lead 844h also includes notch 854 so as to allow the dimension of die pad 846 to be further expanded in length. Lead frame element 851 stabilizes the long internal portion of lead 844g during manufacturing and wire bonding prior to plastic injection molding. Package 840 and its lead frame make a variety of bond wire lengths and angles possible, offering great flexibility in the bonding of die 842. Leads 844 may be expanded in width inside of plastic body 841 to improve the number of possible bond wires including an L-shaped lead (from a plan view) such as 853 as part of lead 844d or T-shaped lead feature 852 of lead 844f.

Specifically, because of the large lead surface area in contact between die pad 846 and integral leads 646a–c, these leads can successfully conduct large amounts of heat away from the operating die through the die pad and out of the package. External portions of the integral leads may then permit excess heat to be dissipated into the environment, and especially to be conducted into the printed circuit board where the heat can be spread over a larger area and subsequently radiated or drawn by convection into the air.

Still another advantage of the package shown in FIG. 8D is the low resistance electrical contact due to the greater number of bond wires 849 connected to the die and leads 844d–h and because those bond wires can be distributed along the length and even along the sides of die 842 offering more uniform current conduction in and along the die surface. Such a lead frame also facilitates wire bonds to be made near the center of the die without employing excessively long wires, since the leads are positioned along two sides of the die.

The usable area to bond wires to this leads can be further improved by expanding the lead width inside the package body 841, such as forming one or more T-shaped leads like the inner portion of leads 844e–f, or by employing an L-shaped lead like the inner portion of the lead 844d.

Figure 8E:
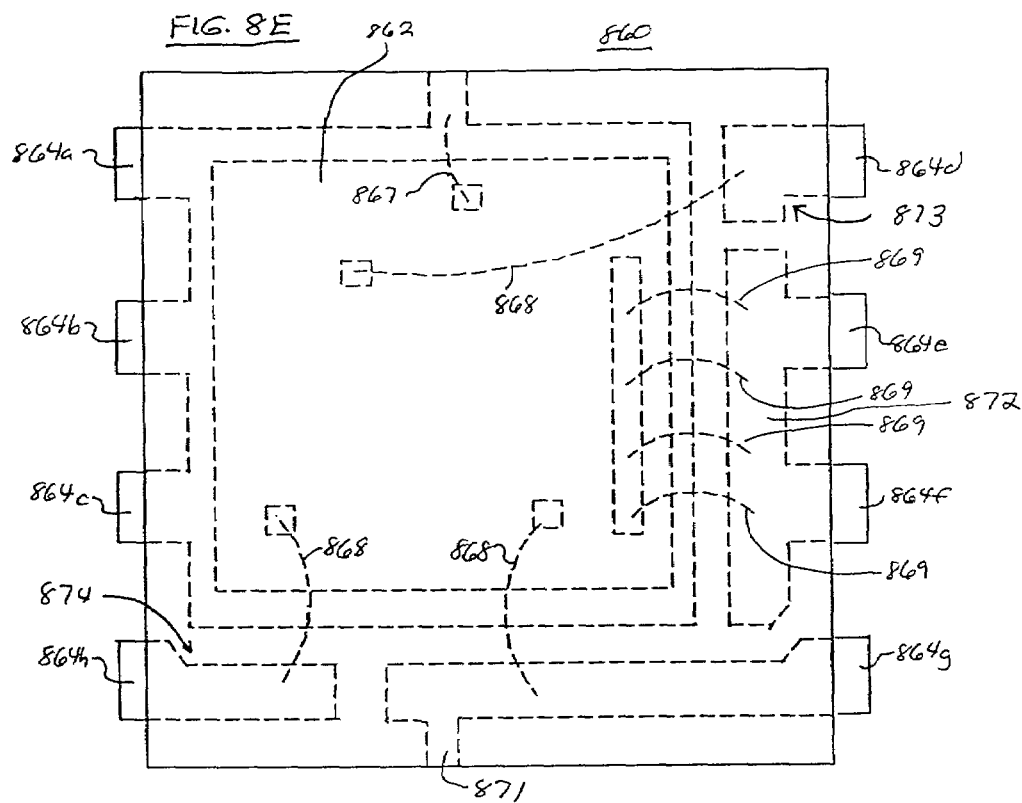
FIG. 8E is a simplified plan view of another embodiment of an eight-lead package in accordance with the present invention, showing a die, lead frame, and bond wires.

The usable portion of the leads available for bonding can be expanded further by connecting two or more leads with a metal strap thereby shorting the two (or three) independent leads into a single electrical connection. Such an lead strap for bonding is illustrated by example in FIG. 8E, where leads 864e–f are shorted by strap 872, thereby facilitating a greater number of bonds wires 869 than in package 840 of the prior figure. In other respects the lead frames of FIGS. 8E and 8D are similar. Three leads 864a–c form a single electrical connection and act as three thermal pins integral to die pad 866. Leads 864d and 864g–h are independent electrical connections. Together package 860 forms a 5 electrical pin, 3 thermal pin package, offering a the benefits of low thermal resistance, large area die, greater number of electrical connections, and a large number of wire bonds of minimal length or optimum positioning for a low resistance package. Down bond 867 from the die's surface to the lead frame is also illustrated as means to connect a surface pad connection to the die pad.

Figure 8F:
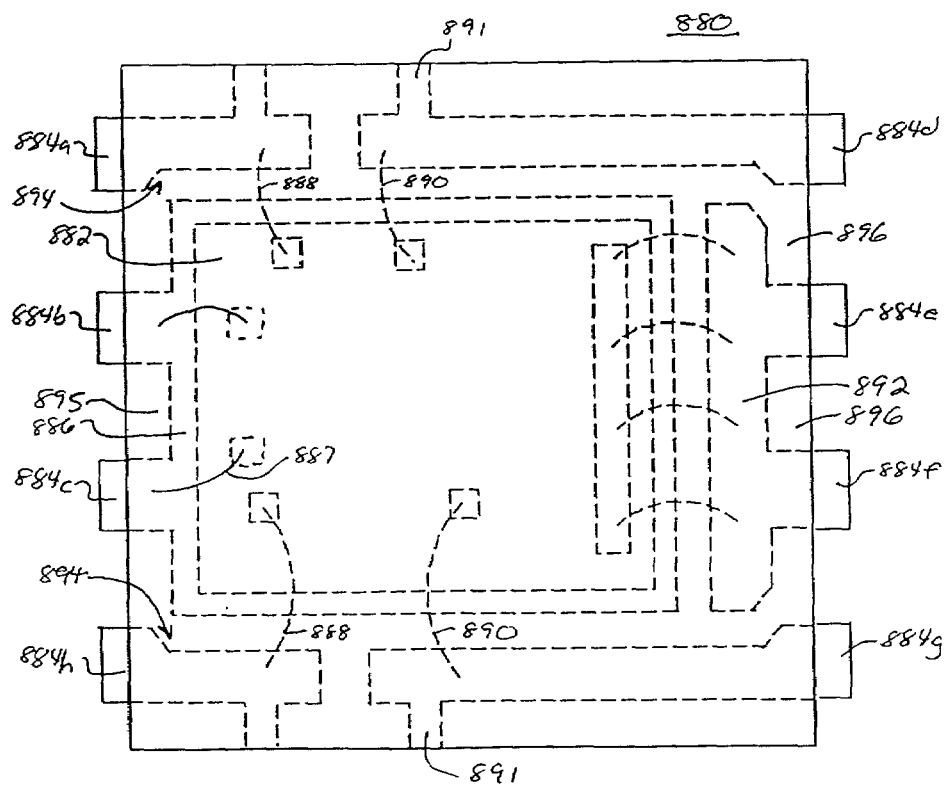
FIG. 8F is a simplified plan view of another embodiment of an eight-lead package in accordance with the present invention, showing a die, lead frame, and bond wires.

FIG. 8F is a simplified plan view of another embodiment of an eight lead package in accordance with the present invention, showing internal components of package body 881. Package 880 includes leads 884b–c integral with die pad 886 where all the integral leads are positioned on the same side of die pad 886. Electronic communication between leads 884b–c and die 882 takes place through directly through the chip's backside die attach and/or through bond wires 887, down bonded to the die pad from the die's surface connection. Of the remaining six non-integral leads of package 880, leads 884d–g are located on the opposite side of the package from leads 884b–c and are in electrical communication with terminals on die 882 through bond wires 889 and 890. The remaining two, non-integral leads 884a and 884h are on the same side of the package as integral leads 884b–c and are connected to a die 882 through bond wires 888. The package therefore comprises a six-electrical pin, two thermal pin package. If leads 884e and 884f are not shorted (not shown), this package then becomes a seven electrical pin, two thermal pin package.

The internal portion of the lead connected to 884g is in one embodiment is made longer, i.e. extended in the proximity of lead frame 886 to facilitate convenient bonding locations and manufacturable bonding angles. The internal extended portion of long leads 884d and 884g are stabilized during manufacture by tie leads 891, whose external portion is clipped and removed after plastic molding is complete and the die and lead frame are securely held.

The lead frame and package of FIG. 8F offers a number of advantages. For example, the orientation of the leads relative to the substantially symmetric lead frame permits a total of six independent contacts to be made with die 882, which may be a power IC device or a MOSFET. At the same time, the one-sided orientation and surface area of integral leads 884b–c enables thermal energy to be drawn efficiently from die 882 and dissipated in the external environment. In addition, the space-efficient design of package 880 enables a substantial amount of the available footprint area to be occupied by die 882, as described in detail above in conjunction with other novel package designs. Leads 884a and 884h also includes notch 894 so as to allow the dimension of die pad 886 to be further expanded in length.

Lead frame element 891 stabilizes the long internal portion of leads 884a and 884g during manufacturing and wire bonding prior to plastic injection molding. Package 880 and its lead frame make a variety of bond wire lengths and angles possible, offering flexibility in the bonding of die 882. Leads 884e–f are strapped together inside body 841 to improve the number of possible bond wires including a Π-shaped lead (from a plan view) such as 892. Since the integral leads are secured by die pad 886, they are not at risk of being pulled out of the package during handling, allowing the inset 895 of the lead frame inside plastic body 881 to be minimal. Inset 896 on the strapped leads 884e–f may also be minimized due to strap 892 forming a Π-shaped lead.

Specifically, because of the large lead surface area in contact between die pad 886 and integral leads 846b–c, these leads can successfully conduct large amounts of heat away from the operating die through the die pad and out of the package. External portions of the integral leads may then permit excess heat to be dissipated into the environment, and especially to be conducted into the printed circuit board where the heat can be spread over a larger area and subsequently radiated or drawn by convection into the air.

Still another advantage of the package shown in FIG. 8F is the low resistance electrical contact due to the greater number of bond wires 889 connected to the die and leads 884e–h along with 884a, 884d, 884g. 884h and because those bond wires can be distributed along the length and even along the sides of die 882 offering more uniform current conduction in and along the die surface, or more independent connections. Such a lead frame also facilitates wire bonds to be made near the center of the die without employing excessively long wires, since non-integral leads are positioned along three sides of the die.

Figure 9:
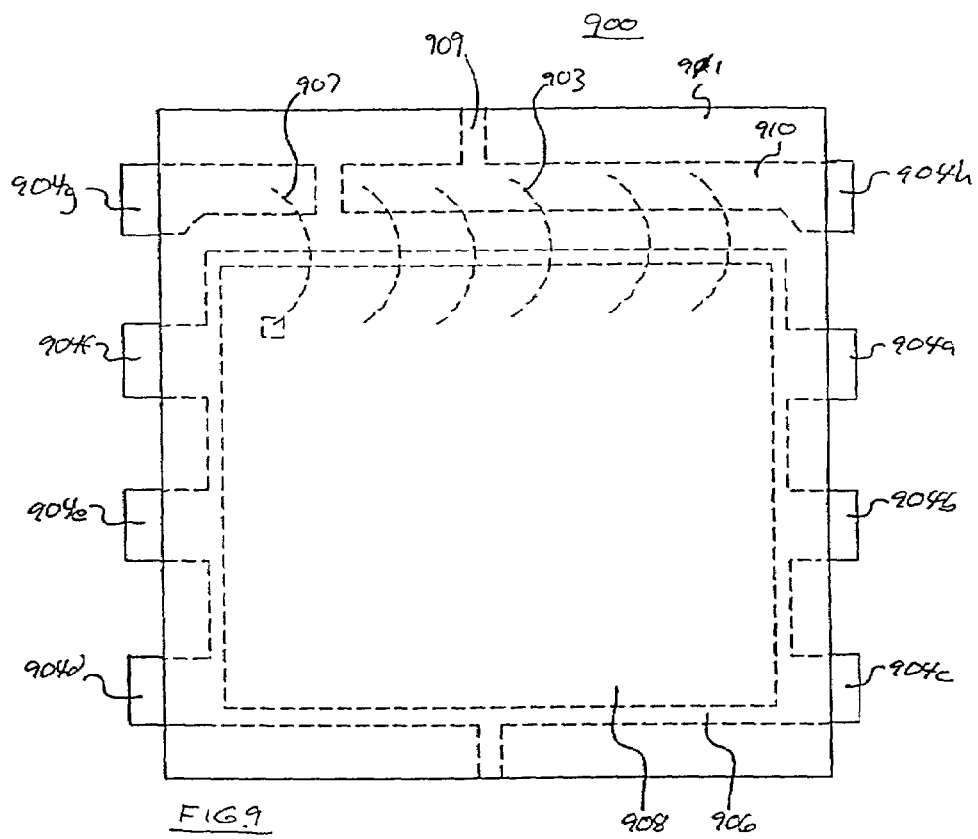
FIG. 9 is a simplified plan view of still another embodiment of an eight-lead package in accordance with the present invention, showing a die, lead frame, and bond wires.

FIG. 9 is a simplified plan view of still another embodiment of an eight lead package in accordance with the present invention, showing internal components of package body 901. Package 900 includes six leads 904a–f integral to die pad 906. One remaining lead 904g is connected to die 908 through bond wire 907. The other remaining lead 904h features an elongated internal portion 910 connected to die 908 through bond wires 903, and lead frame element 909 used to stabilize the elongated lead during the assembly process.

As described above in conjunction with the package embodiment shown in FIG. 8B, leads 904a–f integral with die pad 906 offer the advantage of enhanced heat dissipation from die 908, offering a very low thermal resistance because of 6 integral die pad leads. The die-pad connected pins on both sides of the package also provide for a larger die size than a die pad not incorporating integral leads. Elongated lead 904h offers the advantage of space for multiple bond wires providing a low resistance contact with die 908. Package 900 further offers an improved utilization of available footprint area (an attribute of the JW-type package feature) as compared with a conventional package of space-inefficient design. Package 900 therefore comprises a three electrical pin, six thermal pin package.

Figure 10:
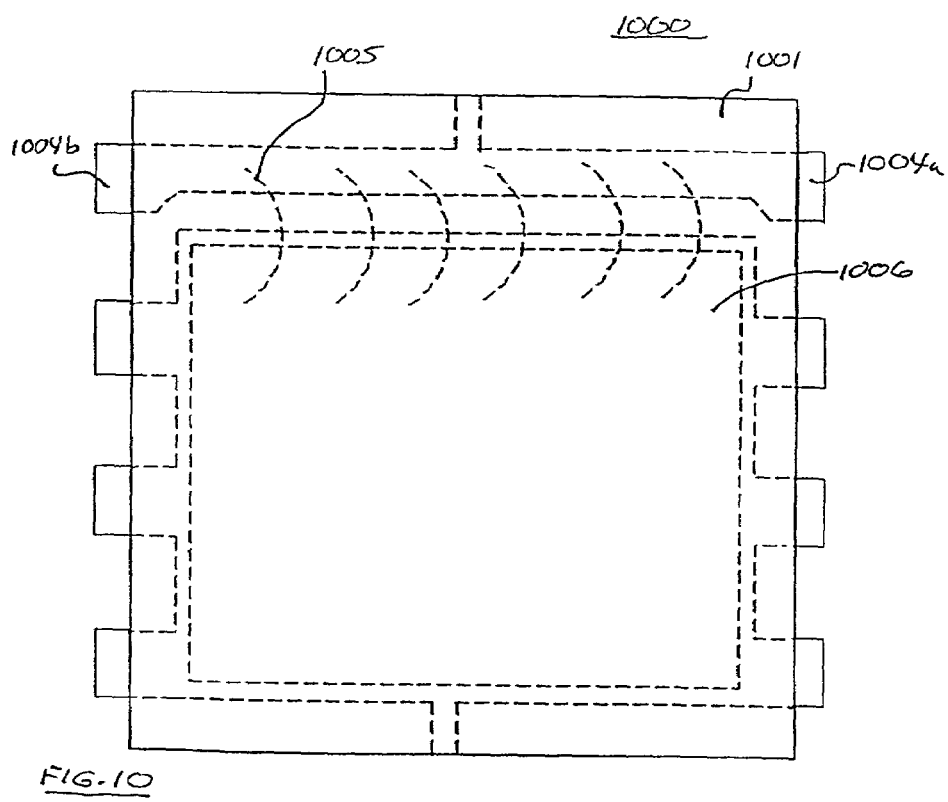
FIG. 10 is a simplified plan view of yet another embodiment of an eight-lead package in accordance with the present invention, showing a die, lead frame, and bond wires.

FIG. 10 is a simplified plan view of yet another embodiment of an eight lead package in accordance with the present invention, showing internal components of package body 1001. Package 1000 is similar to package 900 of FIG. 9, except that non-integral leads 1004a–b are formed from a single piece of metal bearing multiple bond wires 1005. Package 1000 thus retains the space-efficiency and enhanced thermal management properties of package 900 of FIG. 9, and also exhibits a lower electrical resistance contact to die 1006. Accordingly, package 1000 comprises a 2 thermal pin, six electrical pin package.

Figure 11:
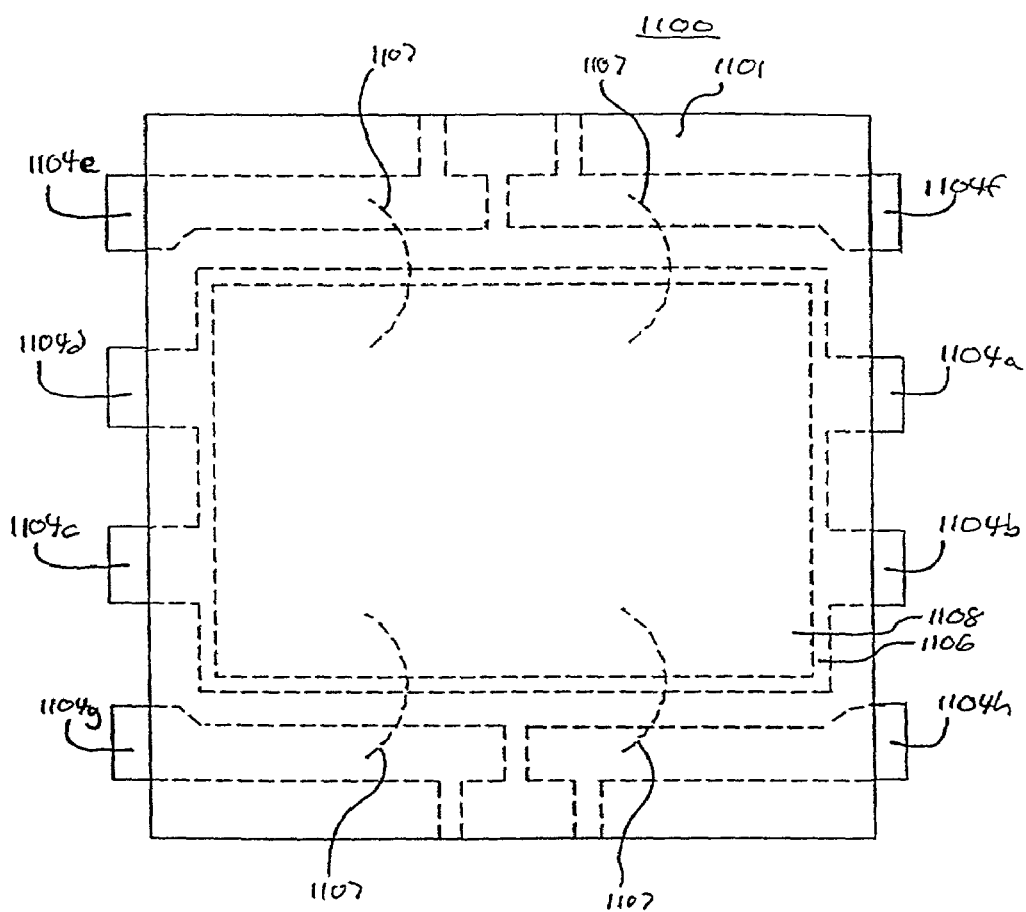
FIG. 11 is a simplified plan view of a further embodiment of an eight-lead package in accordance with the present invention, showing a die, lead frame, and bond wires.

FIG. 11 is a simplified plan view of a further embodiment of an eight lead package in accordance with the present invention, showing internal components of package body 1101. Package 1100 includes leads 1104a–d integral with die pad 1106 that is in contact with die 1108. Non-integral leads 1104e–h are connected to die 1108 through bond wires 1107. This package also exhibits both space-efficient design, larger die size and desirable thermal-management properties of its integral leads 1104a–d. Accordingly, package 1100 comprises a four thermal pin, five-electrical pin package.

Figure 12A:
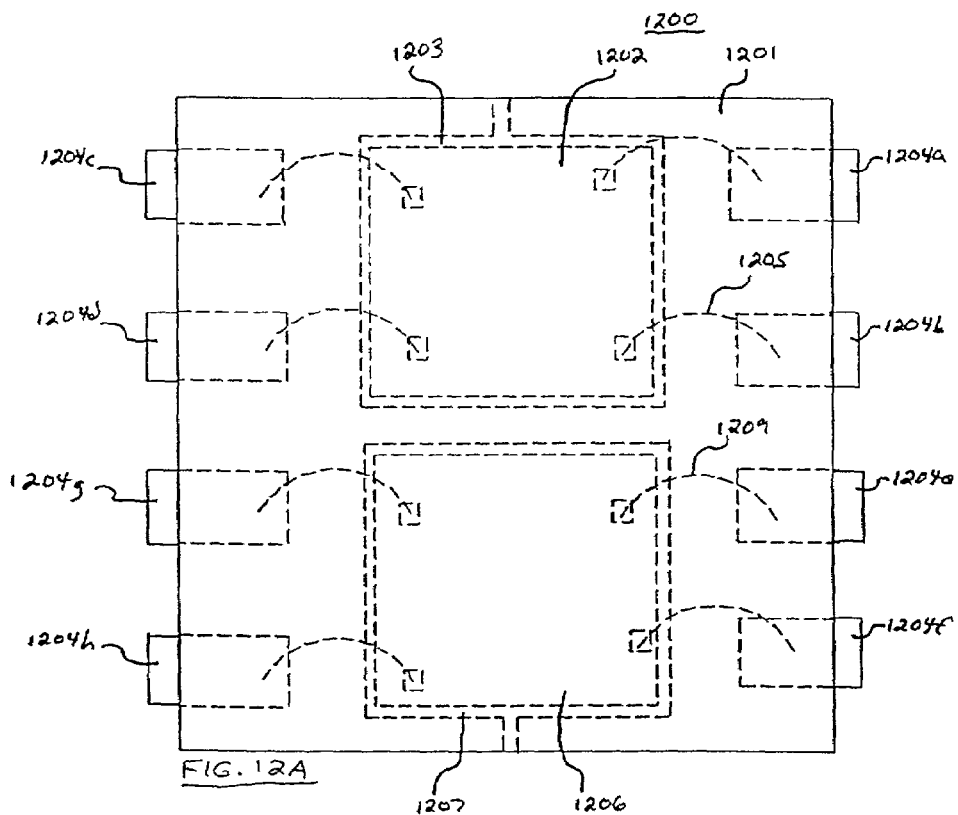
FIG. 12A is a simplified plan view of a further embodiment of an eight-lead package in accordance with the present invention, showing two die, a dual-die-pad lead frame, and bond wires.

FIG. 12A is a simplified plan view of a further embodiment of an eight lead package in accordance with the present invention, showing internal components of package body 1201. Package 1200 includes first die 1202 positioned on first die pad 1203, and second die 1206 positioned on second die pad 1207. First die 1202 is connected to leads 1204a–d through bond wires 1205, and second die 1206 is connected to leads 1204e–h through bond wires 1209. Again, the space efficient package design enables each enclosed die to occupy a greater width of the package than could be accommodated by conventional, space-inefficient package designs.

Figure 12B:
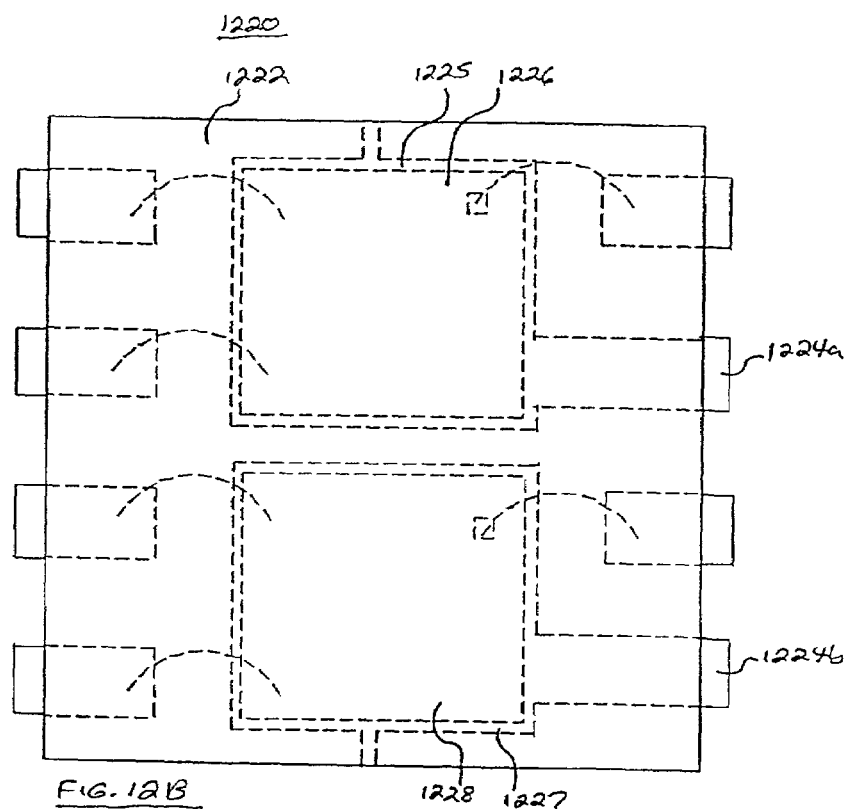
FIG. 12B is a simplified plan view of a further embodiment of an eight-lead package in accordance with the present invention, showing two die, a dual-die-pad lead frame, and bond wires.

FIG. 12B is a simplified plan view of a further embodiment of an eight lead package in accordance with the present invention, showing internal components of package body 1222. Package 1220 is similar to package 740 of FIG. 7D, except that die pads 1225 and 1227 include integral lead 1224a and 1224b, respectively. Integral leads 1224a and 1224b offer the advantage of enhanced heat dissipation from dies 1226 and 1228, respectively.

Figure 13A:
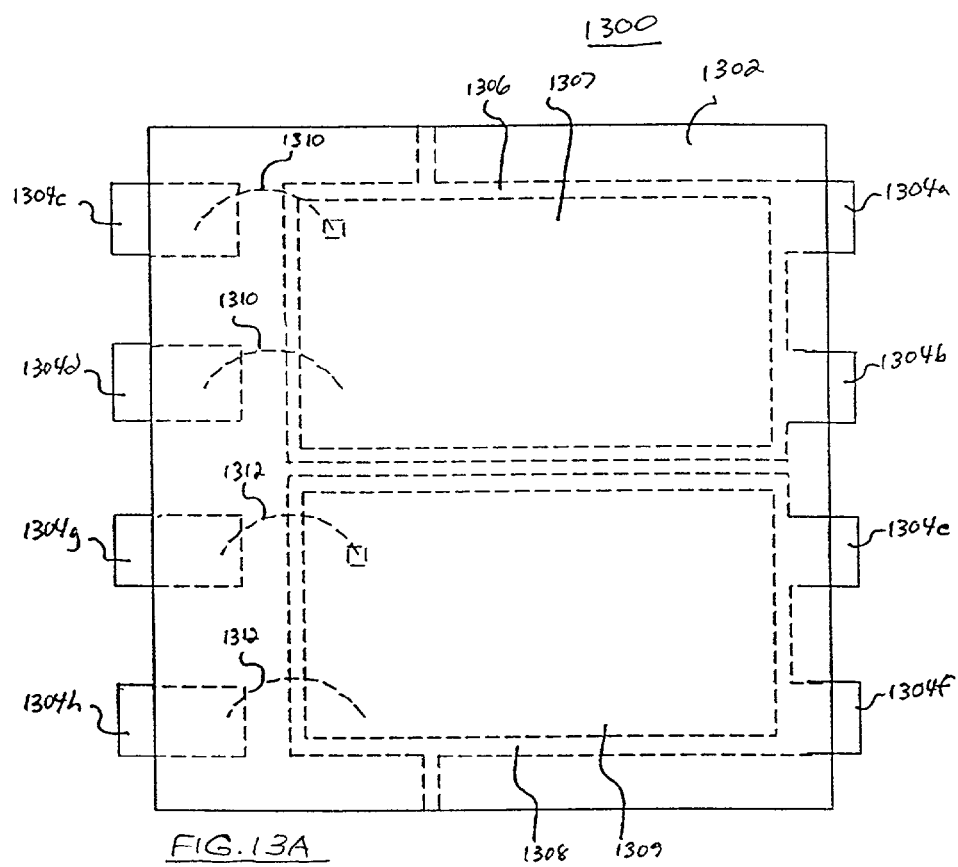
FIG. 13A is a simplified plan view of a further embodiment of an eight lead package in accordance with the present invention, showing dual die, a dual-die-pad lead frame, and bond wires.

FIG. 13A is a simplified plan view of a further embodiment of an eight lead package in accordance with the present invention, showing internal components of package body 1302. Package 1300 includes leads 1304a–b integral with first die pad 1306 supporting first broadened die 1307. Non-integral leads 1304c–d are in contact with first die 1307 through bond wires 1310. Leads 1304e–f are integral with second die pad 1308 in contact with second broadened die 1309. Non-integral leads 1304g–h are in contact with second die 1309 through bond wires 1312. As described above in conjunction with other package embodiments, integral leads 1304a–b and 1304e–f aid in dissipation of thermal energy from dies 1307 and 1309 respectively, while the package maximizes utilization of the available footprint area, permitting the enclosure of dies 1307 and 1309 having an elongated width.

Figure 13B:
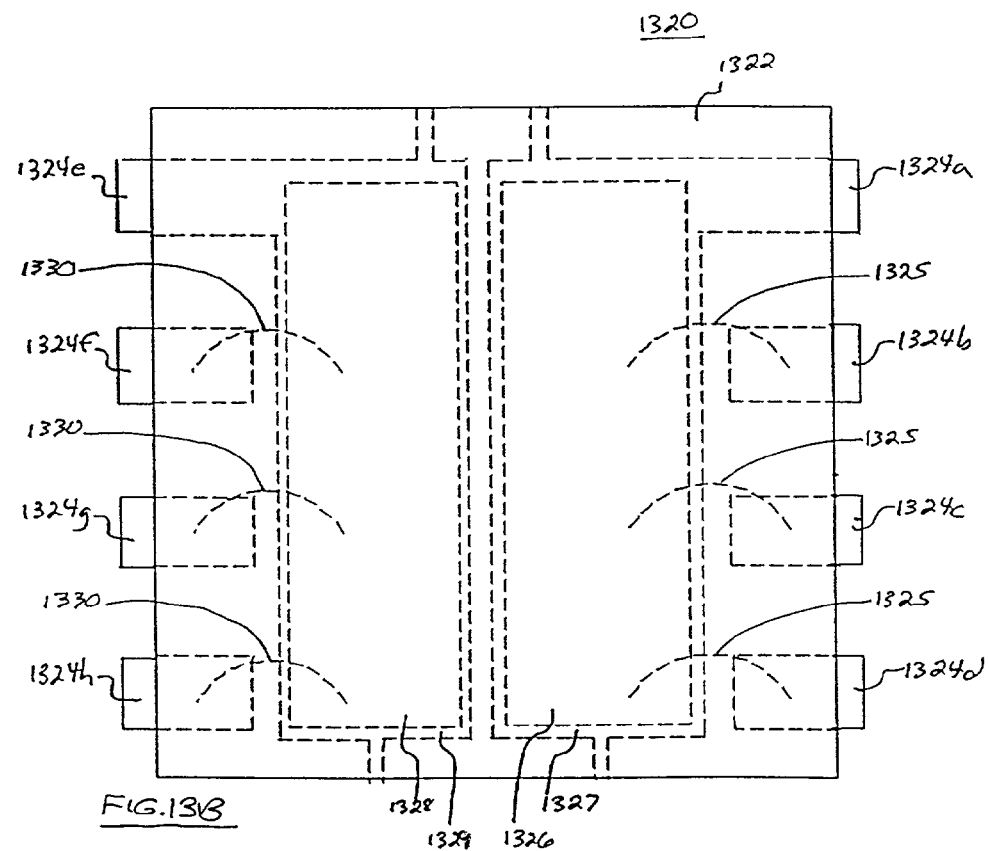
FIG. 13B is a simplified plan view of a further embodiment of an eight-lead package in accordance with the present invention, showing dual die, a dual-die-pad lead frame, and bond wires.

FIG. 13B is a simplified plan view of a further embodiment of an eight lead package in accordance with the present invention, showing internal components of package body 1322. Package 1320 includes first elongated die 1326 positioned on first die pad 1327, and second elongated die 1328 positioned on second die pad 1329. First die 1326 is connected to leads 1324b–d through bond wires 1325, and lead 1324a is integral with first die pad 1327. Second die 1328 is connected to leads 1324f–h through bond wires 1330, and lead 1324f is integral with second die pad 1329. Integral leads 1324a and 1324e offer the advantage of enhanced heat dissipation from dies 1326 and 1328, respectively, while allowing these elongated dies to be accommodated within the package.

The examples and embodiments described herein are for illustrative purposes only. Various modifications or changes in light thereof will be suggested to persons skilled in the art and are to be included within the spirit and purview of this application and scope of the appended claims.

Thus while the invention has been described and illustrated above in conjunction with design of a specific package type, the present invention is not limited to the design of any particular package type. There can be many alternatives, variations, and modifications. Certain or all of above elements can be separated or combined.

For example, FIG. 14 shows a simplified perspective view of a number of a number of well-known package types that may feature a space efficient design in accordance with embodiments of the present invention. TABLE 6 below compares some of those package types shown in FIG. 14 with conventional package designs, showing the increased space efficiency achieved by designing several package types illustrated in accordance with the present invention.

TABLE 8

(JW denotes package featuring reverse gull-wing lead shape)

| Package Footprint Type | Lead-Lead Width (mm) | Package Body Length (mm) | Footprint Area (mm²) | Die Length (mm) | Package Body Width (mm) | Die Width (mm) | Die Area (mm²) | Die/Footprint Area (%) |
|---|---|---|---|---|---|---|---|---|
| SO-8 | 6 | 4.83 | 28.98 | 3.96 | 3.81 | 2.49 | 9.8604 | 34 |
| SO-8JW* | 6 | 4.83 | 28.98 | 3.96 | 5.5 | 4.9 | 19.404 | 67 |
| TSOP-6 | 2.85 | 3.05 | 8.6925 | 1.78 | 1.65 | 0.65 | 1.157 | 13 |
| TSOP-6JW* | 2.85 | 3.05 | 8.6925 | 1.78 | 2.35 | 1.95 | 3.471 | 40 |
| SOT-23 | 2.5 | 3 | 7.5 | 1.73 | 1.35 | 0.35 | 0.6055 | 8 |
| SOT-23JW* | 2.25 | 3 | 6.75 | 1.73 | 1.25 | 1.35 | 2.3355 | 35 |
| SC-70 | 2.1 | 2 | 4.2 | 1.4 | 1.25 | 0.25 | 0.35 | 8 |
| SC-70JW* | 2.1 | 2 | 4.2 | 1.4 | 1.6 | 1.25 | 1.75 | 42 |

The first four columns of TABLE 8 (lead-lead width, package body length, footprint area, and die length) are the same for conventional packages and packages in accordance with embodiments of the present invention. However, by allowing the width of the package body and hence the width of the enclosed die to increase, greater utilization of space is achieved. Specifically, space efficient packages in accordance with embodiments of the present invention enclose a die that occupies between 67% and 35% of the available footprint area. By contrast, conventionally-designed packages of the same type enclosed a die occupying only between 34% and 8% of the available package footprint..

Space efficient package design in accordance with embodiments of the present invention is not limited to the specific package types listed in TABLE 8. A nonexclusive list of package types eligible for space efficient design is given in TABLE 9 below.

TABLE 9

| PACKAGE TYPE | NO. OF LEADS | LEAD-LEAD WIDTH (mm) | PACKAGE LENGTH (mm) | FOOTPRINT (mm$^2$) |
| --- | --- | --- | --- | --- |
| SO-8 | 8 | 6 | 4.83 | 28.98 |
| SC-59 | 3 | 2.85 | 3.05 | 8.6925 |
| TSOP-6 | 6 | 2.85 | 3.05 | 8.6925 |
| TSOP-8 | 8 | 2.85 | 3.05 | 8.6925 |
| SOT-23 | 3 | 2.5 | 3.0 | 7.5 |
| SC-70 | 3 | 2.1 | 2.0 | 4.2 |
| SC-70-8 | 8 | 2.1 | 2.0 | 4.2 |

While the above examples have focused upon orientation and placement of the various package components to optimize space efficiency, structures and methods in accordance with embodiments of the present invention are not limited to this approach.

For example, in order to enhance that ability of the extremely small packages of the present invention to dissipate heat, copper may be substituted for the traditional lead frame metal alloy material. Improved thermal conductivity of the copper facilitates transfer of heat out of the package to the outside environment.

While many of these packages have been optimized for a single die per package, the present invention can be employed to incorporate multiple die inside a single package, including identically sized die mounted on a single (common) die pad, different sized die mounted on a single (common) die pad, identical sized die mounted on separated die pads, or different sized die mounted on separated die pads. For example a dual die package may be symmetric or asymmetric in its design.

Figure 15:
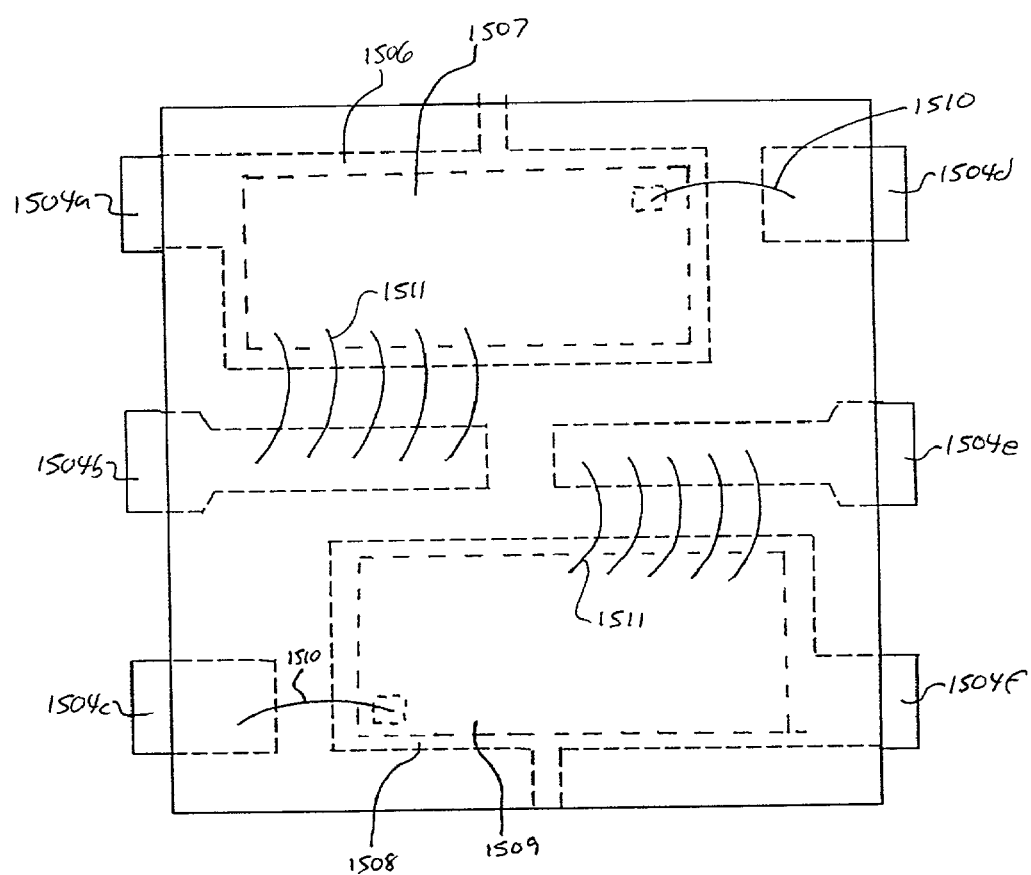
FIG. 15 is a simplified plan view of an embodiment of a six lead package in accordance with the present invention.

FIG. 15 is a simplified plan view of an embodiment of a six lead package in accordance with the present invention, showing internal components of package body 1502. Package 1500 includes lead 1504*a* integral with first die pad 1506 supporting first die 1507. Non-integral leads 1504*b* and 1504*d* are in contact with first die 1507 through bond wires 1511. Lead 1504*f* is integral with second die pad 1508 in contact with second die 1509. Non-integral leads 1504*e* and 1504*c* are in contact with second die 1509 through bond wires 1511. As described above in conjunction with other package embodiments, integral leads 1304*a* and 1304*f* aid in dissipation of thermal energy from dies 1507 and 1509 respectively, while the package maximizes utilization of the available footprint area, permitting the enclosure of dies 1307 and 1309 having an elongated width. The mirror symmetry of the package enhance the bonding angles of the package design, especially with leads 1504*b* and 1504*e* located in the center of the package and elongated to enhanced the available bonding angles and to maximize the available number of wire bonds.

FIG. 16A is a simplified plan view of an asymmetric multi-chip embodiment of an eight lead package in accordance with the present invention, showing internal components of package body 1602. Package 1600 includes leads 1604*a–b* integral with first die pad 1606 supporting first broadened die 1607. Non-integral leads 1604*e–f* are in contact with first die 1607 through bond wires 1612 and 1613. Lead 1604*h* is integral with second die pad 1608 in contact with smaller die 1609. Non-integral leads 1604*c–d* and 1604*g* are in contact with second die 1609 through bond wires 1610 and down bond 1611. As described above in conjunction with other package embodiments, integral leads 1304*a–b* and 1304*h* aid in dissipation of thermal energy from dies 1607 (and to some degree in die 6309), while the package maximizes utilization of the available footprint area, permitting the enclosure of dies 1607 having an elongated width and 1609 having a large number of interconnects.

One embodiment of package 1600 is its ability to support electrical interconnects between die 1607 and die 1609 in an indirect manner, i.e. without requiring any chip-to-chip bonds. For example wire bond 1614 connects die 1609 to lead 1604*f* that also connects to die 1607. Wire bond 1612 connects die 1607 to lead 1604*c* that also connects to die 1609. Thereby, two interconnects between die 1607 and 1609 are achieved without the need for chip-to-chip bonds.

In package 16A, the package asymmetry is optimized for die 1607 to be larger than die 1609, and also to have die pad 1606 to conduct heat more efficiently then die pad 1608, due to its larger number of integral leads 1604*a–b*. Die pad 1608 is designed to accommodate a larger number of interconnects, five in all, namely, one down bond (for lead 1604*h*), 2 independent leads (1604*g* and 1604*d*), and two to leads capable of also being bonded to die 1607 (leads 1604*c* and 1604*g*).

In one preferred embodiment, package 1600 contains two die where die 1609 is an integrated circuit and die 1607 is a discrete transistor, e.g. a vertical power MOSFET. The bond wire 1614 (to pin 1604*f*) in one case may be a control signal output from die 1609 to the input or gate of power MOSFET 1607. Bond 1612 may be a current or temperature sense signal from die 1607 to an input on IC 1609.

FIG. 16B illustrates package 1620, similar to package 1600, except now that pins 1624*g* and 1624*c* are independent and chip-to-chip wire bonds 1632 have been included, so that die 1629 has seven interconnections in all.

In the present invention, the die contained within the JW-type package may comprise digital, analog or mixed-signal integrated circuits, diodes, discrete MOSFETs, bipolar transistors, etc. or combinations thereof, without limitation. Each die may be attached to the die pad with conductive or insulating epoxy or any other conductive or non-conductive die attachment method.

FIG. 17 is a simplified cross sectional view of an embodiment of the package in accordance with the present invention, showing internal components of package body 1702. Package 1700 includes die pad 1703 supporting die 1706 with attached leads not shown. Non-integral lead 1704 and others not shown are in contact with first die 1607 through bond wires 1708. As described above in conjunction with other package embodiments, integral leads to die pad 1703 aid in dissipation of thermal energy from dies 1706 and maximize utilization of the available footprint area, permitting the enclosure of a larger die 1706.

In FIG. 17, bond wire 1707 has been included as a down bond from the surface of die 1706 to the die pad 1703. An attach layer 1705 made of solder, conductive epoxy, non conductive epoxy or any other material is present between die 1706 and die pad 1703. In the event that layer 1705 is conductive, the substrate potential of die 1706 can be assumed at substantially the same potential as the backside of die 1706. The down bond 1707 then facilitates connecting the pad on the die 1706 and the backside of the die to substantially the same potential. In another embodiment, the backside of die 1706 is insulated from die pad 1703 by a thermally conductive, electrically insulating layer 1705, in which case the electrical potential of die pad 1703 will then be substantially equal to the potential of bond wire 1707, and the bond pad to which bond wire 1707 is attached.

Figure 18A:
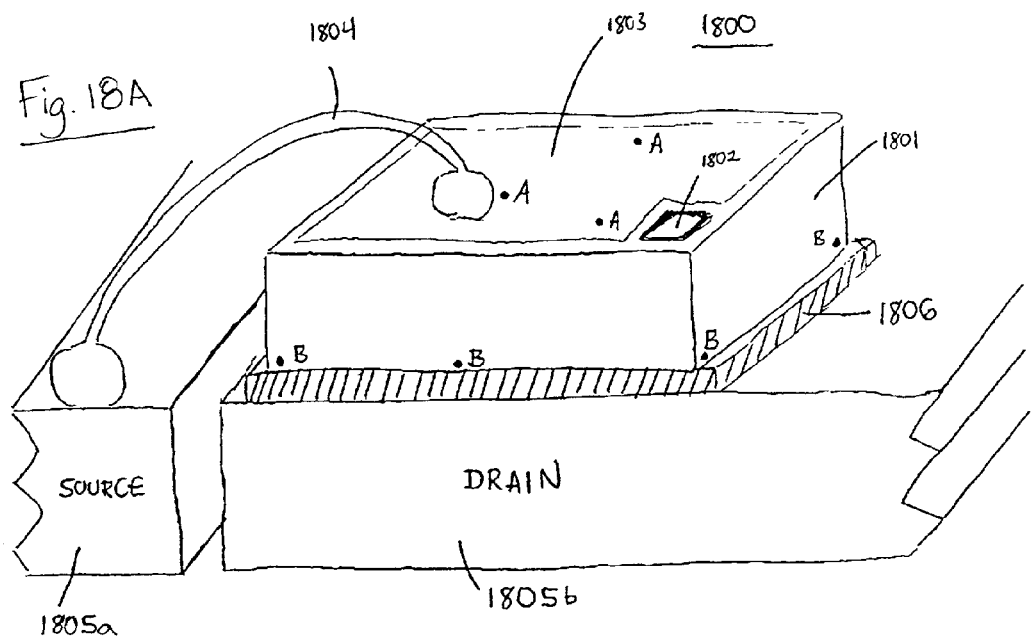
FIG. 18A is a simplified perspective view of still another embodiment of a package in accordance with the present invention, showing internal components without showing the package body.

FIG. 18A is a simplified perspective view of one possible embodiment of the package-die combination shown in FIG.

17, showing internal components of sub-assembly 1800 without showing the package body. In sub-assembly 1800, vertical power MOSFET 1801 is attached to lead frame 1805b by conductive die attach material 1806, where the backside of die 1801 is the drain of the vertical MOSFET. The surface of the vertical power MOSFET 1801 includes a topside source metal 1803, bonded to lead 1805a by bond wire 1804, and gate pad 1802 (wire bond to gate not shown).

The wire bond 1804 is meant to represent more than a single wire bond, where the wire bonds are distributed across the surface of source metal 1803 to hold the top surface of the source metal at an equipotential of voltage "A". With uniform current flow, the backside of die 1801 (adjacent to the die attach layer 1806) is also at an approximate equipotential "B".

Figure 18B:
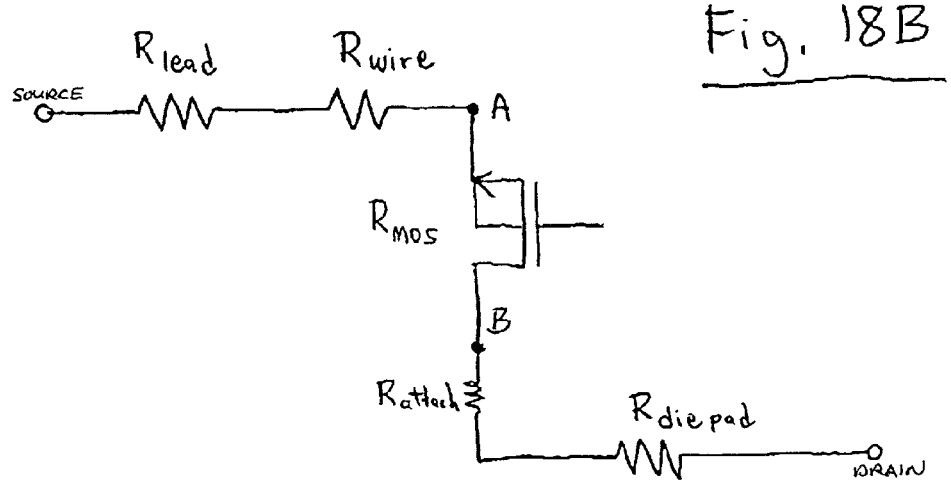
FIG. 18B is a schematic diagram of a circuit represented by the package of FIG. 18A.

In implementation 1800, the equivalent series resistance of the power MOSFET and its package can be approximated by the equivalent circuit shown in FIG. 18B, where the total on-state drain resistance is the sum of the MOSFET (silicon), bonding wire, and to a lesser extent lead, die attach, and die pad components. The potential at point A and point B are labeled for reference, corresponding to the same points labeled on FIG. 18A. No down bond is required for a discrete vertical power MOSFET.

Figure 19A:
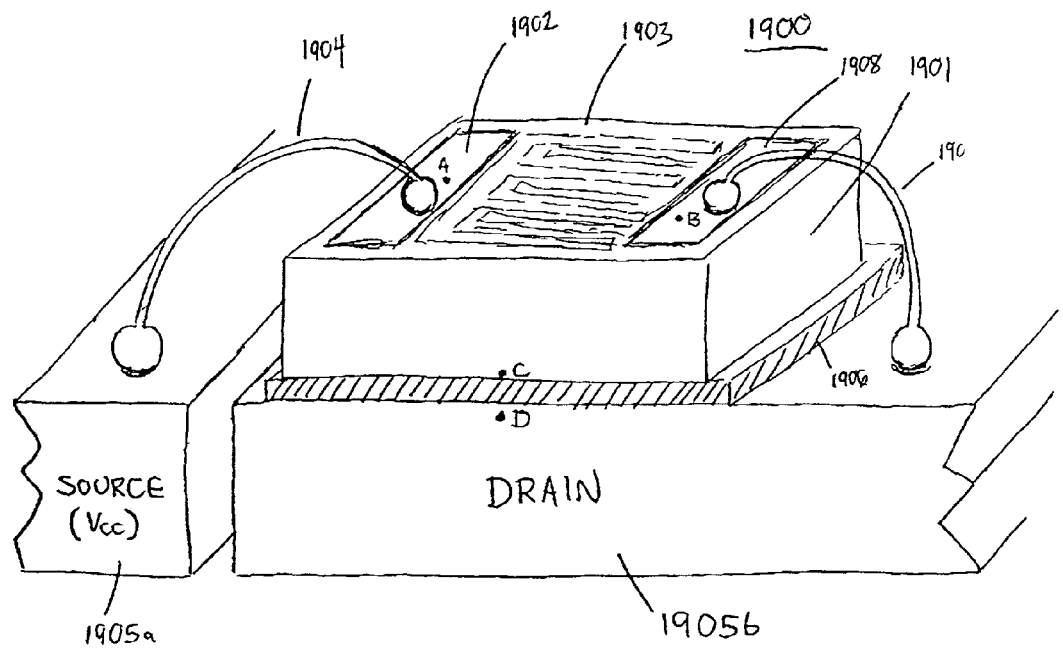
FIG. 19A is a simplified perspective view of still another embodiment of the package in accordance with the present invention, showing internal components of sub-assembly 1900 without showing the package body.

FIG. 19A is a simplified perspective view of another possible embodiment of the package-die combination shown in FIG. 17, showing internal components of sub-assembly 1900 without showing the package body. In sub-assembly 1900, lateral power MOSFET 1901 or power integrated circuit 1901 is attached to lead frame 1905b by conductive die attach material 1906, where the backside of die 1901 is the body of the lateral MOSFET or the ground of a power IC. The die surface 1903 of the lateral power MOSFET 1901 includes a topside source metal 1902, bonded to lead 1905a by bond wire 1904, and drain pad 1808, down bonded to die pad 1905b by bond wire 1907.

The wire bond 1904 is meant to represent more than a single wire bond, where the wire bonds are distributed across the surface of metal 1902 to hold the top surface of this metal bus at an equipotential of voltage "A". The wire bond 1907 is meant to represent more than a single wire bond, where the wire bonds are distributed across the surface of metal 1908 to hold the top surface of this metal bus at an equipotential of voltage "B". The substrate potential of die 1901, labeled by "C", can be biased at a different potential than the potential "D" of die pad 1905b, provided that die attach layer 1906 is electrically insulating.

In one embodiment, for example, metal 1902 might be a source (or the positive Vcc of an IC) and metal 1908 might be a drain, tied to die pad 1905b, by bond wire 1907. In such an event die pad 1905b, must be insulated from the die 1901 by an intervening layer of non-conductive die attach e.g. epoxy.

Figure 19B:
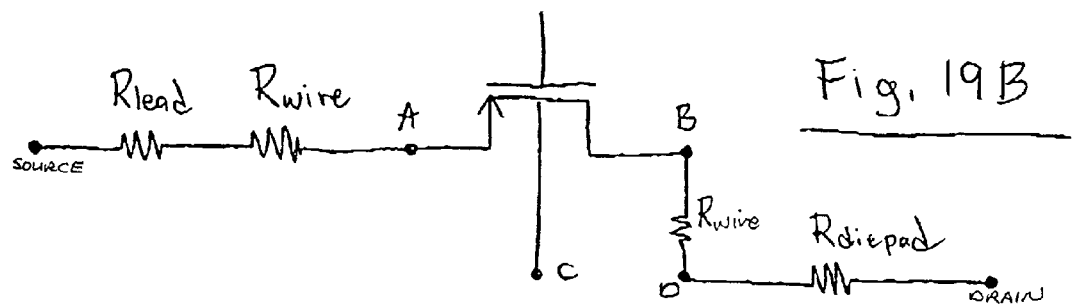
FIG. 19B is a schematic diagram of a circuit represented by the package of FIG. 19A.

In implementation 1900, the equivalent series resistance of the power MOSFET and its package can be approximated by the equivalent circuit shown in FIG. 19B, where the total on-state drain resistance is the sum of the MOSFET (silicon), two bonding wires, die pad components. The potential at point A and point B are labeled for reference, corresponding to the same points labeled on FIG. 18A. Because of down bond 1907, point B and point D are essentially at the same potential except for any voltage drop across the down bond 1907. The equivalent circuit of 19B labels these representative resistance elements. The advantage of the down bond package 1900 is that it maximizes the number of wire bonds available to both source and drain terminals to offer the lowest series resistance package.

Figure 20A:
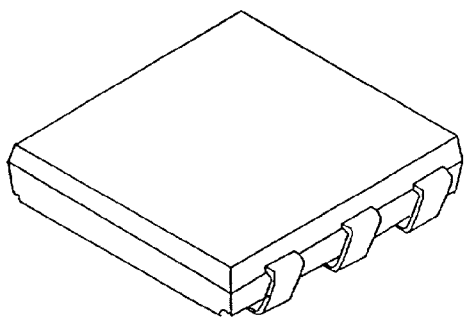
FIG. 20A illustrates a simplified perspective view of a 6-lead TSOP type package in accordance with an embodiment of the present invention.
Figure 20B:
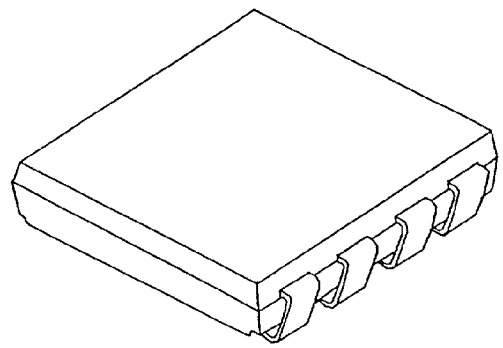
FIG. 20B illustrates a simplified perspective view of a 8-lead TSOP type package in accordance with an embodiment of the present invention.
Figure 20C:
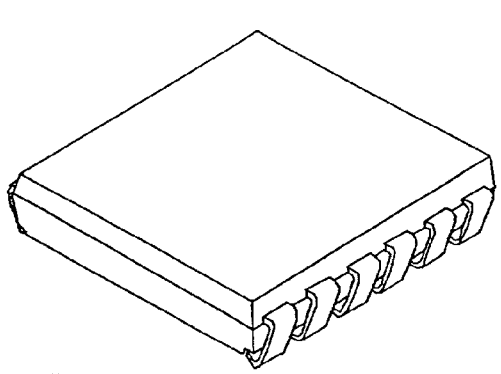
FIG. 20C illustrates a simplified perspective view of a 12-lead TSOP type package in accordance with an embodiment of the present invention.
Figure 20D:
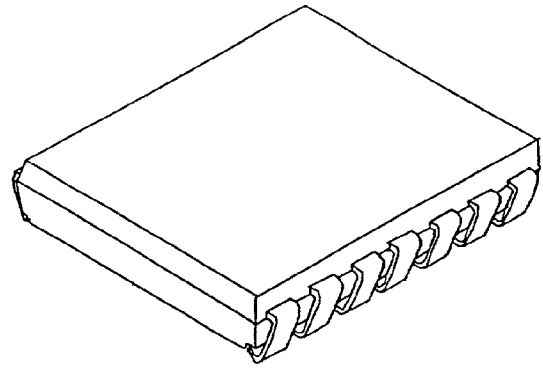
FIG. 20D illustrates a simplified perspective view of a 14-lead TSOP type package in accordance with an embodiment of the present invention.

Also, while space savings have been demonstrated for six and eight lead packages, higher pin count packages are possible. FIG. 20A illustrates a 6-lead TSOP type package. FIG. 20B illustrates a 8-lead TSOP type package. FIG. 20C illustrates a 12-lead TSOP type package. FIG. 20D illustrates a 14-lead TSOP type package, except for the fact that the plastic package body must be lengthened beyond the normal length of the TSOP body.

Figure 20E:
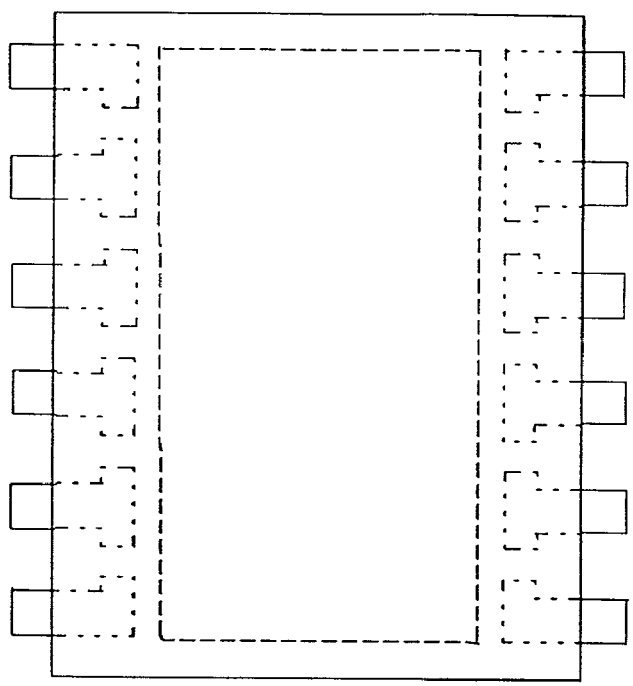
FIG. 20E illustrates a simplified plan view of a first embodiment of a lead frame for the package of FIG. 20C.
Figure 20F:
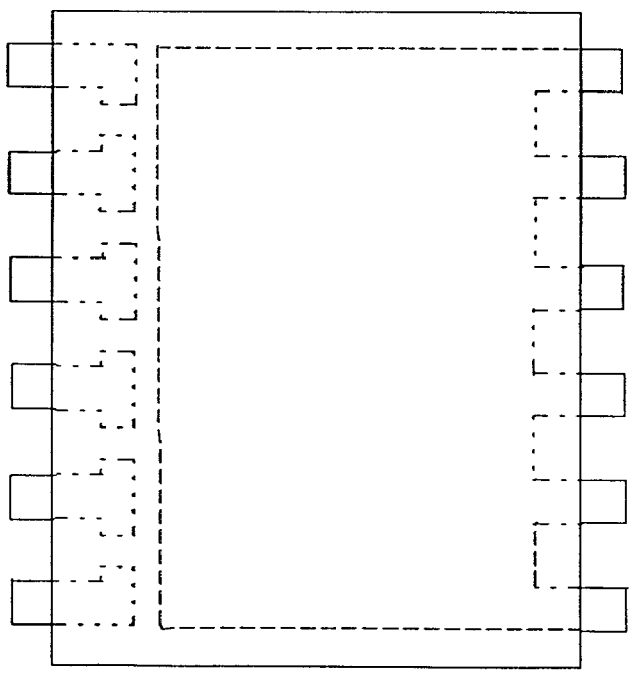
FIG. 20F illustrates a simplified plan view of a second embodiment of a lead frame for the package of FIG. 20C.
Figure 20G:
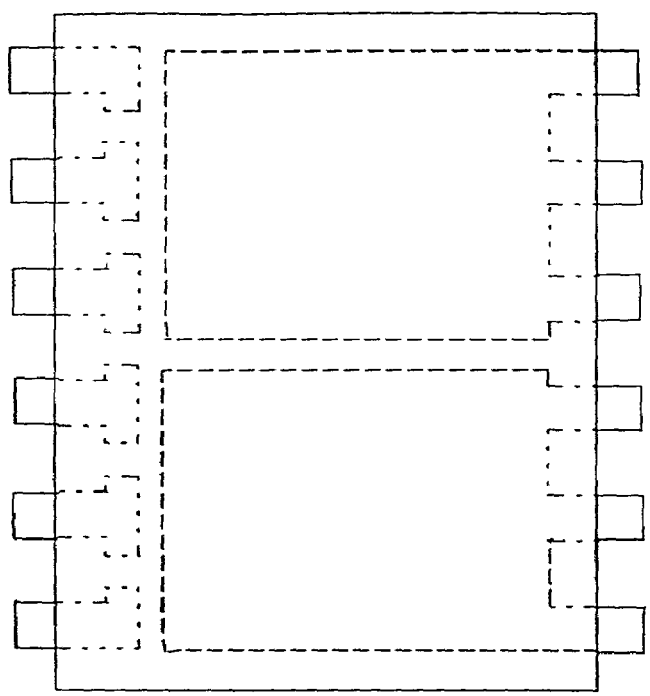
FIG. 20G illustrates a simplified plan view of a third embodiment of a lead frame for the package of FIG. 20C.

FIG. 20E illustrates a simplified plan view of the package of FIG. 20C showing a 12-lead single-die lead frame, where none of the leads are tied to the die pad (a 12 electrical pin, 0 thermal pin package). FIG. 20F illustrates a simplified plan view of the package of FIG. 20C showing a 12-lead single-die lead frame, where six of the leads are tied to the die pad (a 7 electrical pin, 6 thermal pin package). FIG. 20G illustrates a simplified plan view of the package of FIG. 20C showing a 12-lead dual-die lead frame, where three of the leads are tied to each die pad (an 8 electrical pin, dual die 3-thermal-pin package).

Figure 20H:
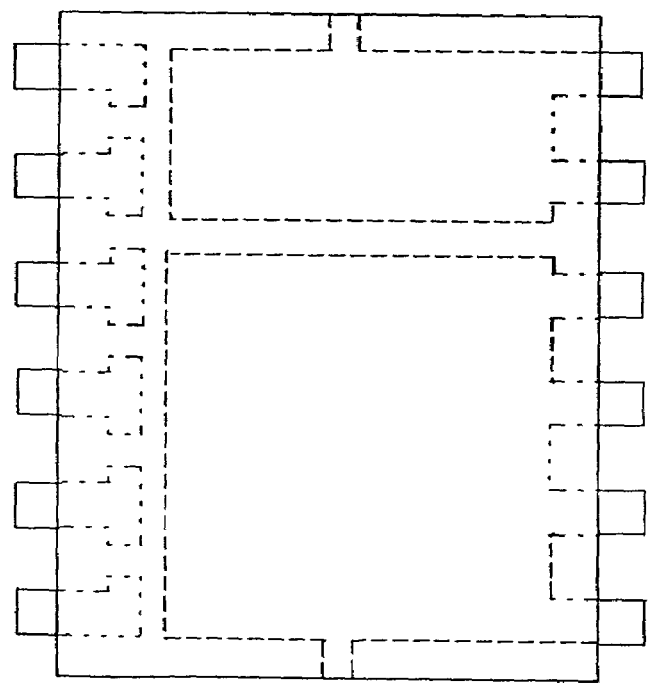
FIG. 20H illustrates a simplified plan view of a fourth embodiment of a lead frame for the package of FIG. 20C.
Figure 20I:
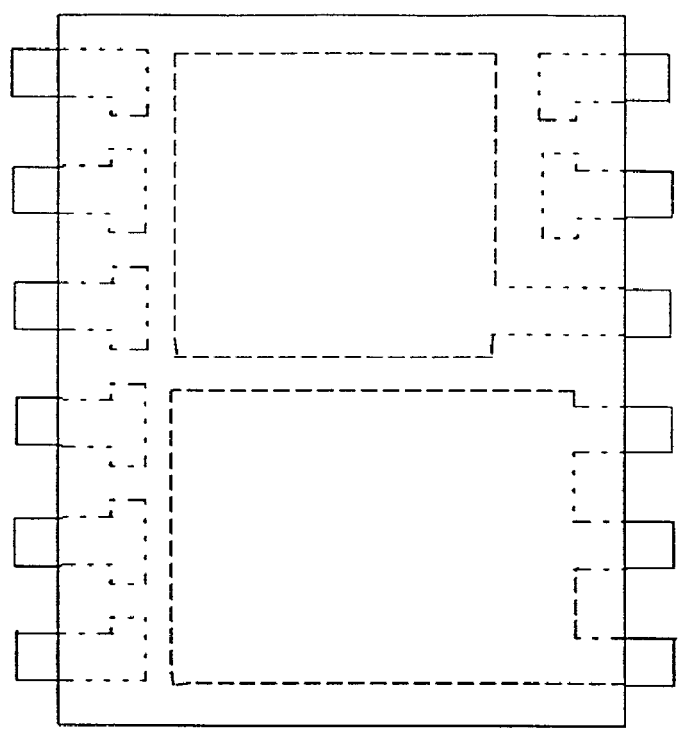
FIG. 20I illustrates a simplified plan view of a fifth embodiment of a lead frame for the package of FIG. 20C.

FIG. 20H illustrates a simplified plan view of the package of FIG. 20C showing a 12-lead dual-die lead frame, where four of the leads are tied to one die pad and where two leads are tied to the other die pad (an 8 electrical pin, 4-thermal-pin die/2-thermal-pin package), where the two die are of differing size. FIG. 20I illustrates a simplified plan view of the package of FIG. 20C showing a 12-lead dual-die lead frame, where three of the leads are tied to one die pad and where only one lead is tied to the other die pad (a 10 electrical pin, 3-thermal-pin/1-thermal-pin package), where the two die are of differing size.

Figure 20J:
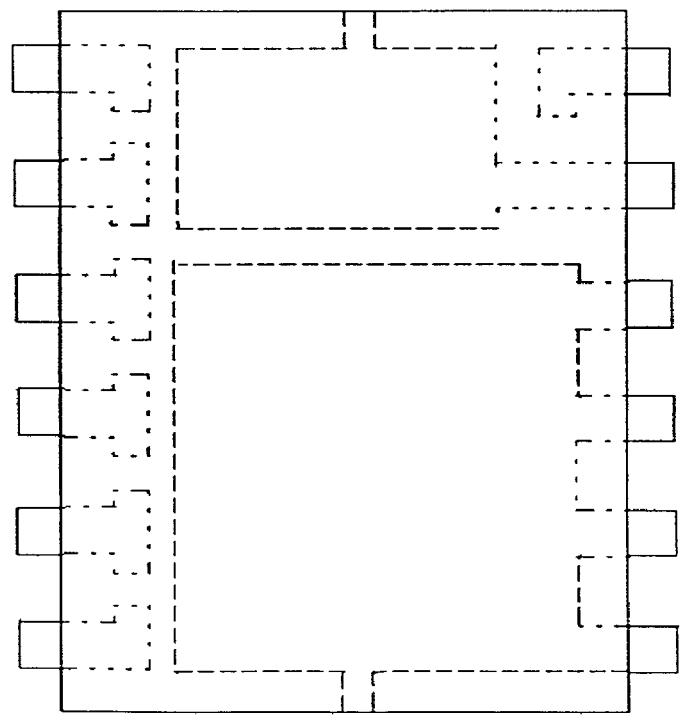
FIG. 20J illustrates a simplified plan view of a sixth embodiment of a lead frame for the package of FIG. 20C.

FIG. 20J illustrates a simplified plan view of the package of FIG. 20C showing a 12-lead dual-die lead frame, where four of the leads are tied to one die pad and where only one lead is tied to the other die pad (a 9 electrical pin, 4-thermal-pin/1-thermal-pin package), where the two die are of differing size.

Figure 20K:
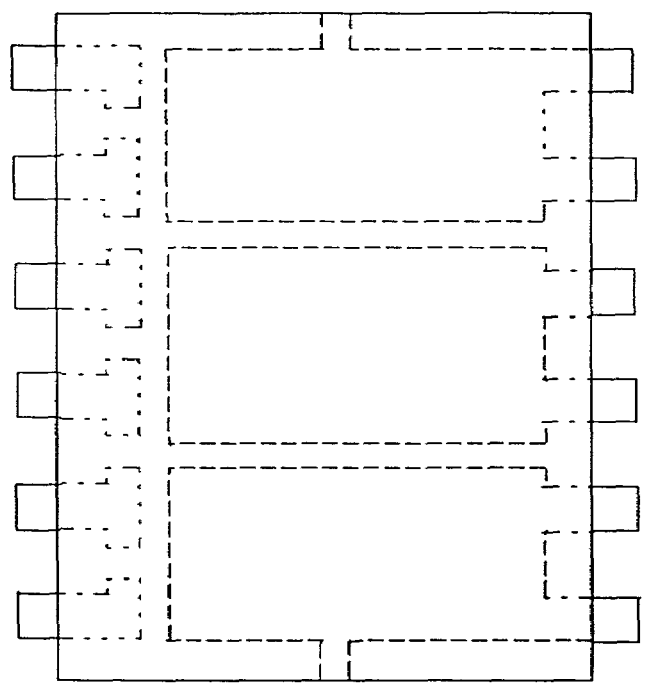
FIG. 20K illustrates a simplified plan view of a seventh embodiment of a lead frame for the package of FIG. 20C.

FIG. 20K illustrates a simplified plan view of the package of FIG. 20C showing a 12-lead triple-die lead frame, where two of the leads are tied to each die pad (a triple-die 9 electrical pin, 2-thermal-pin per die pad package), where the three die are of the same size.

Figure 20L:
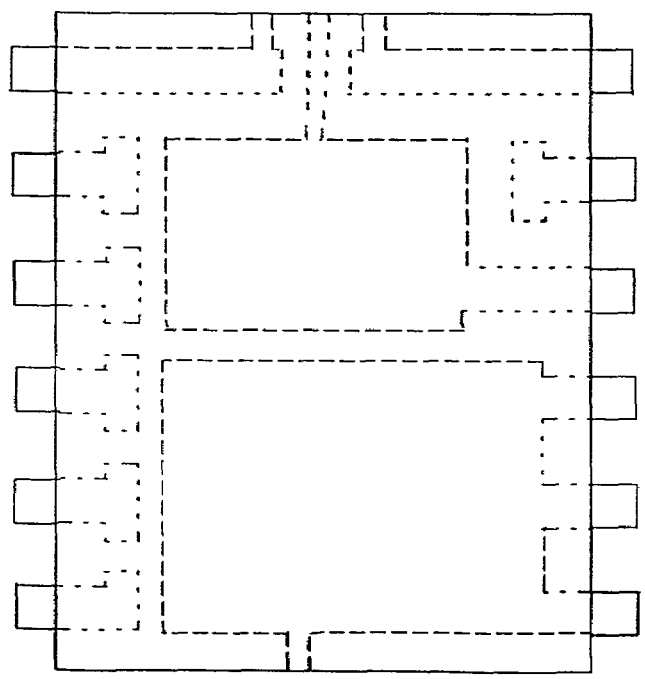
FIG. 20L illustrates a simplified plan view of a eighth embodiment of a lead frame for the package of FIG. 20C.

FIG. 20L illustrates a simplified plan view of the package of FIG. 20C showing a 12-lead dual-die lead frame, where three of the leads are tied to one die pad and where only one lead is tied to the other die pad (a 10 electrical pin, 3-thermal-pin/1-thermal-pin package), where the two die are of differing size.

Figure 20M:
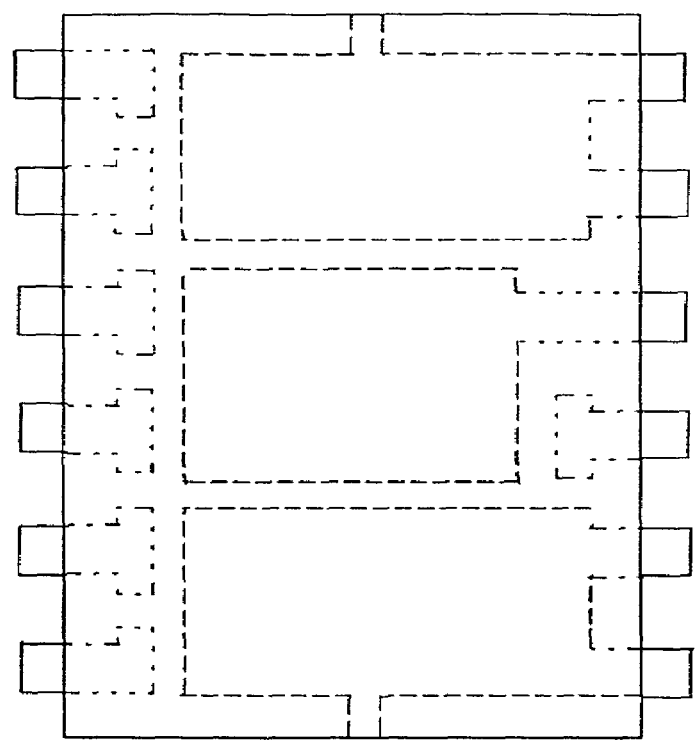
FIG. 20M illustrates a simplified plan view of a ninth embodiment of a lead frame for the package of FIG. 20C.

FIG. 20M illustrates a simplified plan view of the package of FIG. 20C showing a 12-lead triple-die lead frame, where two of the leads are tied to each of two of the die pads and where only one lead is tied to the other die pad (a 10 electrical pin, 2-thermal-pin/1-thermal-pin package), where the three die are of differing size.

Figure 20N:
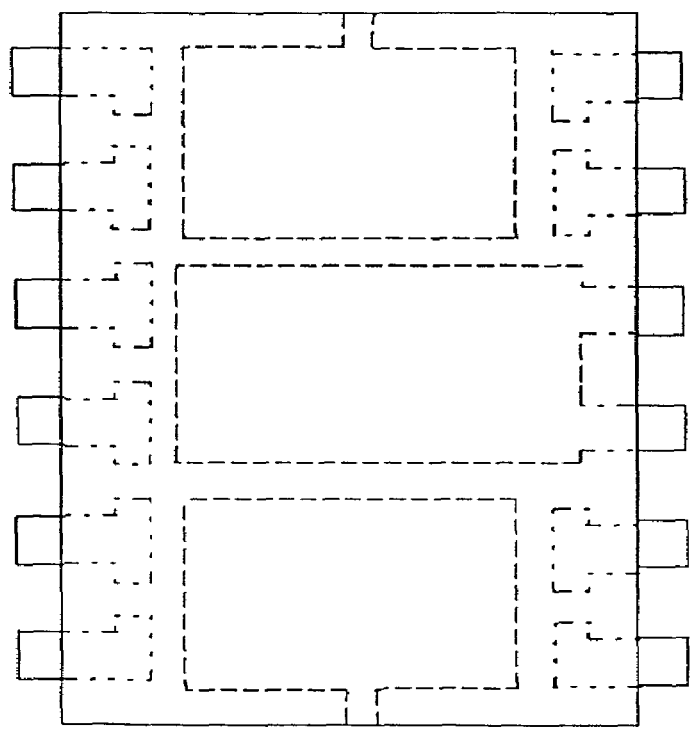
FIG. 20N illustrates a simplified plan view of a tenth embodiment of a lead frame for the package of FIG. 20C.
Figure 20:
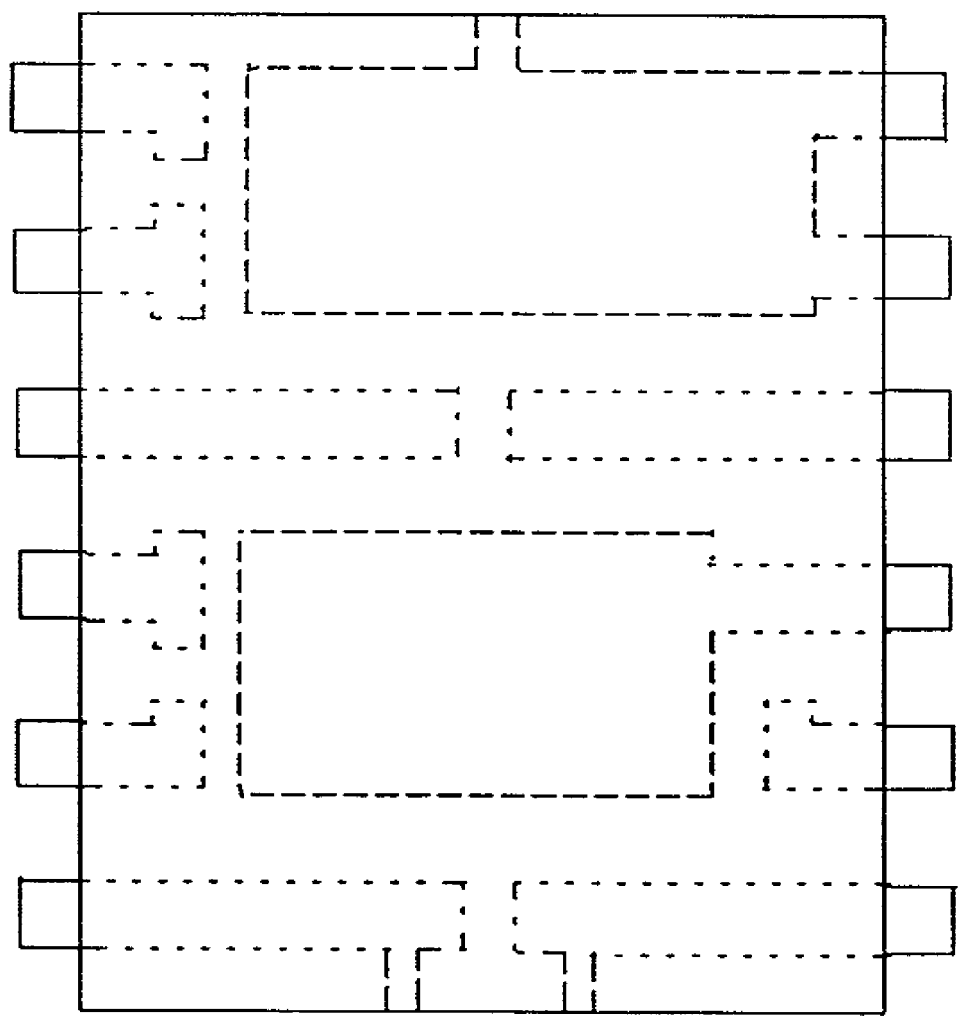
FIG. 20O illustrates a simplified plan view of an eleventh embodiment of a lead frame for the package of FIG. 20C.

FIG. 20N illustrates a simplified plan view of the package of FIG. 20C showing a 12-lead triple-die lead frame, where two of the leads are tied to one of the die pads and where only no leads are tied to the other die pad (a 11 electrical pin, 2-thermal-pin/0-thermal-pin package), where the three die may be of differing size.

FIG. 20O illustrates a simplified plan view of the package of FIG. 20C showing a 12-lead dual-die lead frame, where two of the leads are tied to one of the die pads and where only one leads is tied to the other die pad (a 8 electrical pin, 2-thermal-pin/1-thermal-pin package), where the to die are of differing size.

Figure 21A:
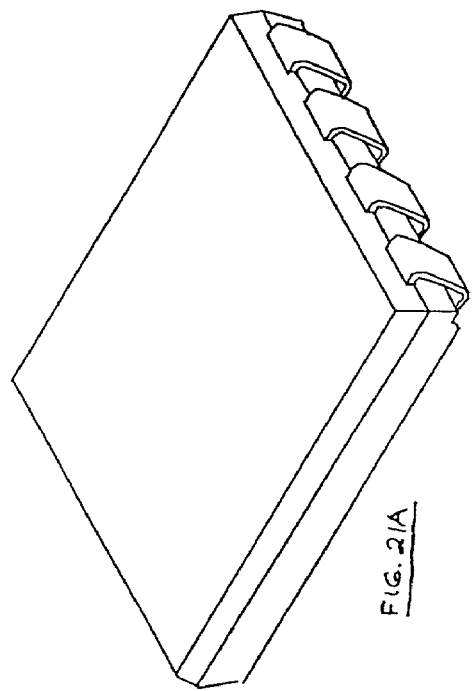
FIG. 21A illustrates a simplified perspective view of an embodiment of an 8-lead MSOP type package in accordance with the present invention.
Figure 21B:
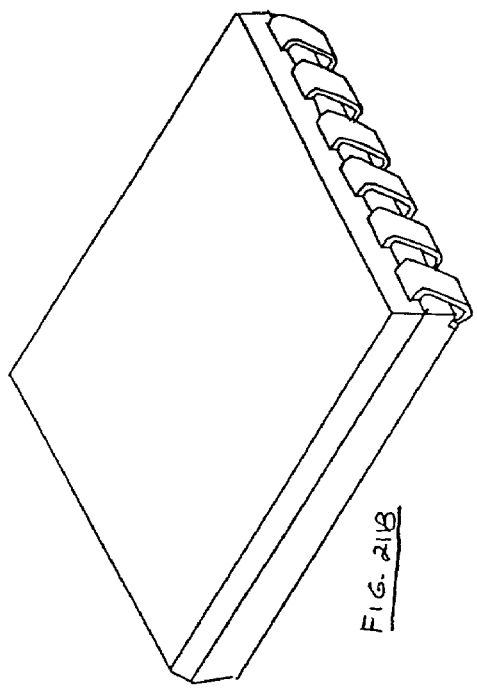
FIG. 21B illustrates a simplified perspective view of an embodiment of a twelve-lead MSOP type package in accordance with the present invention.

FIG. 21A illustrates an 8-lead MSOP type package. FIG. 21B illustrates a twelve-lead MSOP type package.

Figure 22A:
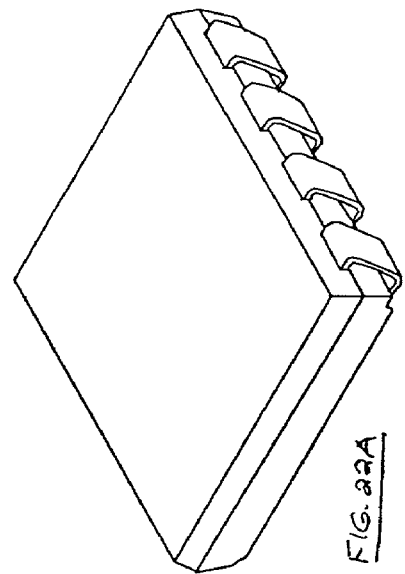
FIG. 22A illustrates a simplified perspective view of an embodiment of an 8-lead SOP type package in accordance with the present invention.
Figure 22B:
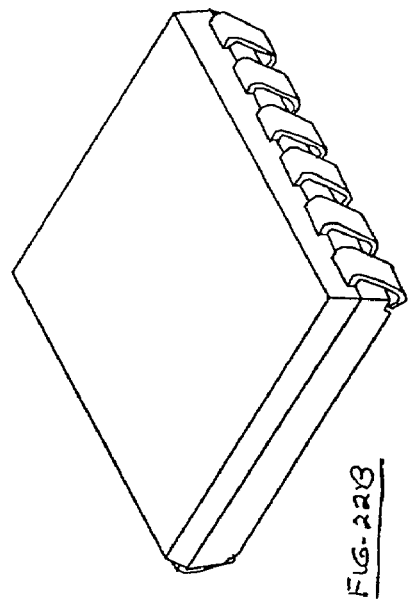
FIG. 22B illustrates a simplified perspective view of an embodiment of a twelve-lead SOP type package in accordance with the present invention..

FIG. 22A illustrates an 8-lead SOP type package. FIG. 22B illustrates a twelve-lead SOP type package.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A small footprint semiconductor device package comprising:
   a plastic package body for enclosing a die, the plastic package body including a top coupled to a bottom through a plurality of sides;
   a diepad supporting the die, the diepad having a first side and a second side opposite the first side;
   a first lead integral with a first side of the diepad and in electrical and thermal communication with the die through the diepad, the first lead including an enclosed portion by the package body and in electrical communication with the die, and an exposed portion of the first lead extending from the side of the package body, folding back along the side of the package toward the bottom of the package at a first angle, and folding underneath the package bottom toward a center of the bottom of the package to form a first lead foot having a reverse gull wing shape, whereupon the portion of the first lead along the side of the package and the portion of the lead along the bottom of the package form an angle of less than 90° from each other and the first lead foot being inclined at a second angle relative to an underlying planar PC board to promote solder wetting; and
   a second lead nonintegral with the second side of the diepad and in electrical communication with the die through a bondwire, the second lead including an enclosed portion by the package body and in electrical communication with the die, and an exposed portion of the second lead extending from the side of the package body, folding back along the side of the package toward the bottom of the package at a first angle, and folding underneath the package bottom toward a center of the bottom of the package to form a second lead foot having a reverse gull wing shape, whereupon the portion of the second lead along the side of the package and the portion of the lead along the bottom of the package form an angle of less than 90° from each other and the second lead foot being inclined at a second angle relative to an underlying planar PC board to promote solder wetting, wherein a first side of the die is in contact with the first side of the diepad proximate to the first and second lead feet, and wherein a first end of the bondwire is in contact with a side of the enclosed lead portion proximate to the first and second lead feet, and a second end of the bondwire is in contact with a second side of the die proximate to the first and second lead feet.

2. The package of claim 1 wherein the die is one of a power device, a discrete device, and an integrated circuit.

3. The package of claim 1 wherein the package has a reduced package profile including the lead.

4. The package of claim 1 wherein the first lead foot is inclined at the second angle between 1° and 7° relative to the planar PC board.

5. The package of claim 1 wherein the package body further comprises a notch configured to receive a portion of the first lead foot, thereby permitting the lead foot to be partially recessed within the package body in order to reduce a height of the package.

6. The package of claim 5 wherein the notch includes a depth of about two-thirds a thickness of the lead.

* * * * *